(12) United States Patent
Aung et al.

(10) Patent No.: US 12,473,250 B2
(45) Date of Patent: Nov. 18, 2025

(54) MOLECULAR DESIGN OF NEW ANTIBIOTICS AND ANTIBIOTIC ADJUVANTS AGAINST MCR STRAINS

(71) Applicants: SINGAPORE HEALTH SERVICES PTE LTD, Singapore (SG); AGENCY FOR SCIENCE, TECHNOLOGY AND RESEARCH, Singapore (SG); TAN TOCK SENG HOSPITAL PTE LTD, Singapore (SG)

(72) Inventors: Thet Tun Aung, Singapore (SG); Jianguo Li, Singapore (SG); Jun Jie Koh, Singapore (SG); Lakshminarayanan Rajamani, Singapore (SG); Roger Beuerman, Singapore (SG); Tiang Hwee Donald Tan, Singapore (SG); Mercy Halleluyah Periayah, Singapore (SG); Chandra Shekhar Verma, Singapore (SG); Swaine Chen, Singapore (SG); Timothy Barkham, Singapore (SG)

(73) Assignees: SINGAPORE HEALTH SERVICES PTE LTD, Singapore (SG); AGENCY FOR SCIENCE, TECHNOLOGY AND RESEARCH, Singapore (SG); TAN TOCK SENG HOSPITAL PTE LTD, Singapore (SG)

( * ) Notice: Subject to any disclaimer, the term of this patent is extended or adjusted under 35 U.S.C. 154(b) by 1032 days.

(21) Appl. No.: 17/612,013

(22) PCT Filed: May 18, 2020

(86) PCT No.: PCT/SG2020/050292
§ 371 (c)(1),
(2) Date: Nov. 17, 2021

(87) PCT Pub. No.: WO2020/236084
PCT Pub. Date: Nov. 26, 2020

(65) Prior Publication Data
US 2022/0281803 A1     Sep. 8, 2022

(30) Foreign Application Priority Data
May 17, 2019   (SG) .......................... 10201904492X

(51) Int. Cl.
C07C 217/20 (2006.01)
A61K 47/02 (2006.01)
A61P 31/04 (2006.01)
C07C 279/14 (2006.01)
C07D 213/30 (2006.01)
C07D 233/60 (2006.01)
C07D 405/14 (2006.01)

(52) U.S. Cl.
CPC ............ *C07C 217/20* (2013.01); *A61K 47/02* (2013.01); *A61P 31/04* (2018.01); *C07C 279/14* (2013.01); *C07D 213/30* (2013.01); *C07D 233/60* (2013.01); *C07D 405/14* (2013.01)

(58) Field of Classification Search
CPC ..... C07C 217/20; C07C 279/14; A61K 47/02; A61P 31/04
See application file for complete search history.

(56) References Cited

U.S. PATENT DOCUMENTS

2009/0036416 A1   2/2009   Fujii et al.

FOREIGN PATENT DOCUMENTS

| WO | 2013036207 | 9/2015 |
| WO | 2015179299 | 11/2015 |
| WO | 2018033719 | 2/2018 |

OTHER PUBLICATIONS

Caldarelli et al.: "Synthesis and Evaluation of Bis-Thiazolium Salts as Potential Antimalarial Drugs", Chemmedchem Communications, Wiley-VCH, DE, vol. 5, No. 7, Jun. 10, 2010 (Jun. 10, 2010) , pp. 1102-1109, XP072422923, ISSN: 1860-7179, DOI: 10.1002/CMDC. 201000097.
Leevy et al.: "Selective recognition of bacterial membranes by zinc(ii)-coordination complexes", Chemical Communications , No. 15, Jan. 1, 2006 (Jan. 1, 2006), p. 1595, XP055426777, UK, ISSN: 1359-7345, DOI: 10.1039/b517519d.
Partial Supplementary European Search Report for Application No. 20809100.9, mailed Aug. 22, 2024.
Selvarani et al.: "Synthesis, photophysical, antibacterial and larvicidal studies on triazolophanes with 5-nitro isophthalate functionality at the intraannular position", New Journal of Chemistry, vol. 42, No. 15, Jan. 1, 2018 (Jan. 1, 2018), pp. 12684-12691, XP093087639, GB, ISSN: 1144-0546, DOI: 10.1039/C8NJ01248B.
Divittorio, K.M., et al., "Zinc(II)-Coordination Complees as membrane Active Fluorescent Probes and Antibiotics," Chembiochem, Jan. 17, 2008, 9(2) pp. 286-293.
Slosarczyk, A.T., et al., "The molecular recognition of phosphorylated proteins by designed polypeptides conjugated to a small molecule that binds phosphate," Org. Biomol. Chem., Aug. 31, 2011, 9(22) pp. 7697-7704.
Rice, D.R., et al., "Antiplasmodial activity of targeted zinc(II)-dipicolyamine complexes," Bioorganic & Medicinal Chemistry, Mar. 27, 2017, 25(10) pp. 2754-2760.

(Continued)

*Primary Examiner* — Bruck Kifle
(74) *Attorney, Agent, or Firm* — Barnes & Thornburg LLP

(57) ABSTRACT

The present invention relates to a compound comprising a hydrophobic moiety, a linker and N-containing moiety. The present invention also relates to the method of synthesizing the compound and the use of the compound as an antibiotic or an adjuvant for an antibiotic.

18 Claims, 25 Drawing Sheets

(56) References Cited

OTHER PUBLICATIONS

Rice, D.R., et al., "Imaging and therapeutic applications of zinc(II)-dipicolylamine molecular probes for anionic biomembranes," Chem. Commun., Jun. 15, 2016, 52(57) pp. 8787-8801.
Koh, J.-J., et al., "Amino Acid Modified Xanthone Derivatives: Novel, Highly Promising Membrane-Active Antimicrobials for Multidrug-Resistant Gram Positive Bacterial Infections," J. Med. Chem., Dec. 4, 2014, 58(2) pp. 739-752.
Hinchliffe, P., et al., "Insights into the Mechanistic Basis of Plasmid-Mediated Colistin Resistance from Crystal Structures of the Catalytic Domain of MCR-1," Scientific Reports, Jan. 6, 2017, vol. 7, pp. 39392.
Li, J., et al., "Membrane Active Antimicrobial Peptides: Translating Mechanistic Insights to Design," Front Neurosci., Feb. 14, 2017, vol. 11, pp. 1-18.
Lin, S., et al., "Semisynthetic Flavone-Derived Antimicrobials with Therapeutic Potential against Methicillin-Resistant *Staphylococcus aureus* (MRSA)," J. Med. Chem., Jun. 21, 2017, 60(14) pp. ##.
International Search Report prepared for PCT/SG2020/050292 mailed Aug. 31, 2020.

(1) PE and analogues (2) Zinc chelating groups (3) Cyclic polyamines (4) Amine and linear or branched polyamines (5) Guanidine and poly-guanidine derivatives (6) Basic amine acid and the derivatives      Arg, (Arg)n, Lys, (Lys)n, poly epsilon-lysine

MOLECULAR DESIGN OF NEW ANTIBIOTICS AND ANTIBIOTIC ADJUVANTS AGAINST MCR STRAINS

CROSS-REFERENCE TO RELATED APPLICATIONS

This application is the U.S. national phase of PCT/SG2020/050292, filed on May 18, 2020, which claims the benefit of Singapore Patent Application Serial Number 10201904492X, filed on May 17, 2019, the entire disclosures of both of which are incorporated herein by reference.

FIELD OF INVENTION

The present invention relates to a compound comprising a hydrophobic moiety, a linker and N-containing moiety. The present invention also relates to the method of synthesizing the compound and the use of the compound as an antibiotic or an adjuvant for an antibiotic.

BACKGROUND OF INVENTION

The health care crisis fueled by increasing numbers of reports of pathogens with heightened levels of resistance to existing antibiotics has been further exacerbated by the continuous appearance of Enterobacteriacae producing carbapenemases, particularly *K. pneumoniae* strains with KPC-2 and NDM1 genes conferring resistance to the penem antibiotics. The treatment options for these patients are limited and colistin has become an important antibiotic of last resort. Colistin is a critical "last resort" antibiotic as it disrupts the molecular organization of the outer membrane allowing it to diffuse toward the inner membrane, where it disrupts the structure, killing the bacteria by allowing water in to the bacteria and loss of the trans-membrane potential. Due to this mode of action colistin avoids most types of resistance rising from genetic mutations. As shown in FIG. 1, the outer membrane of Gram-negative bacteria is covered by lipopolysaccharide (LPS), anchored into Lipid A forming a structural pedestal for LPS, which is critical for stabilization of the outer membrane. Colistin, a peptide, also called polymyxin E, is a member of the cationic polymyxin family which includes polymyxin B. This family of molecules kills Gram negative bacteria by disrupting the lipid A portion of the outer membrane subsequently disrupting the inner membrane, then water enters the bacterium lysing the organism.

Colistin is broadly active against Gram negative bacteria, but is used sparingly due to serious side-effects, nephro- and neurotoxicity. Due to these side effects, 2 µg/ml is often considered a breakpoint where resistance occurs. In contrast, it is widely used in agriculture with chickens and beef cattle in both the US and China. However, colistin resistance appeared recently in the form of a motile or mobile plasmid associated with *E. coli*, discovered in pigs in 2015 in Northwestern China. Documented spread mobile colistin resistance, MCR, of *E. coli* carrying mcr-1 has shown that by 2015, mcr-1 appeared in 10 countries including the US. Now MCR-1 resistance has been identified in a number of Gram-negative pathogens, including *E. coli, Salmonella enterica, Klebsiella pneumoniae, Enterobacter aerogenes*, and *A. baumanii*, posing a great challenge for the treatment of those infections, particularly as the trait confers a high propensity to antibiotic resistance to current antimicrobials, especially carbapenems. Additionally, it is now documented in over 30 countries.

Moreover, as the MCR gene is transferred via a plasmid mediated mechanism, lateral spread easily occurs among different strains of bacteria, and further worsening of the situation can be anticipated. More recently, three other mutations have been recognized, MCR-2, MCR-3 and MCR-4. However, the mechanism of action has been thus far a modification of Lipid A with the attachment of phosphoethanolamine to Lipid A (FIG. 2). Therefore, strategies to tackle the resistance conferred by MCR genes are in urgent need. Particularly affected are patients with carbapenamase resistant bacteria that are not sensitive to other antibiotics.

There is therefore a need for a new approach to tackling mcr-1 resistance that at least partially ameliorates the shortcomings above.

SUMMARY

A novel method for the design of new antibiotics or antibiotic adjuvants against MCR strains, including MCR-1, MCR-2, MCR-3 and MCR-4 has been developed. A library of molecules that perturb the hydrogen bonding network of the MCR modified outer membrane were designed. The approach combines a new in silico modeling method which greatly accelerates the development time while lowering the costs of new antimicrobial therapeutics. The method compares in silico designs with laboratory verification and in vivo tests of efficacy for the treatment of MCR infections.

The design method is based on fragment based pharmacostrategy and includes four steps: (i) in silico modeling for target identification; (ii) ligand design (iii) synthesis and (iv) biological validation. With one or more rounds of optimization, one of more lead compounds are revealed. For the MCR positive strains of Gram-negative bacteria, two targets were identified: the active site of MCR-1 protein and the hydrogen bonding network of the outer membrane. Based on the detailed atomistic analysis, a library of compounds that destabilized the outer membrane of *E. coli* with the mcr-1 plasmid was designed, which overcomes resistance and kills the bacteria. Several compounds were selected from the library and their MICs as well as their synergistic activity with colistin were tested. One of the compounds, GLA-DPA, displayed limited antimicrobial activity against a panel of clinically isolated colistin resistant bacteria. However, when combined with colistin, GLA-DPA was shown to restore the sensitivity of *E. coli* with mcr-1 to colistin. The effective dose of colistin, when combined with the disclosed compound, may therefore be lowered to a level that would obviate toxicity.

In an aspect, there is provided a compound having the following formula (I):

$$Z^1\text{-}L^1\text{-}A\text{-}L^2\text{-}Z^2 \qquad \text{formula (I)}$$

wherein A is a hydrophobic moiety;

$L^1$ and $L^2$ are independently a linker; and $Z^1$ and $Z^2$ are independently an N-containing moiety.

Advantageously, the compound may have a suitable structure for interacting and disrupting the bacterial membrane. That is, the compound may have two head group regions that interact with the bacterial membrane and a hydrophobic moiety that interacts with the lipid component of the bacterial membrane. The compound may have a suitable size that allows it to span the lipid bilayer of the bacterial membrane. Advantageously, the head groups may comprise a N-atom, having a high pKa value. Further advantageously, the hydrophobic moiety may be large. More advantageously, the hydrophobic moiety may be planar. Taken together, the components of the compound may confer high membrane interaction and antimicrobial properties to the compound.

Advantageously, the N-containing moiety, the guanidine, the zinc chelating complex, all share the same feature of having high affinity with phosphate groups in the bacterial membrane. The strong interactions between the terminal groups ($Z^1$ or $Z^2$) of compound of formula (I) and phosphate groups of membrane lead to large membrane perturbations.

Advantageously, the N-containing moiety may disrupt the electrostatic interactions (e.g., the hydrogen bonding network) that stabilize the bacterial membrane. Advantageously, this may result in bacterial cell kill. Alternatively, the disruption of the hydrogen bonding network may facilitate other antibiotics such as colistin to act effectively to result in bacterial cell kill. Colistin may interact with lipid A even when the bacteria is resistant to colistin, and that small perturbance of the outer membrane may allow the compound of formula (I) to enter into the Lipid A structure toward the inner membrane along with colistin, resulting in a fatal disruption of the inner membrane and killing of the bacterium.

The compound of formula (I) may be effective in killing Gram positive bacteria alone or when co-administered with colistin. The compound of formula (I) may be effective in killing Gram negative bacteria that are MCR positive alone or when co-administered with colistin. In such a case, the N-containing moiety may chelate with zinc, which therefore may bind to zinc-dependent MCR and disrupt its activity. The compound of formula (I) may also be effective in killing Gram negative bacteria that are MCR negative yet still resistant to colistin, when co-administered with colistin. In addition, the compound of formula (I) may be effective in killing a wide range of Gram negative bacteria, including bacteria that are resistant to carbapenems, when co-administered with colistin. Thus, the compound of formula (I) may overcome the resistance of the bacteria to colistin, restore the action of colistin and in fact extend the action of colistin to Gram negative bacteria that are resistant to carbapenems or colistin alone. Advantageously, the compound of formula (I) is also effective at killing a large number of bacteria without having to change the drug concentration depending on the bacteria species. The only other known antibiotic that is able to achieve this is alcohol, but alcohol is known to be toxic.

In another aspect, there is provided a pharmaceutical composition comprising a compound as defined above, or a pharmaceutically acceptable salt or hydrate thereof, in association with a pharmaceutically acceptable carrier.

In another aspect, there is provided a process for preparing a compound as defined above, comprising the step of contacting a hydrophobic moiety with an N-containing moiety under reaction conditions.

Advantageously, the process for preparing the compound is facile, using mild reaction conditions, facilitating low cost and large scale synthesis of the compounds.

In another aspect, there is provided the use of the compound as defined above or the pharmaceutical composition as defined above, as an antibiotic.

In another aspect, there is provided the use of the compound as defined above or the pharmaceutical composition as defined above, to kill or inhibit the growth of a microorganism in vitro.

In another aspect, there is provided a compound as defined above for use in therapy.

In another aspect, there is provided a method for treating a bacterial infection, the method comprising the step of administering to a patient in need thereof a therapeutically effective amount of a compound as defined above.

In another aspect, there is provided a compound as defined above for use in treating a bacterial infection.

In another aspect, there is provided the use of a compound as defined above in the manufacture of a medicament for the treatment of a bacterial infection.

Advantageously, the compound may act either as an antibiotic in its own right or as an adjuvant to other antibiotics such as colistin, by facilitating disruption of the outer membrane of MCR mutated bacteria as well as other Gram negative bacteria without MCR mutation, and to restore the sensitivity of these strains to colistin. Advantageously, the compound may reduce the MIC of colistin by at least twice.

Definitions

"Alkyl" as a group or part of a group refers to a straight or branched aliphatic hydrocarbon group, preferably a $C_1$-$C_{20}$ alkyl, $C_1$-$C_{12}$ alkyl, more preferably a $C_1$-$C_{10}$ alkyl, most preferably $C_1$-$C_6$ unless otherwise noted. Examples of suitable straight and branched $C_1$-$C_6$ alkyl substituents include methyl, ethyl, n-propyl, 2-propyl, n-butyl, sec-butyl, t-butyl, hexyl, and the like. The group may be a terminal group or a bridging group.

"Alkenyl" as a group or part of a group denotes an aliphatic hydrocarbon group containing at least one carbon-carbon double bond and which may be straight or branched preferably having 2-20 carbon atoms, preferably having 2-12 carbon atoms, more preferably 2-10 carbon atoms, most preferably 2-6 carbon atoms, in the normal chain. The group may contain a plurality of double bonds in the normal chain and the orientation about each is independently E or Z. Exemplary alkenyl groups include, but are not limited to, ethenyl, propenyl, butenyl, pentenyl, hexenyl, heptenyl, octenyl and nonenyl. The group may be a terminal group or a bridging group.

"Alkynyl" as a group or part of a group means an aliphatic hydrocarbon group containing a carbon-carbon triple bond and which may be straight or branched preferably having 2-20 carbon atoms, preferably having from 2-12 carbon atoms, more preferably 2-10 carbon atoms, more preferably 2-6 carbon atoms in the normal chain. Exemplary structures include, but are not limited to, ethynyl and propynyl. The group may be a terminal group or a bridging group.

"Amino" refers to groups of the form —$NR_aR_b$ wherein $R_a$ and $R_b$ are individually selected from the group including but not limited to hydrogen, optionally substituted alkyl, optionally substituted alkenyl, optionally substituted alkynyl, and optionally substituted aryl groups.

"Aminoalkyl" means an $NH_2$-alkyl- group in which the alkyl group is as defined herein. The group may be a terminal group or a bridging group. If the group is a terminal group it is bonded to the remainder of the molecule through the alkyl group.

"Aryl" as a group or part of a group denotes (i) an optionally substituted monocyclic, or fused polycyclic, aromatic carbocycle (ring structure having ring atoms that are all carbon) preferably having from 5 to 12 atoms per ring. Examples of aryl groups include phenyl, naphthyl, and the like; (ii) an optionally substituted partially saturated bicyclic aromatic carbocyclic moiety in which a phenyl and a $C_{5-7}$ cycloalkyl or $C_{5-7}$ cycloalkenyl group are fused together to form a cyclic structure, such as tetrahydronaphthyl, indenyl or indanyl. The group may be a terminal group or a bridging group. Typically an aryl group is a $C_6$-$C_{18}$ aryl group.

"Guanidylalkyl" means an alkyl-NC(NH$_2$)$_2$— group in which the alkyl group is as defined herein. The group may be a terminal group or a bridging group. If the group is a terminal group it is bonded to the remainder of the molecule through the alkyl group.

"Heteroaryl" either alone or part of a group refers to groups containing an aromatic ring (preferably a 5 or 6 membered aromatic ring) having one or more heteroatoms as ring atoms in the aromatic ring with the remainder of the ring atoms being carbon atoms. Suitable heteroatoms include nitrogen, oxygen and sulphur. Examples of heteroaryl include thiophene, benzothiophene, benzofuran, benzimidazole, benzoxazole, benzothiazole, benzisothiazole, naphtho[2,3-b]thiophene, furan, isoindolizine, xantholene, phenoxatine, pyrrole, imidazole, pyrazole, pyridine, pyrazine, pyrimidine, pyridazine, tetrazole, indole, isoindole, 1H-indazole, purine, quinoline, isoquinoline, phthalazine, naphthyridine, quinoxaline, cinnoline, carbazole, phenanthridine, acridine, phenazine, thiazole, isothiazole, phenothiazine, oxazole, isooxazole, furazane, phenoxazine, 2-, 3- or 4-pyridyl, 2-, 3-, 4-, 5-, or 8-quinolyl, 1-, 3-, 4-, or 5-isoquinolinyl 1-, 2-, or 3-indolyl, and 2-, or 3-thienyl. A heteroaryl group is typically a $C_1$-$C_{18}$ heteroaryl group. A heteroaryl group may comprise 3 to 8 ring atoms. A heteroaryl group may comprise 1 to 3 heteroatoms independently selected from the group consisting of N, O and S. The group may be a terminal group or a bridging group.

"Heteroarylalkyl" means a heteroaryl-alkyl group in which the heteroaryl and alkyl moieties are as defined herein. Preferred heteroarylalkyl groups contain a lower alkyl moiety. Exemplary heteroarylalkyl groups include pyridylmethyl. The group may be a terminal group or a bridging group. If the group is a terminal group it is bonded to the remainder of the molecule through the alkyl group.

"Heterocyclic" refers to saturated, partially unsaturated or fully unsaturated monocyclic, bicyclic or polycyclic ring system containing at least one heteroatom selected from the group consisting of nitrogen, sulfur and oxygen as a ring atom. Examples of heterocyclic moieties include heterocycloalkyl, heterocycloalkenyl and heteroaryl.

"Halogen" represents chlorine, fluorine, bromine or iodine.

The term "substituted" as used herein means the group to which this term refers may be substituted with one or more groups independently selected from alkyl, alkenyl, alkynyl, cycloalkyl, cycloalkylalkyl, cycloalkenyl, cycloalkylalkenyl, heterocycloalkyl, cycloalkylheteroalkyl, cycloalkyloxy, cycloalkenyloxy, cycloamino, halo, carboxyl, haloalkyl, haloalkenyl, haloalkynyl, alkynyloxy, heteroalkyl, heteroalkyloxy, hydroxyl, hydroxyalkyl, alkoxy, alkenyloxy, nitro, amino, alkylamino, dialkylamino, alkenylamine, aminoalkyl, alkynylamino, acyl, alkyloxy, alkyloxyalkyl, alkyloxyaryl, alkyloxycarbonyl, alkyloxycycloalkyl, alkyloxyheteroaryl, alkyloxyheterocycloalkyl, acylamino, alkylsulfonyloxy, heterocyclic, heterocycloalkenyl, heterocycloalkyl, heterocycloalkylalkyl, heterocycloalkylalkenyl, heterocycloalkylheteroalkyl, heterocycloalkyloxy, heterocycloalkenyloxy, heterocycloamino, haloheterocycloalkyl, alkylsulfinyl, alkylsulfonyl, aminosulfonyl, sulfinyl, sulfinylamino, sulfonyl, sulfonylamino, aryl, heteroaryl, heteroarylalkyl, heteroalkenyl, heteroarylheteroalkyl, heteroarylamino, heteroaryloxy, arylalkenyl, arylalkyl, aryloxy, arylsulfonyl, cyano, cyanate, isocyanate, —C(O)NH(alkyl), and —C(O)N(alkyl)$_2$.

The term "pharmaceutically acceptable salts" refers to salts that retain the desired biological activity of the above-identified compounds, and include pharmaceutically acceptable acid addition salts and base addition salts. Suitable pharmaceutically acceptable acid addition salts of compounds of Formula (I) may be prepared from an inorganic acid or from an organic acid. Examples of such inorganic acids are hydrochloric, sulfuric, and phosphoric acid. Appropriate organic acids may be selected from aliphatic, cycloaliphatic, aromatic, heterocyclic carboxylic and sulfonic classes of organic acids, examples of which are formic, acetic, propionic, succinic, glycolic, gluconic, lactic, malic, tartaric, citric, fumaric, maleic, alkyl sulfonic, arylsulfonic. In the case of agents that are solids, it is understood by those skilled in the art that the inventive compounds, agents and salts may exist in different crystalline or polymorphic forms, all of which are intended to be within the scope of the present disclosure and specified formulae.

The term "pharmaceutically acceptable carrier" is intended to include solvents, dispersion media, coatings, anti-bacterial and anti-fungal agents, isotonic and absorption delaying agents, and the like. The use of such media and agents for pharmaceutically active substances is well known in the art. Except insofar as any conventional media or agent is incompatible with the compound, use thereof in the therapeutic compositions and methods of treatment and prophylaxis is contemplated. Supplementary active compounds may also be incorporated into the compositions according to the present invention. It is especially advantageous to formulate parenteral compositions in dosage unit form for ease of administration and uniformity of dosage. "Dosage unit form" as used herein refers to physically discrete units suited as unitary dosages for the individual to be treated; each unit containing a predetermined quantity of compound(s) is calculated to produce the desired therapeutic effect in association with the required pharmaceutical carrier. The compound(s) may be formulated for convenient and effective administration in effective amounts with a suitable pharmaceutically acceptable carrier in an acceptable dosage unit. In the case of compositions containing supplementary active ingredients, the dosages are determined by reference to the usual dose and manner of administration of the said ingredients.

It is understood that included in the family of disclosed compounds are isomeric forms including diastereoisomers, enantiomers, tautomers, and geometrical isomers in "E" or "Z" configurational isomer or a mixture of E and Z isomers. It is also understood that some isomeric forms such as diastereomers, enantiomers, and geometrical isomers can be separated by physical and/or chemical methods and by those skilled in the art.

Some of the compounds of the disclosed embodiments may exist as single stereoisomers, racemates, and/or mixtures of enantiomers and/or diastereomers. All such single stereoisomers, racemates and mixtures thereof, are intended to be within the scope of the subject matter described and claimed.

Additionally, the disclosed compounds are intended to cover, where applicable, solvated as well as unsolvated forms of the compounds. Thus, each formula includes compounds having the indicated structure, including the hydrated as well as the non-hydrated forms.

The word "substantially" does not exclude "completely" e.g. a composition which is "substantially free" from Y may be completely free from Y. Where necessary, the word "substantially" may be omitted from the definition of the invention.

Unless specified otherwise, the terms "comprising" and "comprise", and grammatical variants thereof, are intended to represent "open" or "inclusive" language such that they include recited elements but also permit inclusion of additional, unrecited elements.

As used herein, the term "about", in the context of concentrations of components of the formulations, typically means+/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

DETAILED DESCRIPTION OF OPTIONAL EMBODIMENTS

Abbreviations

ArgOMe: Arginine methyl ester
ArgOEt: Arginine ethyl ester
BPD: Bipyridine
DMF: N,N-Dimethylformamide
DIC: N,N'-Diisopropylcarbodiimide
DPA: Dipicolylamine
EDTA: Ethylenediaminetetraacetic acid
EtBr: Ethidium bromide
EtOH: Ethanol
HOBt: Hydroxybenzotriazole
HPLC: High Performance Liquid Chromatography
LMMD: Ligand mapping molecular dynamics
LPS: Lipopolysaccharide
MCR: Mobile Colistin Resistance.
MCR strain: Bacteria with Mobile Colistin Resistance.
MCR protein: The enzyme that catalyzes the modification of lipid A with PE group in MCR-1, MCR-2, MCR-3 and MCR-4 strains. The structures of the four proteins are highly conservative and have a similar active site.
MD simulations: Molecular dynamics simulations
MeOH: Methanol
MIC: Minimum inhibitory concentration.
NDM1: New Delhi metallo-beta-lactamase 1
PE group: Phosphoethanolamine group
TEA: Triethylamine
THF: Tetrahydrofuran
TPD: Terpyridine
Overall Strategies for the Design of MCR Inhibitors The present disclosure is directed at designing antibiotic molecules that are either active against a specific target, in this case the mcr-1 protein, or are active against bacteria, or to restore the sensitivity of colistin to bacteria with the MCR plasmid, as shown in FIG. 3.

*E. coli* with mcr-1 may be resistant to colistin and other antibiotics, *E. coli* without mcr-1 may be resistant to colistin and other antibiotics, resistant *P. aeruginosa* may be resistant to carbapenems, aminoglycosides and other antibiotics, resistant *A. baumanii* may be resistant to carbapenems, colistin and other antibiotics and resistant *K. pneumoniae* may be resistant to carbapenems, colistin and other antibiotics.

Based on the fragment based strategy, a multi-disciplinary approach is disclosed, which includes: (1) in silico analysis and target identification (2) ligand design; (3) synthesis and (4) biological validation. As illustrated in FIG. 3, the process begins with in silico analysis of the conformations of the MCR protein as well as the structure of the outer membrane to identify potential targets in the MCR modified Lipid A. Based on the strategy of fragment based drug design (FBDD), a series of chemical fragments have been selected that have high affinity to the identified targets. These chemical fragments are assembled together or are incorporated into other designed fragments into a number of antimicrobial scaffolds to obtain new antibiotics or antibiotic adjuvants.

To effectively disrupt the bacterial membrane, the proposed model contains three types of fragments: two cationic fragments interacting with the two head group regions of the bacterial membrane and one hydrophobic fragment interacting with the lipid tail of the bacterial membrane and two linker groups connecting the cationic groups and the hydrophobic fragment. A series of chemical fragments are designed and assembled together to obtain new antibiotics or antibiotic adjuvants. The rationale for selecting the structure of the fragments is based on the following criteria (FIG. 4):

pKa of the N-containing groups: Using model compounds, it was found that the pKa value of the terminal polar groups is important. The higher the pKa value, the higher the membrane activity. Preferably, the pKa should be greater than 8, greater than 8.5, greater than 9, greater than 11, or greater than 13. Preferably the pKa should be less than 20, less than 17, or less than 15.

The metal chelating properties of the N-containing groups: when chelating with divalent cations such as zinc or calcium, the positive charged complex has affinity to both phosphate groups in the outer membrane and the MCR-1 protein, which contains zinc in its catalytic site (FIG. 6).

The size of the hydrophobic scaffold: As the central hydrophobic scaffold needs to be of a certain size, compounds consisting of two or more aromatic rings having one or more hydrocarbon groups (such as an isoprenyl group) were tested. This was to ensure that the hydrophobic fragment had a certain size that allows the resulting molecule to span the bacterial membrane. It was found that generally the larger the scaffold the better the activity.

The shape of the hydrophobic scaffold: Planar hydrophobic scaffolds are preferred as they can easily cut into the membrane.

The overall hydrophobicity of the scaffold: according to the pharmacophore model, the hydrophobic scaffold interact with the lipid tails, therefore the higher the hydrophobicity or favourable transfer energy, the higher the membrane activity. Preferably, the log P of the compound should be greater than 4, greater than 6, or greater than 8. Preferably, the log P of the compound should be less than 10 or less than 9. Preferably, the free energy barrier should be negative. The more negative the free energy barrier, the higher the affinity of the fragment to the membrane.

The role of isoprenyl group: isoprenyl group has high membrane affinity and can be used as membrane probe;

when the hydrophobic scaffold is decorated with one or more isoprenyl groups, the membrane activity becomes higher.

Next, the designed molecules were synthesized and their antimicrobial activity was tested against the bacteria carrying mobile plasmid mcr-1. The in silico and biological insights may be iteratively used in the next round of fragment design. Such rounds of structural optimization may result in the development of one or more lead compounds.

In Silico Analysis and Target Identification

When the interactions of colistin with the Lipid A component of the outer membrane of normal Gram negative bacteria are simulated, the anionic phosphate groups in Lipid A are engaged in primary electrostatic interactions with cationic colistin and this eventually results in the disruption of the outer membrane.

Mcr-1 genes code for an enzyme similar to phosphoethanolamine transferase, which can modify the lipid A part of the outer membrane with the addition of phosphoethanolamine (PE), groups, resulting in electrostatic interactions such as hydrogen bonds formed between the lipid molecules and reduced penetration of these compounds into the outer membrane of the bacteria. By crystallography, MCR-1 is characterized as a zinc dependent metalloprotein, which makes it a good target for the design of ligands that inhibit its activity.

As seen in the accompanying FIG. 5, the transferred group allows additional hydrogen bonding which would cross-link and stabilize the lipid A portion of the outer membrane. While each hydrogen bond itself can be weak, when in large numbers, they can result in a very strong supramolecular scaffold that can maintain the integrity of Lipid A. In order for colistin or polymyxin to be able to kill the bacteria, this supramolecular organization of Lipid A must be disrupted.

In addition, in the MCR-1 strains, the PE modified lipid A forms a large number of hydrogen bonds which crosslink the lipid A together, resulting in stabilization of the outer membrane. However, the hydrogen bond network between the modified lipid molecules can also serve as an additional target. Molecules disrupting the hydrogen bonding network will destabilize the outer membrane of MCR strains and may restore the sensitivity of these strains to colistin.

Colistin resistance in MCR positive strains of bacteria arises from the modification of lipid A by MCR protein and the subsequent changes in the properties of the outer membrane. Hence two targets in MCR strains can be identified: (1) the MCR protein; and (2) the modified outer membrane. For the first target, structural alignment of the extra-cellular domain of MCR-1 to that of the full length PE transferase revealed high structural similarities. Using the crystal structure of the extra-cellular domain of MCR-1 protein and PE transferase as the template, from this data, the structure of the whole MCR-1 protein was constructed using homology modeling (FIG. 7). Similar to the PE transferase, the MCR enzyme is a metalloprotein with zinc atoms in its catalytic domains, which favors binding of the negatively charged moiety of the POPE lipids and catalyzes the subsequent lipid A modification. The modified lipid A displays reduced interactions with colistin, resulting in colistin resistance. Therefore molecules binding to the active site of the MCR-1 protein will inhibit its activity and restore the sensitivity of MCR strains to colistin.

For the second target, the attachment of PE group to lipid A reduces its electrostatic interactions with colistin, resulting in reduction in the affinity of colistin to the outer membrane. Furthermore, molecular dynamics simulations of the PE modified lipid A membrane for the first time revealed the formation of a large number of hydrogen bonds between head groups of lipid A molecules (FIG. 7). The hydrogen bond network crosslinks the LPS molecules together and stabilizes the outer membrane of MCR strains, resulting in the resistance to colistin. Therefore the hydrogen bonding network in the outer membrane of MCR positive strains serves as another target for the design of anti-MCR therapeutics. Fragments that disrupt/perturb the hydrogen bonding network of outer membrane may directly kill the bacteria or restore the sensitivity of the bacteria to colistin. In summary, the MCR protein and the hydrogen bonding network of the outer membrane have been identified as the two targets, and ligand mapping simulations were employed to find a more cryptic binding pocket for the design of MCR inhibitors.

Ligand Design

Based on the atomistic details of the identified targets, a list of fragments that can either bind to the MCR protein or perturb the hydrogen bonding network of the outer membrane have been designed. In terms of the mode of action, these fragments may be divided into three classes:

(1) Fragments binding to the active site of the MCR-1 protein;
(2) Fragments binding to the cryptic pocket of the MCR-1 protein;
(3) Fragments perturbing/disrupting the hydrogen bonding network of the outer membrane.

The first two classes of fragments directly inhibit the MCR-1 activity and restores the sensitivity of MCR-1 strains to colistin, while the third type of fragment disrupts/perturbs the PE modified outer membrane, which may kill the MCR bacteria independently or synergize with colistin. Based on the three modes of action, 6 types of fragments were proposed and FIG. 8 shows the structure of representative examples of each type.

i. PE group. PE group and its analogues bind to the active site of the MCR-1 protein.
ii. Zinc chelating group, such as DPA group, terpyridine group, 2,2'-bipyridine group, 1,10-phenanthroline group, porphyrin group, 8-hydroxyquinoline group, and carboxylic group. Zinc chelating groups can inhibit the activity of MCR-1 protein by binding to the zinc atom in its active site. Moreover, when chelating with zinc or other divalent cations, the complex is positive and can form salt bridges with phosphate groups, perturbing the hydrogen bonding network in the mcr-1 outer membrane and resulting in destabilization of the PE modified outer membrane.
iii. Cyclic polyamines. Cyclic polyamines have dual functions: (a) forming hydrogen bonds with head groups of the PE modified lipids, resulting in perturbation of the hydrogen bond network in the outer membrane; (b) chelating zinc atoms to inhibit the MCR-1 protein and perturb the mcr-1 outer membrane.
iv. Amine and linear or branched polyamines. Polyamines can form hydrogen bonds with phosphate groups of lipids, and can perturb the hydrogen bond network of the outer membrane.
v. Guanidine and poly-guanidine group. Poly-guanidine groups can form bidentate hydrogen bonds with phosphate groups, and can perturb the hydrogen bond network of the outer membrane.
vi. Basic amine acid group, such as arginine, polyarginine, lysine, polylysine, poly epsilon-lysine, arginine derivatives, lysine derivatives. Groups containing basic amine acids can form hydrogen bonds with phosphate groups of lipid molecules and can perturb the hydrogen bond network of the outer membrane.

All of the fragments above share the same feature in that they have a high affinity with phosphate groups in the bacterial membrane. The strong interaction between the above fragments and the phosphate groups in the bacterial membrane lead to large membrane perturbations.

Using the above fragments, a library of compounds was designed as potential antibiotics against MCR bacteria or antibiotic adjuvants that synergize with colistin. The molecules were designed by assembling the two or more fragments together or coupling the fragments to other scaffolds. The structures of the molecules from the library and their mode of action are described below.

X—Cn-Y—Cn-X, where X is an N-containing moiety, Y is a hydrophobic scaffold and Cn is the alkyl chain with n carbon atoms. The N-containing moiety X can be the fragments in FIG. 8, while Y can be any hydrophobic scaffold in FIG. 9. The molecule may function as: (i) MCR-1 protein inhibitor; (ii) hydrogen bond network disruptor.

There is provided a compound having the following formula (I):

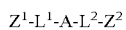 formula (I)

wherein A is a hydrophobic moiety;

$L^1$ and $L^2$ are independently a linker; and $Z^1$ and $Z^2$ are independently an N-containing moiety.

A may comprise at least one substituted or unsubstituted aryl.

A may further comprise at least one alkenyl group.

A may be planar or substantially planar. That is, A may lie in a plane or substantially lie in a plane.

A may further comprise at least one isoprenyl group.

A may be selected from the group consisting of:

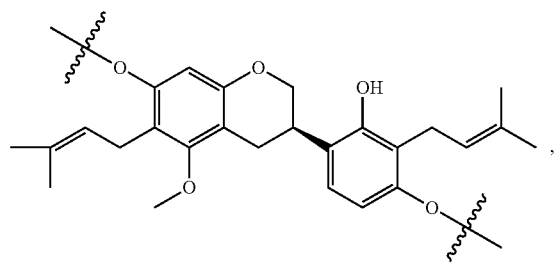

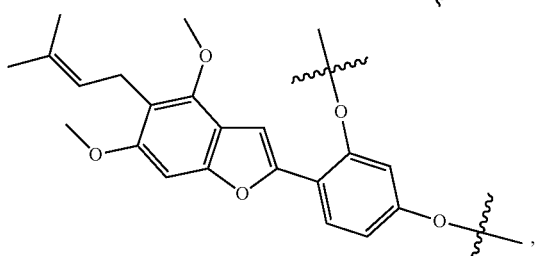

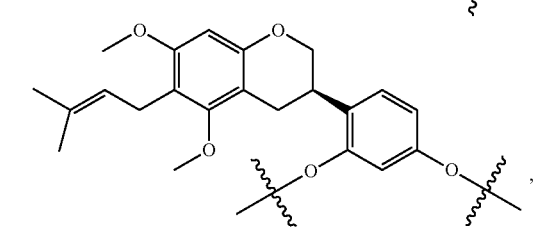

-continued

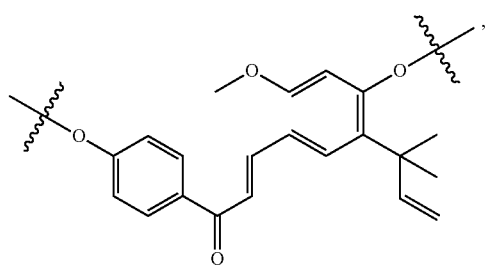

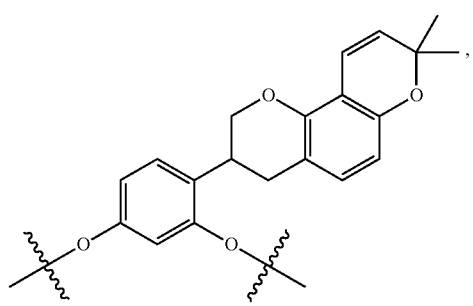

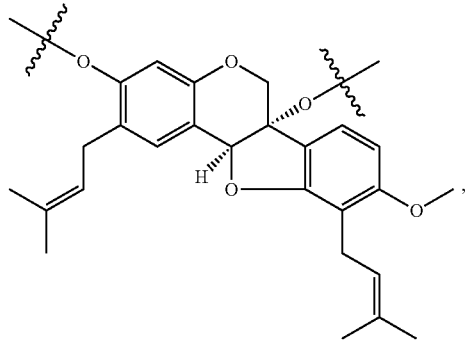

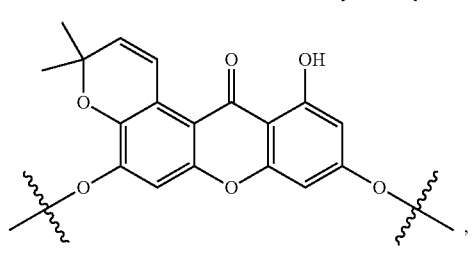

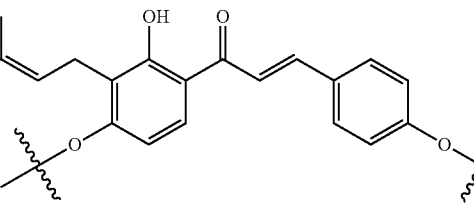

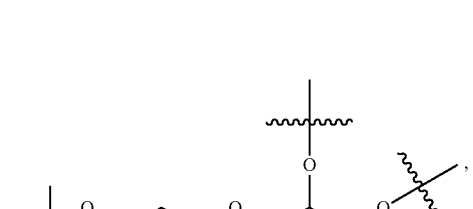

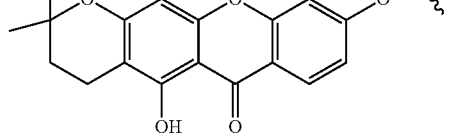

-continued
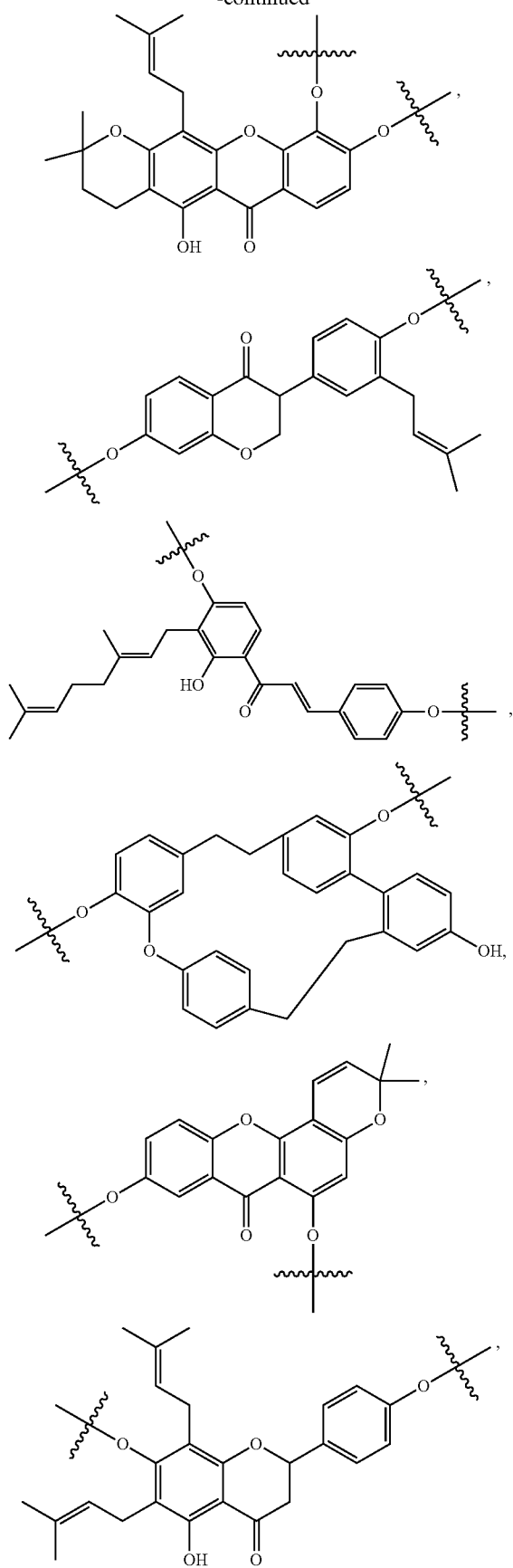
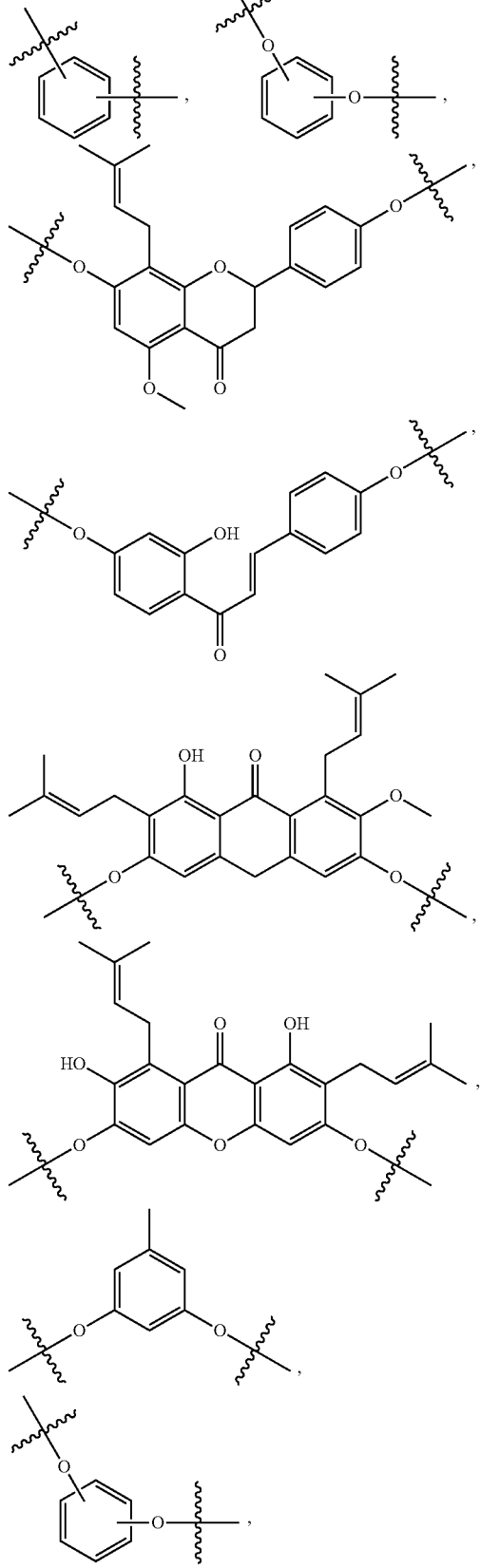
and any mixture thereof, wherein the broken bond represents where the structure attaches to the remainder of formula (I).

A may be selected from the group consisting of:

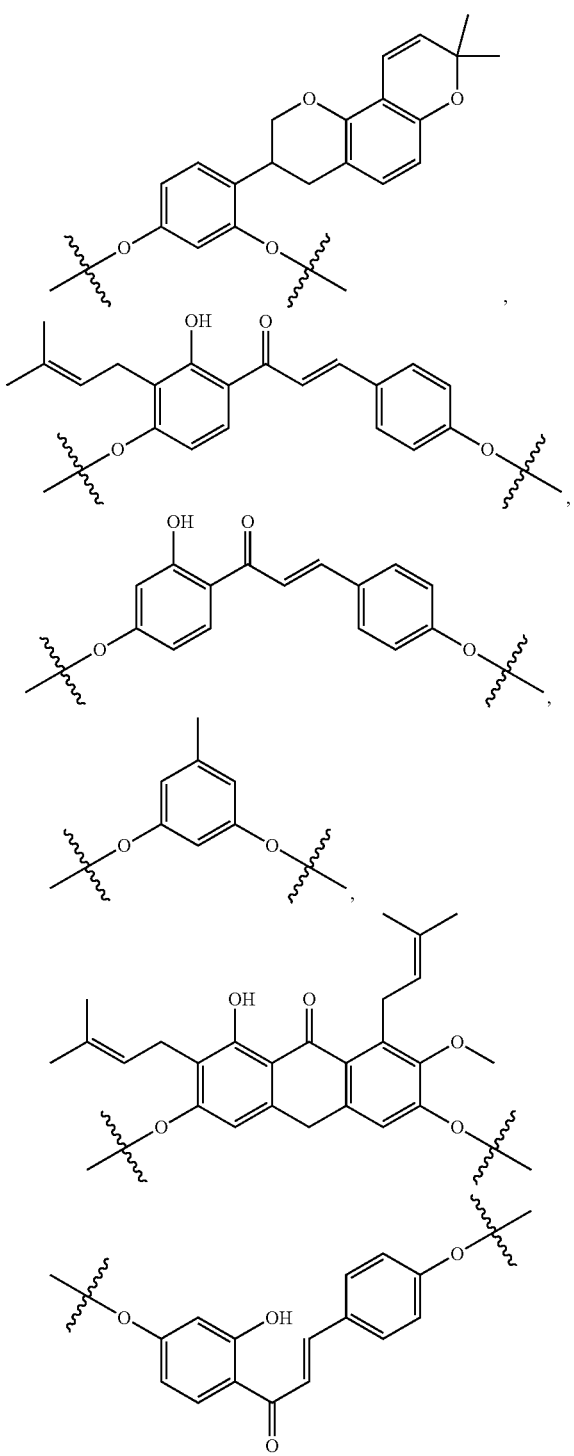

and any mixture thereof.

$Z^1$ and $Z^2$ may independently have a pKa value greater than 8. The pKa value may be greater than 8.5, greater than 9, greater than 11 or greater than 13. The pKa value may be less than 20.

$Z^1$ and $Z^2$ may independently have the following structure:

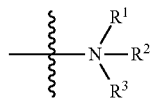

wherein the broken bond represents where the structure attaches to the remainder of formula (I);

$R^1$ and $R^2$ may be independently hydrogen, substituted or unsubstituted alkyl, substituted or unsubstituted alkenyl, substituted or unsubstituted alkynyl, substituted or unsubstituted aminoalkyl, guanidine, substituted or unsubstituted guanidylalkyl, substituted or unsubstituted aryl, substituted or unsubstituted heteroaryl, substituted or unsubstituted heteroarylalkyl, amino acid or peptide, or $R^1$ and $R^2$ are taken together to form a saturated or unsaturated, substituted or unsubstituted heterocyclic ring; and $R^3$ may be absent or hydrogen, or substituted or unsubstituted alkyl, substituted or unsubstituted alkenyl, substituted or unsubstituted alkynyl, substituted or unsubstituted aminoalkyl, guanidine, substituted or unsubstituted guanidylalkyl, substituted or unsubstituted aryl, substituted or unsubstituted heteroaryl substituted or unsubstituted heteroarylalkyl, amino acid or peptide, wherein when $R^3$ is present, the nitrogen atom may be a cationic quaternary nitrogen.

$Z^1$ and $Z^2$ may independently comprise a functional group selected from the group consisting of amine, guanidine, pyrrolidine, pyrrole, imidazolidine, pyrazolidine, imidazole, pyrazole, triazole, piperidine, pyridine, piperazine, diazine, hydroxamic acid, hydrazine, N-hydroxyurea, squaric acid, carbamolyphosphonate, oxazoline, pyrimidinetrione, 1-hydroxy-2(1H)-pyridinone (1,2-HOPO) and any combination thereof.

$R^1$, $R^2$ and $R^3$ may independently be selected from the group consisting of methyl, ethyl, propyl, butyl, $—(CH_2)_xNR'R''$, $—(CH_2)_xOH$, $—(CH_2)_xPO_3$, $—(CH_2)_xCR'R''R'''$, $—(C(NH_2)NHC(NH_2))x-NH_2$, guanidine, 2-methylpyridine, 1-methylimidazole, pyridine, bipyridine, terpyridine, phenanthroline, 3-methylpyrrole, cyclen (1,4,7,10-tetraazacyclododecane), cyclam(1,4,8,11-tetraazacyclotetradecane), 1,8-dimethyl-1,4,8,11-tetraazacyclotetradecane, 1,4,7-triazacyclononane, arginine, polyarginine, lysine, polylysine, poly-epsilon lysine and any mixture thereof, wherein x may be any integer from 1 to 10, and R', R" and R'" may be independently hydrogen or substituted or unsubstituted alkyl.

$Z^1$ and $Z^2$ may independently be selected from the group consisting of:

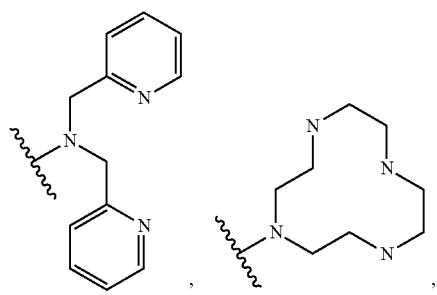

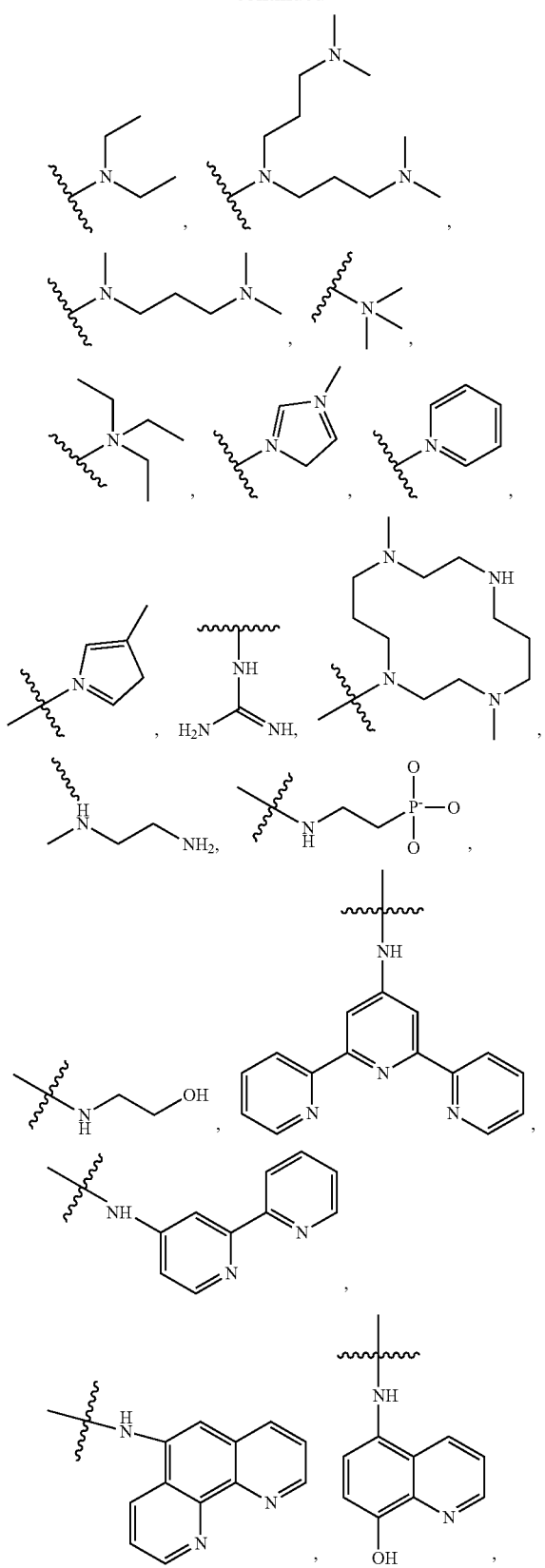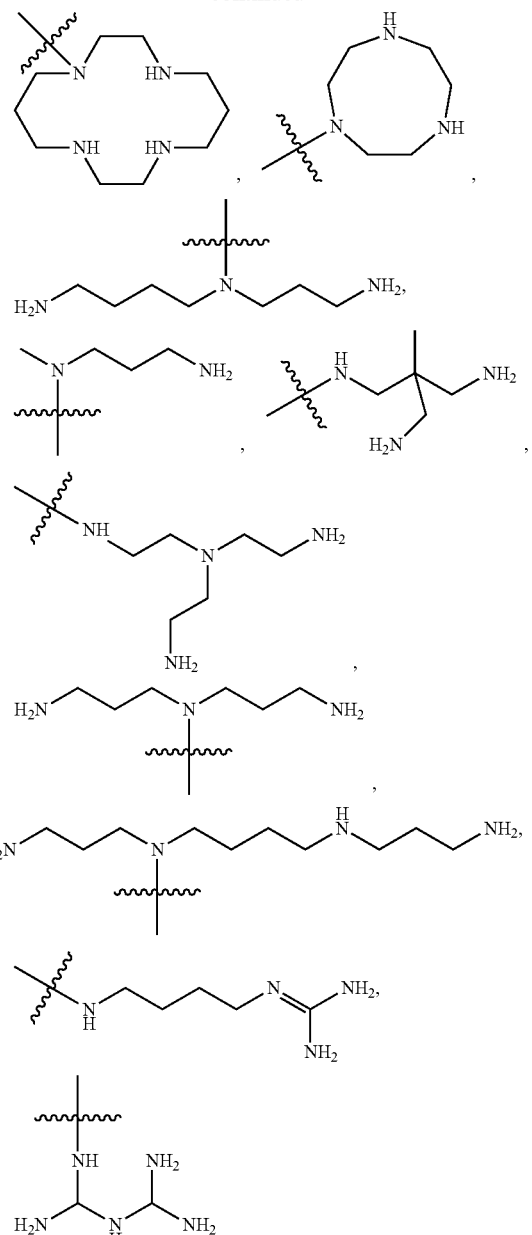
and any combination thereof.
L¹ and L² may independently be a substituted or unsubstituted alkyl, substituted or unsubstituted alkenyl, substituted or unsubstituted alkynyl, ester, amide, ether, —(O—CH$_2$—CH$_2$—O)$_n$—, L³ or any combination thereof, wherein L³ has the following structure:
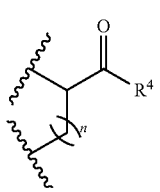

wherein n may be an integer from 1 to 10 and R⁴ may be an amino or a heteroalkyl and the broken bond represents where the structure attaches to the remainder of formula (I).

L¹ and L² may independently be selected from the group consisting of —(CH₂)₄—, amide,

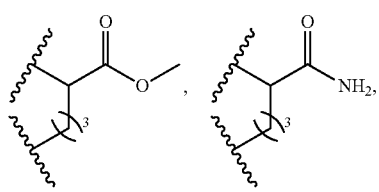

and any combination thereof, or

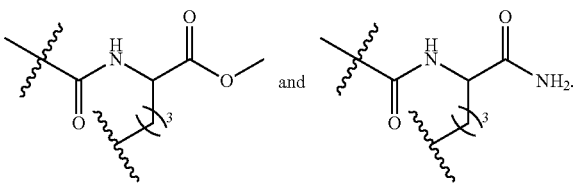

The compound of formula (I) may have a log P value greater than 4. The log P value may be greater than 6, or greater than 8. The log P value may be less than 10.

The compound of formula (I) may have the following structure:

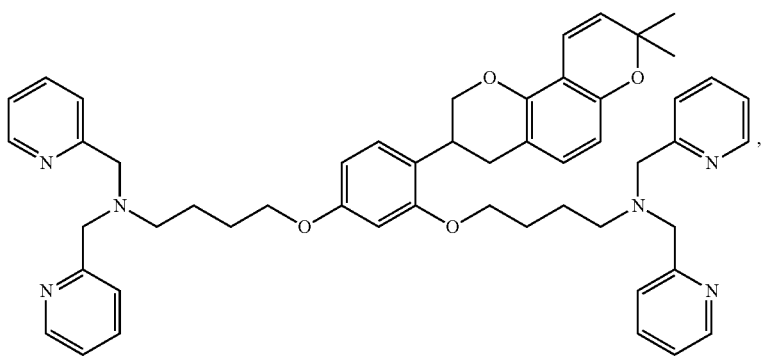

,

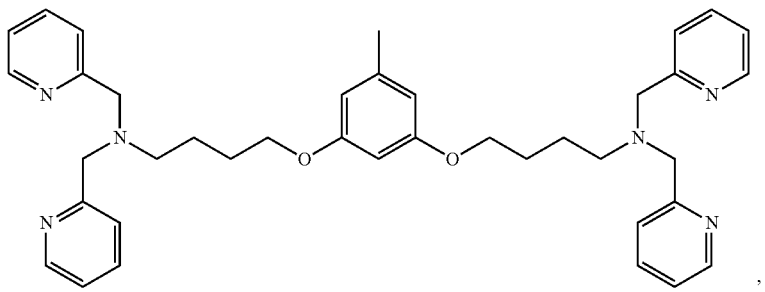

,

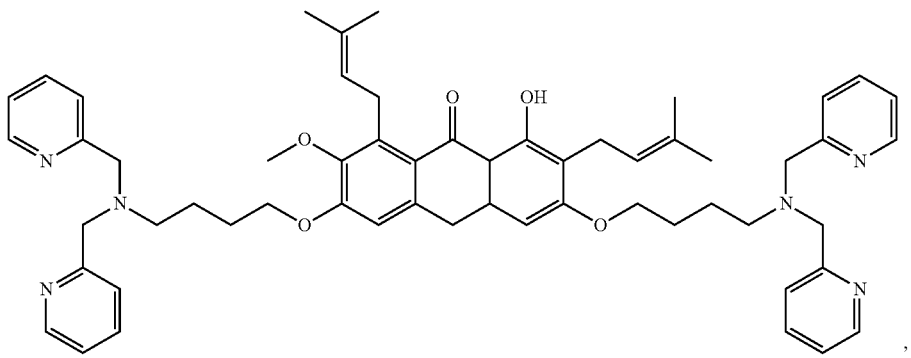

,

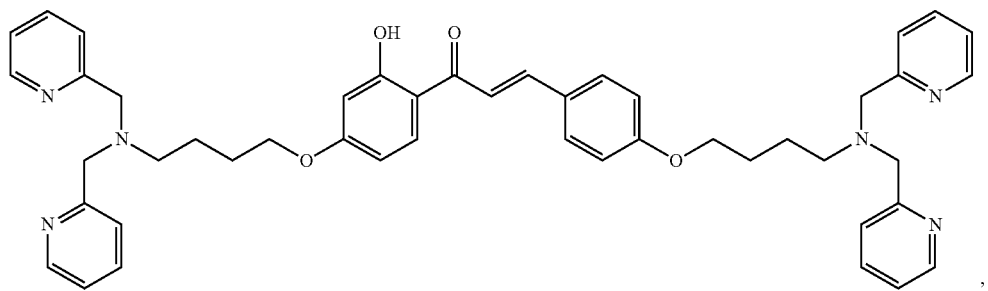,
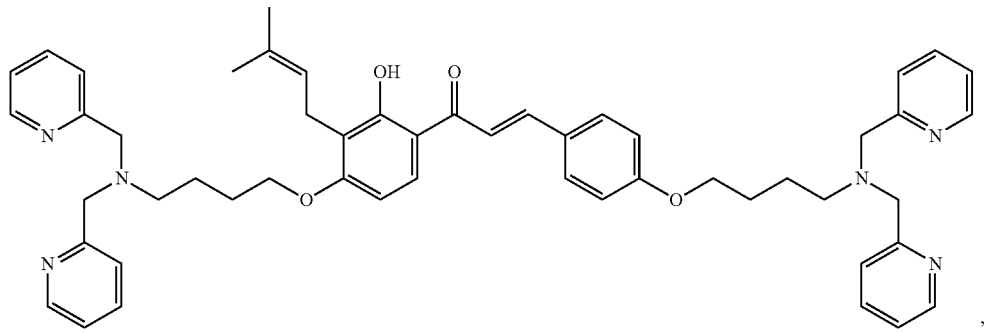,
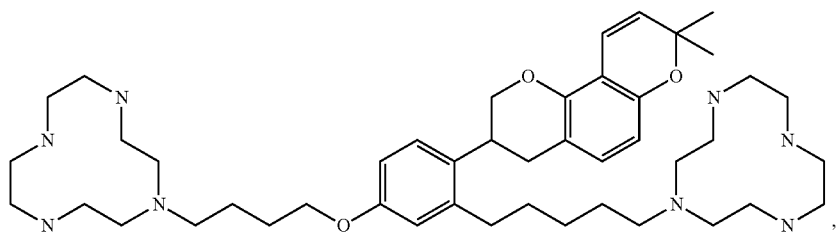,
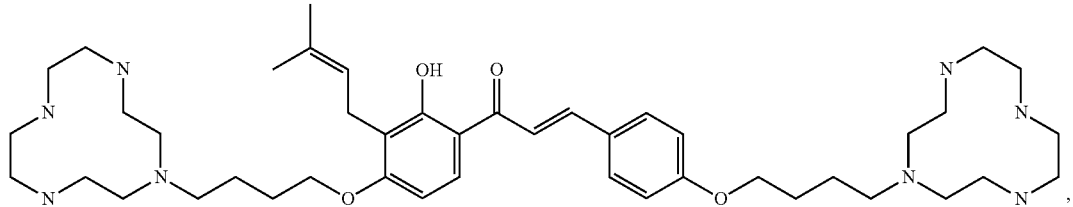,
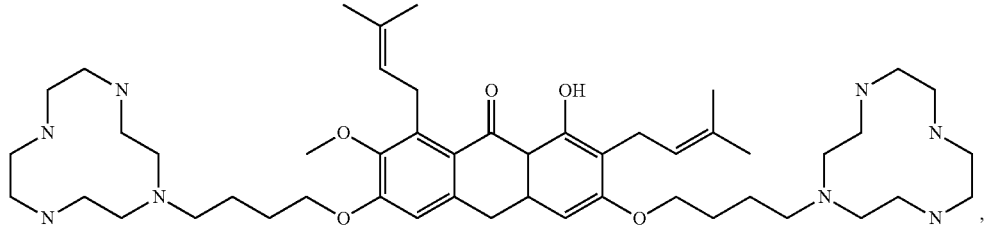,
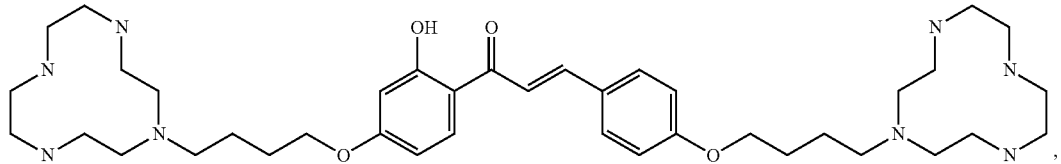,
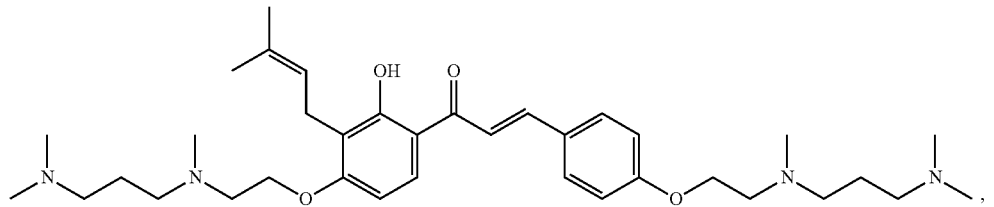, -continued
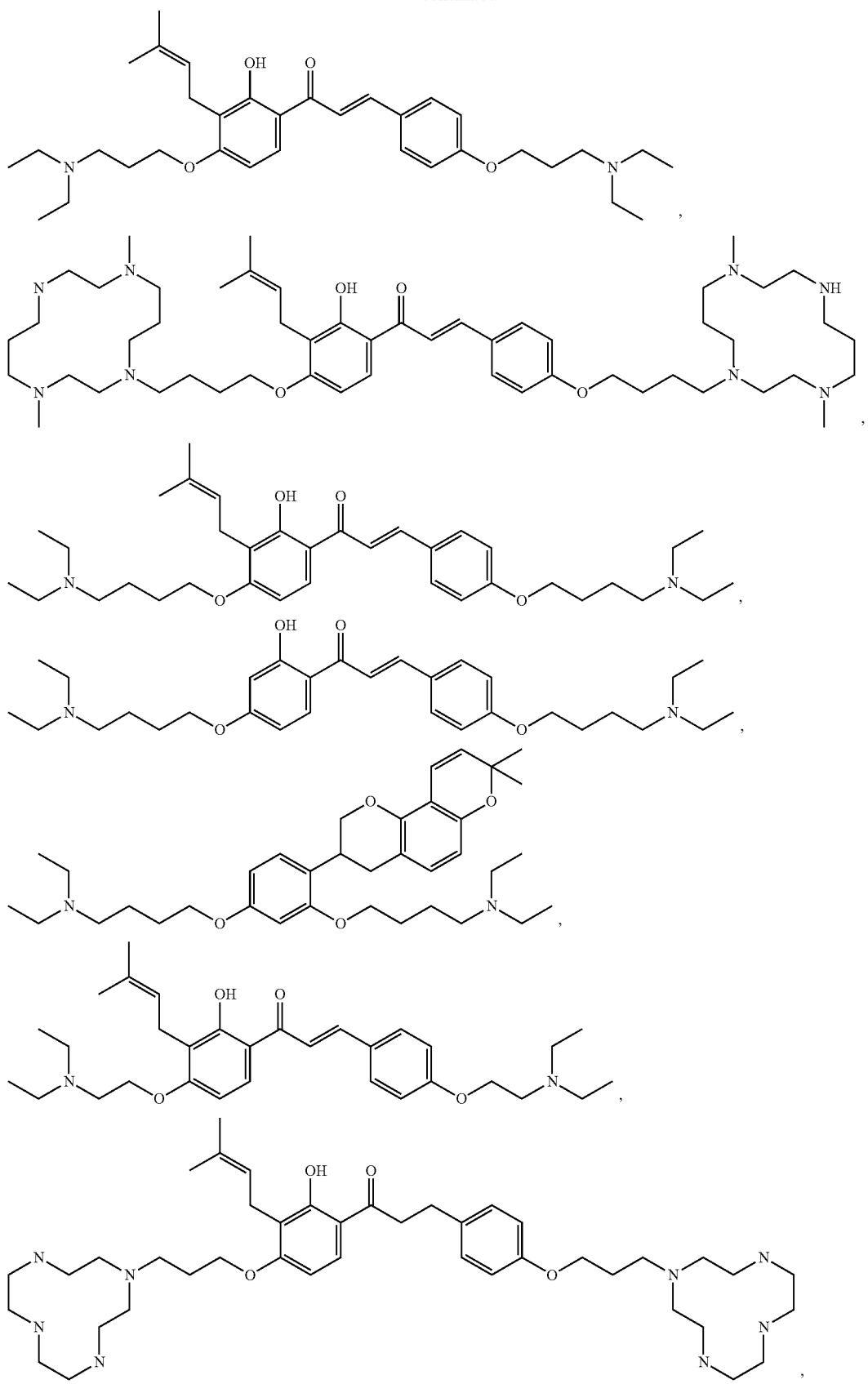

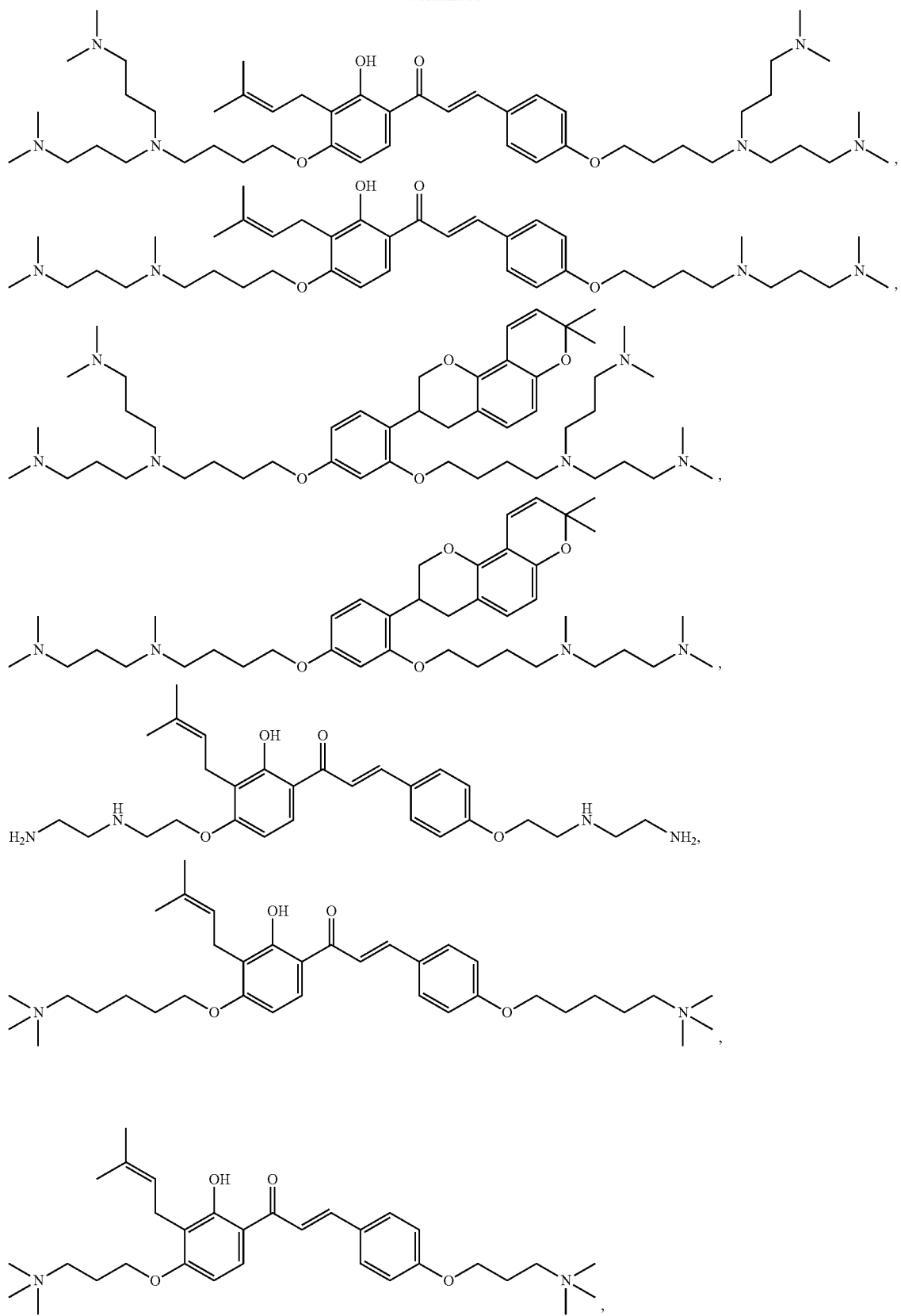

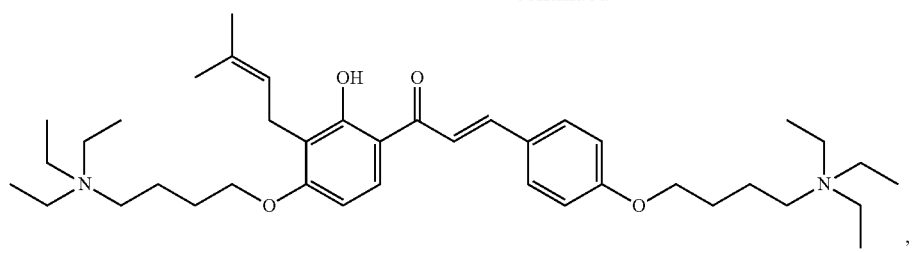,
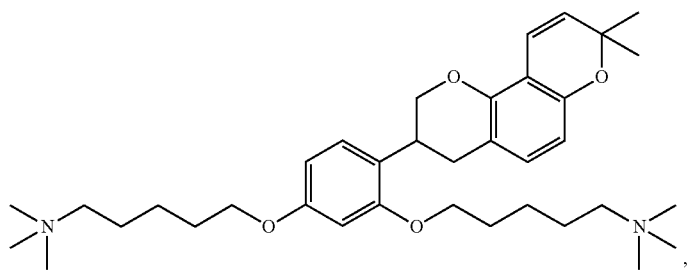,
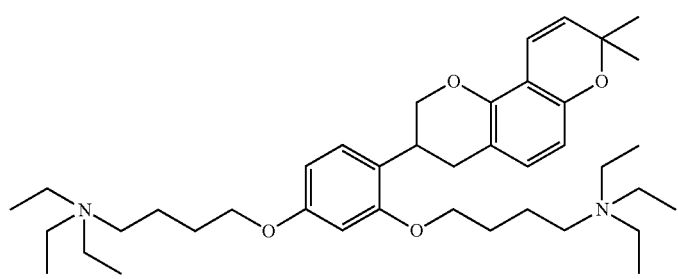,
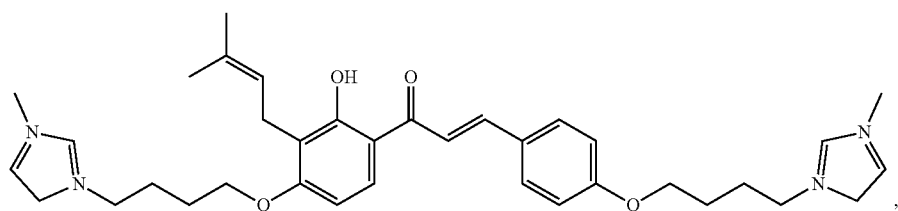,
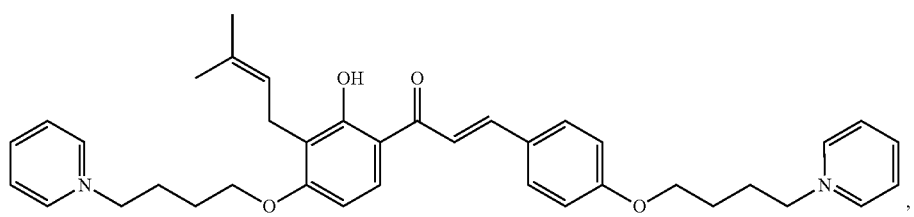,
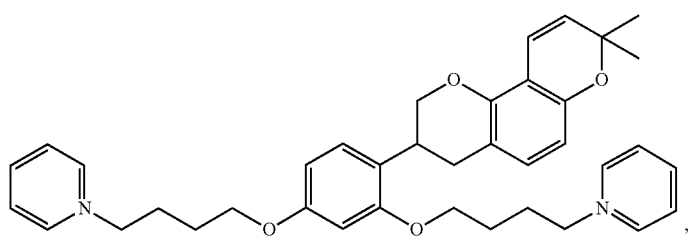,
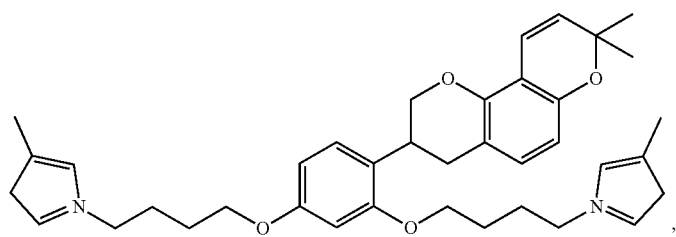,

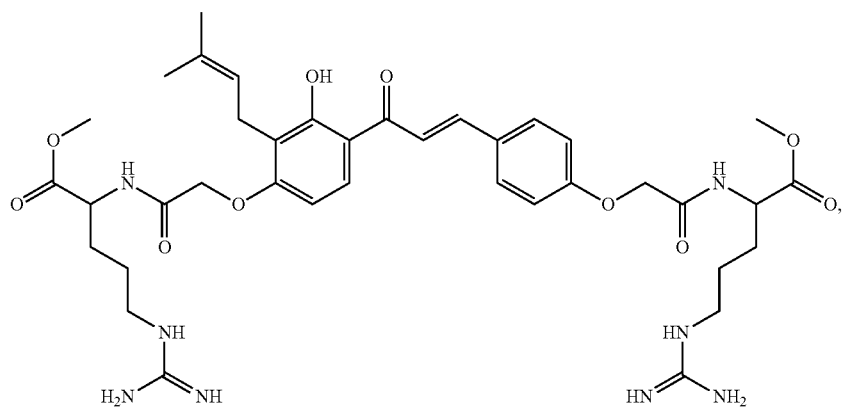
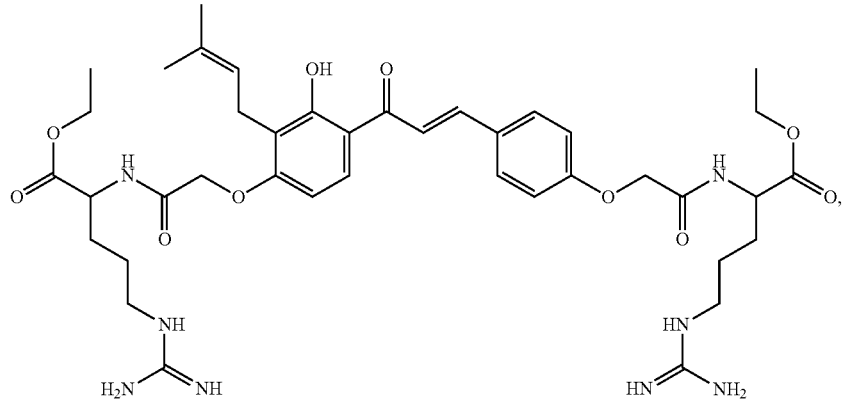
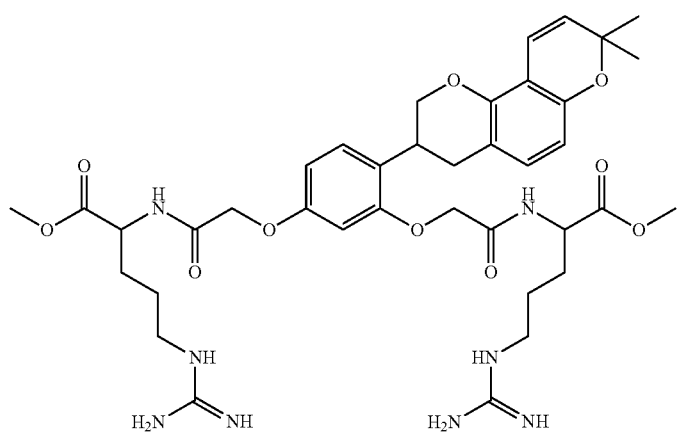
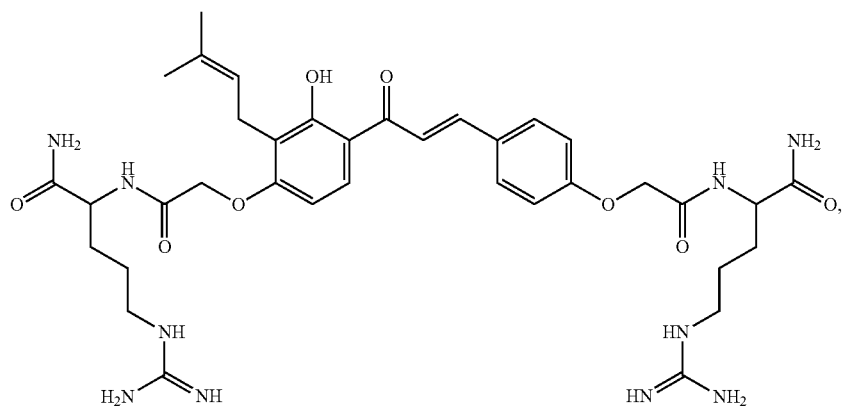

-continued

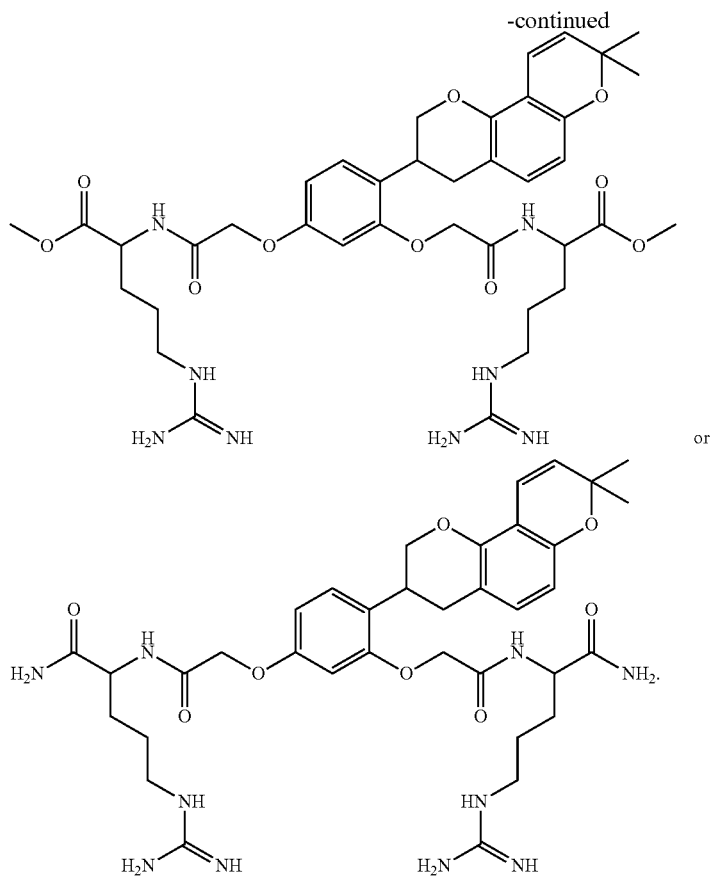

Each N-containing moiety may be independently chelated to zinc.

Each N-containing moiety independently may have a positive charge.

There is provided a pharmaceutical composition comprising a compound as defined above, or a pharmaceutically acceptable salt or hydrate thereof, in association with a pharmaceutically acceptable carrier.

The pharmaceutically acceptable carrier may be saline.

There is provided a process for preparing a compound as defined above, comprising the step of contacting a hydrophobic moiety with an N-containing moiety under reaction conditions.

The process as defined above may further comprise the step of contacting the hydrophobic moiety with a linker before contacting with the N-containing moiety.

A covalent bond may be formed between the hydrophobic moiety and the N-containing moiety or the hydrophobic moiety and the linker or the linker and the N-containing moiety.

The hydrophobic moiety may be selected from the group consisting of:

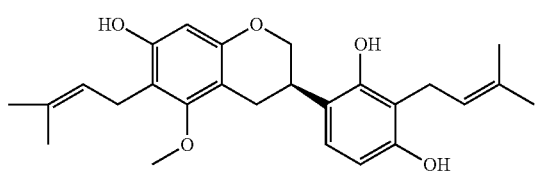

-continued

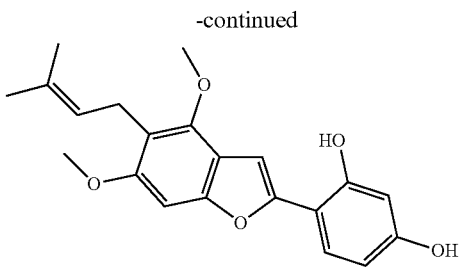

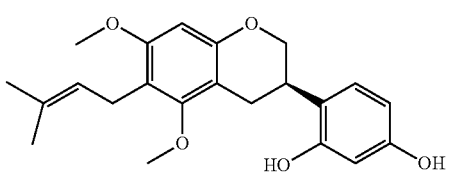

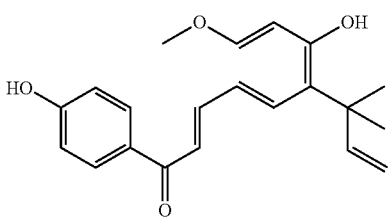

33
-continued
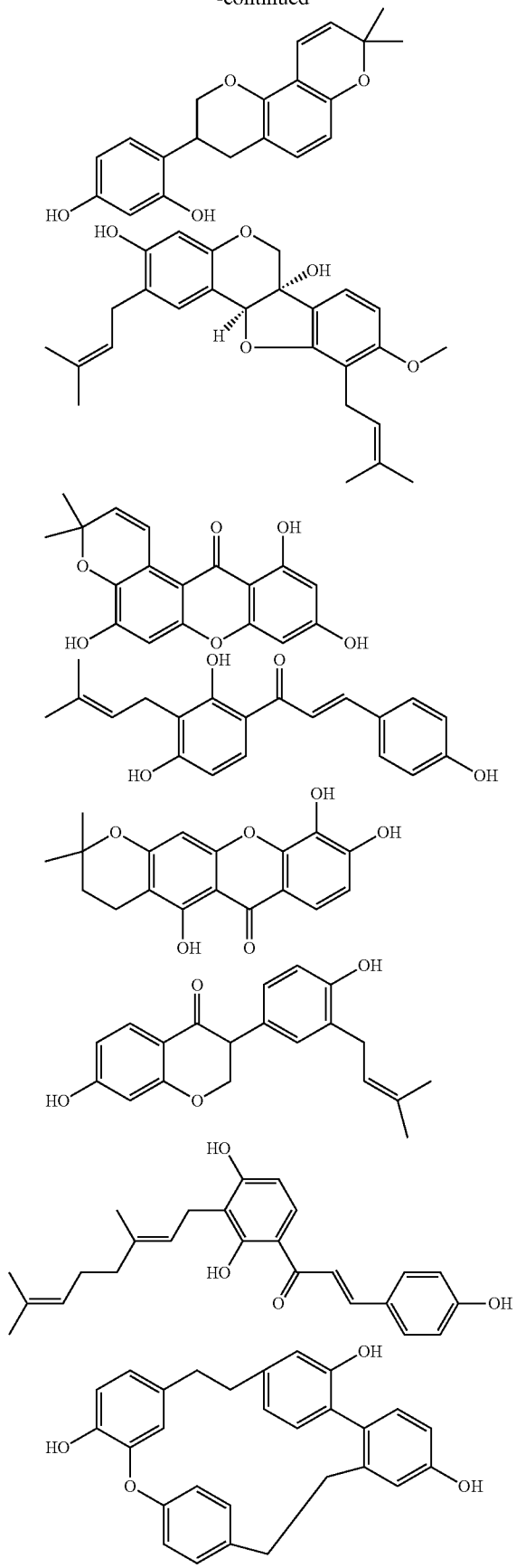
34
-continued
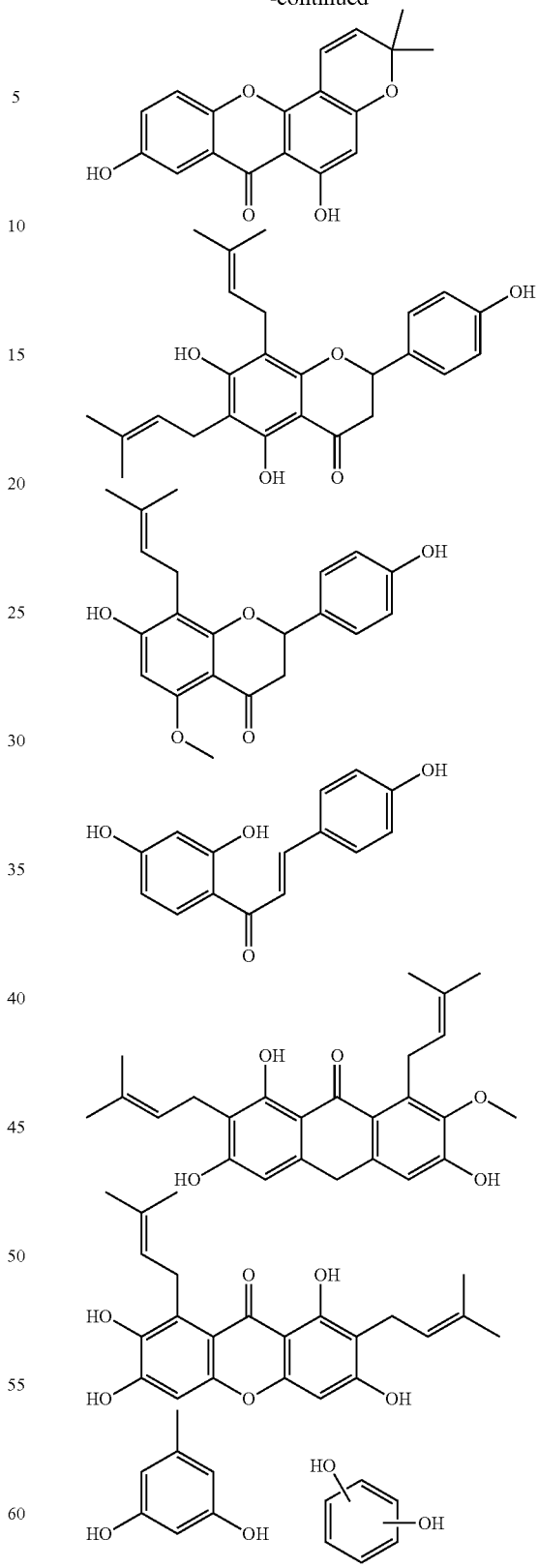
and any mixture thereof.
The linker may be selected from the group consisting of 1,4-dibromobutane, 1,3-diiodobutane, ethyl iodoacetate, hydroxybenzotriazole, 1,2-dibromoethane, 1,3-dibromopropane, methyl iodoacetate, methyl bromoacetate, 1,4-diiodobutane and any combination thereof.

The N-containing moiety may be selected from the group consisting of dipicolylamine, cyclen, 1,8-dimethyl,1,4,8,11-tetracyclotetradecane, diethylamine, —NH[(CH$_2$)$_3$N(CH$_3$)]$_2$, —NH$_2$(CH$_2$)$_3$N(CH$_3$)$_2$, 5-bromopentyltrimethylammonium bromide, 3-bromopentyl trimethylammonium bromide, 4-bromobutyl triethylammonium bromide, 3-(4-Bromobutyl)-1-methylimidazole bromide, 1-(4-Bromobutyl)pyridine bromide, 1-(4-Bromobutyl)pyridine bromide and any combination thereof.

The process as defined above may comprise the step of adding zinc after the N-containing moiety is covalently bonded to the linker or hydrophobic moiety.

The contacting may be done in a solvent selected from the group consisting of acetone, methanol, ethanol, propanol, butanol, N,N-dimethylformamide, dimethylsulfoxide, tetrahydrofuran, dichloromethane, pyridine, water and any mixture thereof.

The contacting step may be performed at a temperature in the range of about 21° C. to about 160° C., about 21° C. to about 60° C., about 21° C. to about 100° C., about 60° C. to about 100° C., about 60° C. to about 160° C., or about 100° C. to about 160° C.

The contacting step may be performed for a duration in the range of about 2 hours to about 36 hours, about 2 hours to about 8 hours, about 2 hours to about 12 hours, about 2 hours to about 24 hours, about 8 hours to about 12 hours, about 8 hours to about 24 hours, about 8 hours to about 36 hours, about 12 hours to about 24 hours, about 12 hours to about 36 hours, or about 24 hours to about 36 hours.

There is provided the use of the compound as defined above or the pharmaceutical composition as defined above, as an antibiotic.

There is provided the use of the compound as defined above or the pharmaceutical composition as defined above, to kill or inhibit the growth of a microorganism in vitro.

The compound as defined above or the pharmaceutical composition as defined above may be used to kill or inhibit the growth of a microorganism on surfaces, including but not limited to topical applications, in plasters, eye drops, nose spray, mouth wash and hand sanitizers.

The compound as defined above or the pharmaceutical composition as defined above may also be used in food preservatives, disinfectants, surface cleaners or medical devices.

The microorganism may be a bacterium, archaea, fungus, protist, or any mixture thereof.

The microorganism may be a Gram negative or Gram positive bacterium.

The bacterium may be MCR positive or MCR negative.

The bacterium may be carbapenem-resistant.

The bacterium may be selected from the group consisting of *E. coli, E. cloacae, P. aeruginosa, Salmonella enterica, Klebsiella pneumoniae, Enterobacter aerogenes,* and *A. baumanii.*

The compound as defined above may be used in conjunction with colistin.

There is provided a compound as defined above for use in therapy.

There is also provided a method for treating a bacterial infection, the method comprising the step of administering to a patient in need thereof a therapeutically effective amount of a compound as defined above.

The method as defined above may further comprise the step of administering a therapeutic amount of colistin in conjunction with the compound as defined above.

There is provided a compound as defined above for use in treating a bacterial infection.

The compound as defined above may be administered in conjunction with colistin.

There is provided the use of a compound as defined above in the manufacture of a medicament for the treatment of a bacterial infection.

In accordance with the present invention, when used for the treatment or prevention of microbial infection, compound(s) of the invention may be administered alone. Alternatively, the compounds may be administered as a pharmaceutical, veterinarial, agricultural, or industrial formulation which comprises at least one compound according to the invention.

The compound(s) may also be present as suitable salts, including pharmaceutically acceptable salts.

The use as defined above may further comprise the compound as defined above to be administered in conjunction with colistin.

There is provided the method as defined above, the compound as defined above or the use as defined above, wherein the compound as defined above may be present at an amount in the range of about 2 µg/mL to about 75 µg/mL, about 2 µg/mL to about 12 µg/mL, about 2 µg/mL to about 25 µg/mL, about 2 µg/mL to about 50 µg/mL, about 12 µg/mL to about 25 µg/mL, about 12 µg/mL to about 50 µg/mL, about 12 µg/mL to about 75 µg/mL, about 25 µg/mL to about 50 µg/mL, about 25 µg/mL to about 75 µg/mL or about 50 µg/mL to about 75 µg/mL.

The method as defined above, the compound as defined above or the use as defined above, wherein the compound as defined above and colistin may be present at an equal amount by weight, or the compound as defined above may be present in excess of about 1.5 to about 6 times, about 1.5 to about 3 times, about 1.5 to about 4.5 times, about 3 times to about 4.5 times, about 3 times to about 6 times, or about 4.5 times to about 6 times of colistin by weight.

The method, compound or use as defined above, wherein colistin may be present at a range of about 1 mg/kg to about 10 mg/kg, about 1 mg/kg to about 2 mg/kg, about 1 mg/kg to about 5 mg/kg, about 2 mg/kg to about 5 mg/kg, about 5 mg/kg to about 10 mg/kg or about 5 mg/kg to about 10 mg/kg and the compound as defined above may be present at a range of about 10 mg/kg to about 50 mg/kg, about 10 mg/kg to about 20 mg/kg or about 20 mg/kg to about 50 mg/kg.

The method as defined above, the compound as defined above or the use as defined above, wherein the compound as defined above may be administered intramuscularly, intraperitoneally, topically, subcutaneously or intravenously.

In one embodiment, the compound may be administered by injection. In the case of injectable solutions, the carrier can be a solvent or dispersion medium containing, for example, water, ethanol, polyol (for example, glycerol, propylene glycol, and liquid polyetheylene glycol, and the like), suitable mixtures thereof, and vegetable oils. The proper fluidity can be maintained, for example, by the use of a coating such as lecithin, by the maintenance of the required particle size in the case of dispersion and by the use of surfactants. Prevention of the action of microorganisms can be achieved by including various anti-bacterial and/or anti-fungal agents. Suitable agents are well known to those skilled in the art and include, for example, parabens, chlorobutanol, phenol, benzyl alcohol, ascorbic acid, thimerosal, and the like. In many cases, it may be preferable to include isotonic agents, for example, sugars, polyalcohols such as mannitol, sorbitol, sodium chloride in the composition.

Prolonged absorption of the injectable compositions can be brought about by including in the composition an agent which delays absorption, for example, aluminium monostearate and gelatin.

Sterile injectable solutions can be prepared by incorporating the analogue in the required amount in an appropriate solvent with one or a combination of ingredients enumerated above, as required, followed by filtered sterilisation. Generally, dispersions are prepared by incorporating the analogue into a sterile vehicle which contains a basic dispersion medium and the required other ingredients from those enumerated above.

Preferably, the pharmaceutical composition may further include a suitable buffer to minimise acid hydrolysis. Suitable buffer agents are well known to those skilled in the art and include, but are not limited to, phosphates, citrates, carbonates and mixtures thereof.

Dispersions of the compounds according to the invention may also be prepared in glycerol, liquid polyethylene glycols, and mixtures thereof and in oils. Under ordinary conditions of storage and use, pharmaceutical preparations may contain a preservative to prevent the growth of microorganisms.

Pharmaceutical compositions suitable for injection include sterile aqueous solutions (where water soluble) or dispersions and sterile powders for the extemporaneous preparation of sterile injectable solutions or dispersions. Ideally, the composition is stable under the conditions of manufacture and storage and may include a preservative to stabilise the composition against the contaminating action of microorganisms such as bacteria and fungi.

Also included in the scope of this invention are delayed release formulations.

Compounds of the invention may also be administered in the form of a "prodrug". A prodrug is an inactive form of a compound which is transformed in vivo to the active form. Suitable prodrugs include esters, phosphonate esters etc, of the active form of the compound.

Single or multiple administrations of the pharmaceutical compositions according to the invention may be carried out. One skilled in the art would be able, by routine experimentation, to determine effective, non-toxic dosage levels of the compound and/or composition of the invention and an administration pattern which would be suitable for treating the diseases and/or infections to which the compounds and compositions are applicable.

Further, it will be apparent to one of ordinary skill in the art that the optimal course of treatment, such as the number of doses of the compound or composition of the invention given per day for a defined number of days, can be ascertained using convention course of treatment determination tests.

DETAILED DESCRIPTION OF THE DRAWINGS

Figure 1:
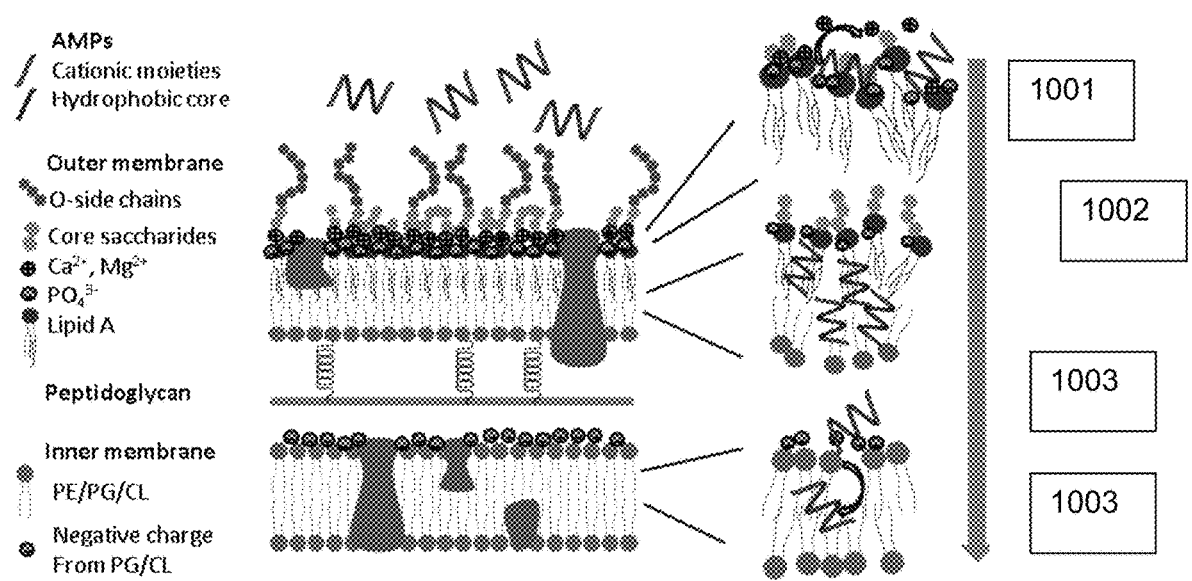
FIG. 1 is a schematic drawing showing the pathway towards the cytoplasmic membrane of the Gram negative bacterial and the types of molecular interactions in each step.
Figure 2:
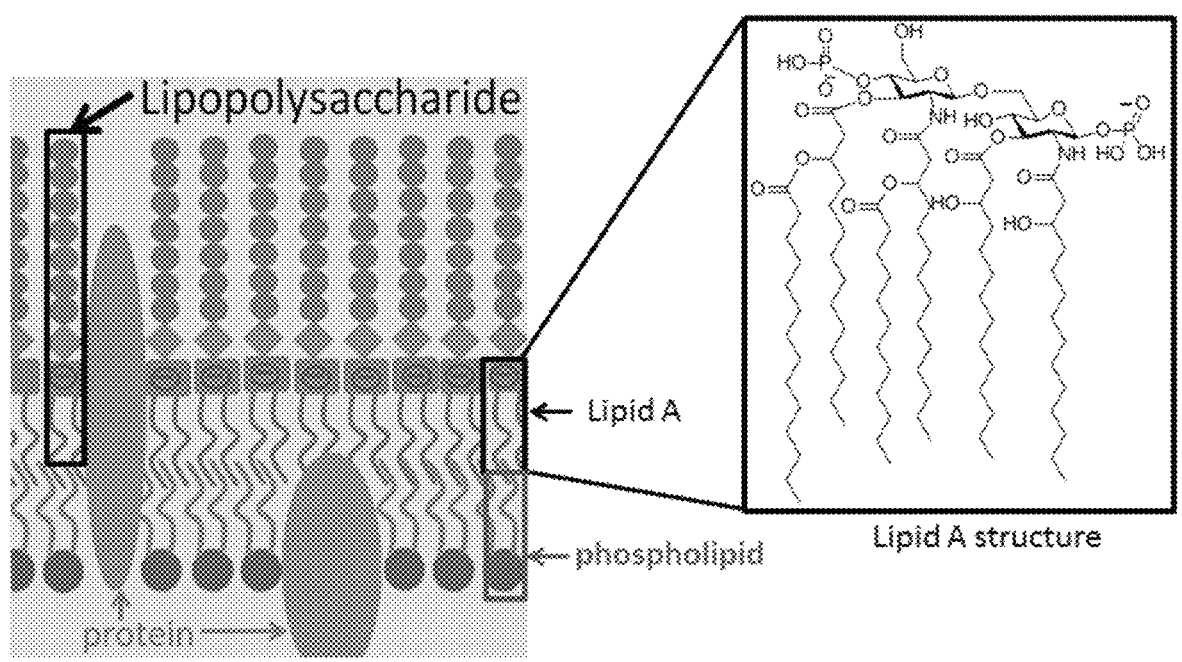
FIG. 2 is a cartoon representation of the outer membrane of Gram negative bacteria and the chemical structure of the lipid A portion of the LPS molecule.

FIG. 1 is a schematic drawing showing the pathway towards the cytoplasmic membrane of the Gram negative bacteria and the types of molecular interactions in each step. 1001 refers to step 1, where t~ns, and adsorption on the LPS surface occurs via electrostatic interactions. 1002 refers to step 2 where the outer membrane is permeabilized, and electrostatic interactions, hydrogen bonds with $PO_4$, and hydrophobic interactions with lipid tails, disrupt salt bridges between $PO_4^{3-}$ and $Ca^{2+}/Mg^{2+}$. 1003 refers to step 3, where t~ns, and adsorption on the cytoplasmic membrane occurs via electrostatic interactions with anionic lipids, hydrogen bonds with head groups and hydrophobic interactions with lipid tails. 1004 refers to step 4, where t>µs where the cytoplasmic membrane is disrupted.

Figure 3:
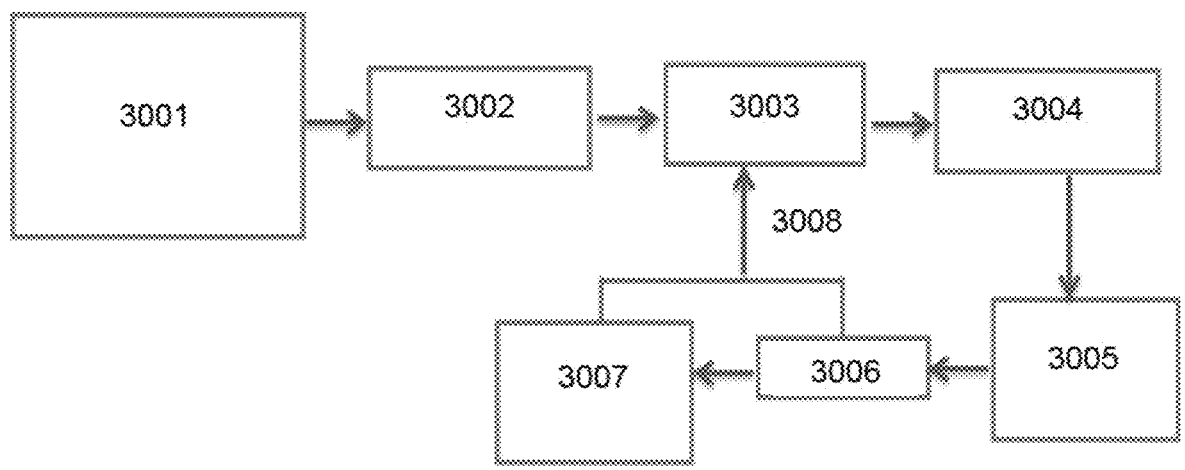
FIG. 3 refers to a schematic flow chart of the proposed method for the design of molecules that can restore the sensitivity of MCR strains to colistin.

FIG. 3 refers to a schematic flow chart of the proposed method for the design of molecules that can restore the sensitivity of MCR strains to colistin. MD simulations of outer membrane and structure analysis of MCR enzyme is performed (3001), target is identified (3002), fragment is generated (3003), fragment is incorporated (3004), new antibiotic is synthesized (3005), the antibiotic is validated (3006) then mechanism of action is deciphered (3007) and this information is fed back (3008) to fragment generation (3003).

EXPERIMENTAL AND METHODS

Example 1: Materials

Bacteria strains indicating "ATCC" in their name were procured from American Type Culture Collection (ATCC), Virginia USA. All other bacteria strains were procured from Tan Tock Seng Hospital, Singapore.

The hydrophobic scaffolds LC003, LC007, LC008, AM000, were purchased from Chengdu Biopurify Phytochemicals (Chengdu, China). The cationic moieties N,N,N-trimethyl-1,3-propanediamine and 3,3'-Iminobis(N,N-dimethylpropylamine) were purchased from Bio-etc (Singapore, Singapore). The MCR-1 Protein was bought from Bioprocessing technology institute, A*STAR (Singapore, Singapore). Cyclen and 1,8-dimethyl,1,4,8,11-tetracyclotetradecane, were purchased from TCI (Tokyo, Japan). The solvents Ethyl Acetate, Hexane, Acetone, Butanol, Methanol, DMF, were purchased from Aik Moh (Singapore, Singapore). All other chemicals were purchased from Sigma-Aldrich (St. Louis, Missouri, USA).

Example 2: MIC Study

MIC experiments of the antimicrobial agents were determined by a modified broth microdilution method in accordance with the Clinical and Laboratory Standards Institute (CLSI) guidelines using 96 well culture plates. In brief, serial dilutions of all plates were prepared at different concentrations (µg). The inoculum suspension was prepared by adding isolated colonies from a 18-20 hours on TSA plate into phosphate buffer (0.31 mM, pH 7.2) or in water for injection (BBraun) and adjusting the suspension to a turbidity equivalent to 0.5 McFarland Standard. Each well contained a final bacterial concentration of approximately $5 \times 10^5$ colony forming units (CFU)/mL. The plate was covered and incubated at 35° C. for 24 hours. The MIC is the lowest concentration of antimicrobial agent that completely inhibits growth of the organism in the tubes or microdilution wells as detected by the unaided eye. For the microdilution plates, turbidity in wells can be measured at $OD_{600}$ using TECAN infinite M200Pro. MIC was determined as highest concentration that gives a 99 percent inhibition.

Example 3: Synergy Study

The MICs of the individual drugs and LC compound in combinations were determined using the broth microdilution technique as recommended by the CLSI whereby the two anti-microbial agents were added in an equal amount. (e.g.: 50 µL of Colistin: 50 µL of LC compounds). Diluted media containing compounds and antibiotics will be serially diluted 2-fold, and LC compounds and antibiotics alone or in combination will be assayed at fixed synergy concentration. In all cases, the lowest concentration at which no visible growth occurred was be recorded to be the MIC value of individual and combined antibacterial agents. The results were obtained after 24 hours of incubation.

Example 4: Time Killing Study

Time kill assay is used to determine the rate at which concentrations an antimicrobial agent kill a bacterial isolate. The bacterial suspension was adjusted to $10^6$ to $10^7$ CFU/mL with different concentrations of LC compounds and the antibiotics for comparison in separate tubes that incubated at 35° C. For synergy time kill: Two different antimicrobial agents which are antibiotic/LC compounds were added in an equal amount make a final volume to 1 mL (e.g: 500 µL of Antibiotic: 500 µL of LC compound) and subsequently 1 mL of prepared bacteria suspension were added into the same tube. Aliquots of 100 µL samples will be withdrawn at different time intervals (0, 1, 2, 4, 8, 24 hours) and were plated on Mueller Hinton Agar (MHA) upon set of serial dilutions. Subsequently, after 24 and 48 hours, all the plates were checked for bacteria growth and the colonies were calculated for colony-forming unit (CFU/mL) numeration and the time kill curve plotted with logarithm of the viable count against time. The results from various concentrations of antibiotics and control were plotted.

Example 5: In Vivo Mouse Thigh Infection Model

The combination of colistin and antimicrobial peptide (LC100) was tested against *E. coli* clinical isolate MCR-positive strain 6083655967 in a neutropenic mouse thigh infection model. C57BL/6 mice were rendered neutropenic by cyclophosphamide, dosed at 150 and 100 mg kg-1 delivered on days −4 and −1 prior to infection. Bacteria were suspended in sterile saline and adjusted to a concentration of $\sim 1.876 \times 10^6$ CFU per infection site (100 micro-liters) and injected intramuscularly into the right thigh of five mice per treatment group. At 1 h post infection, mice received colistin (15 mg kg-1, i.p. n=5), LC100 (50 mg kg-1, i.p. n=5), untreated (n=5), or the combination (n=5). Mice were euthanized 6 h after infection; thigh tissue was aseptically collected, homogenized, serially diluted in PBS and plated onto solid TSA supplemented plates. Plates were incubated overnight at 37° C. and colonies were quantified to determine bacterial load.

Example 6: Results of Molecular Dynamics Studies

Figure 7:
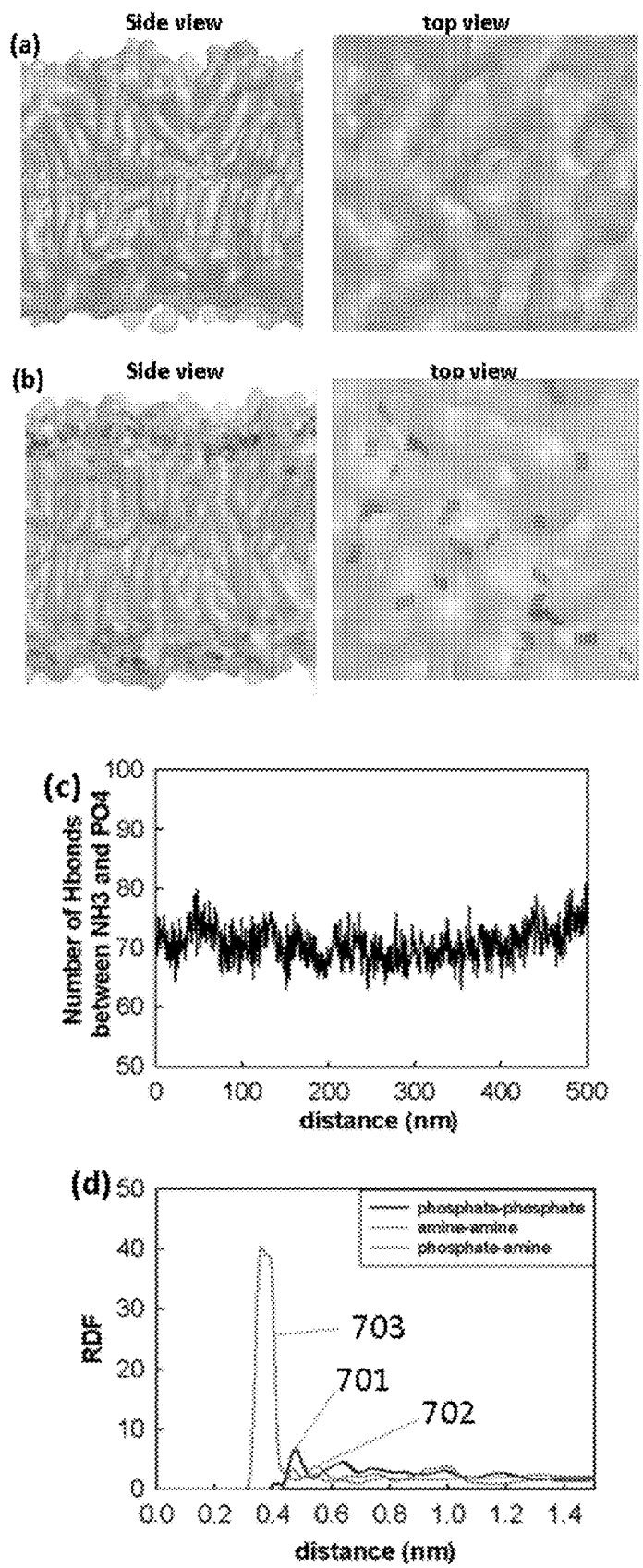
FIG. 7 refers to images and graphs showing the molecular dynamics simulation results for the outer membrane of the MCR modified membrane. (a) Snapshots of the normal lipid A membrane; (b) snapshots of the PE modified lipid A membrane. The PE group forms hydrogen bonds (shown as dashed lines) with the adjacent lipid A molecules, resulting in a network that stabilizes the outer membrane. (c) graph showing the number of hydrogen bonds in a membrane patch of 64 lipid A molecules. (d) graph showing the radial distribution function (RDF) between different groups, showing phosphate-phosphate (701), amine-amine (702) and phosphate-amine (703).

Molecular dynamics simulations were performed to understand the molecular origins of colistin resistance. The structural and dynamics of mcr-1(+) and intact lipid A membranes were studied. For each membrane, a preassembled lipid A bilayer was first assembled by placing the required number of lipid A molecules (from either mcr-1(+) or mcr-1(−) strains) on grids in the xy dimension. Next the preassembled bilayer was solvated with water molecules. Calcium ions were used to neutralize the system. A MD simulation was performed for 300 ns to equilibrate each lipid A bilayer. At the end of the MD simulation, all the calcium ions were found to be adsorbed onto the bilayer surface. In the mcr-1(−) strain, the calcium ions were found to form salt-bridges between phosphate groups, which counteracts the repulsion between negatively charged lipid A molecules and stabilizes the lipid A membrane. Disruption of the salt-bridges with antimicrobial peptides such as colistin destabilizes the outer membrane. However, in the case of mcr-1(+) strains, the MD simulation revealed large number of intermolecular hydrogen bonds between) and phosphate group of mcr-1 the membrane (FIG. 7). Due to the opposite charges that the phosphate groups and the amine groups carry, they interact with strong electrostatic attractions that further stabilize the lipid A membrane. As a result, the short-range inter-lipid hydrogen bonds and the long-range electrostatic interactions crosslink the lipid A molecules of mcr-1(+) strains together, resulting in the resistance to colistin action. The results suggest perturbation of the hydrogen bonds or the electrostatic interactions of the lipid A membrane may destabilize the outer membrane of the mcr-1(+) strains.

Example 7: Chemical Synthesis

Figure 10:
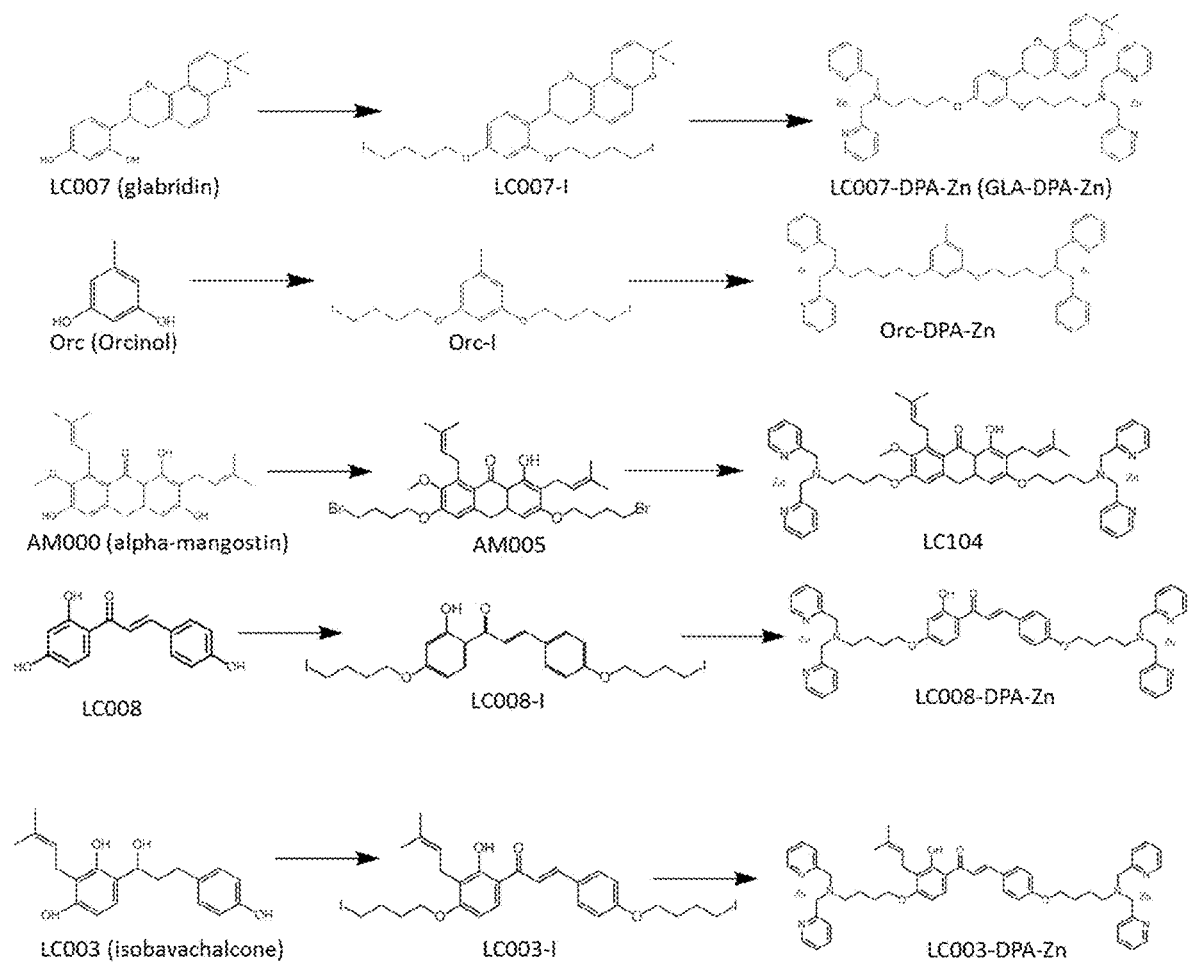
FIG. 10 refers to structures of the molecules synthesized in the DPA-Zn series.
Figure 11:
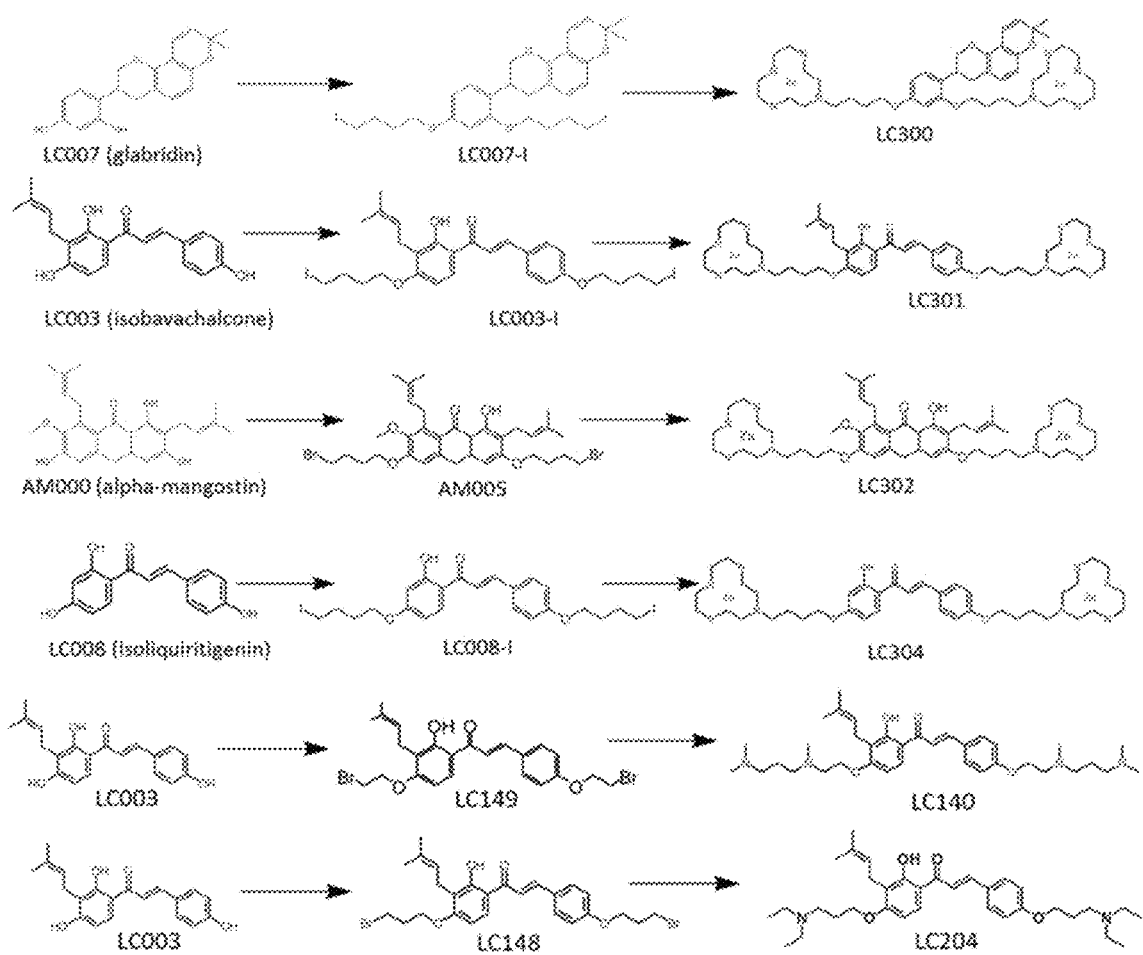
FIG. 11 refers to structures of the molecules synthesized in the amine series.
Figure 11:
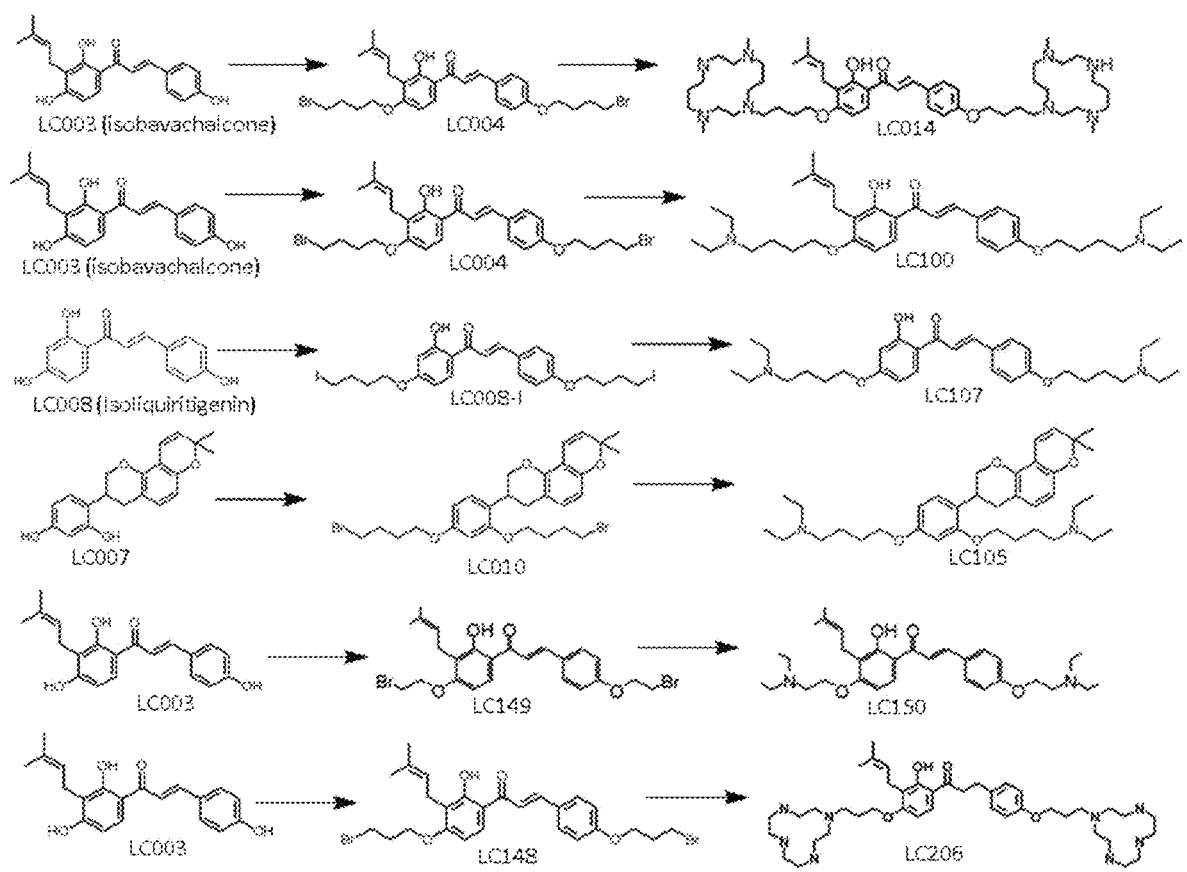
Figure 11:
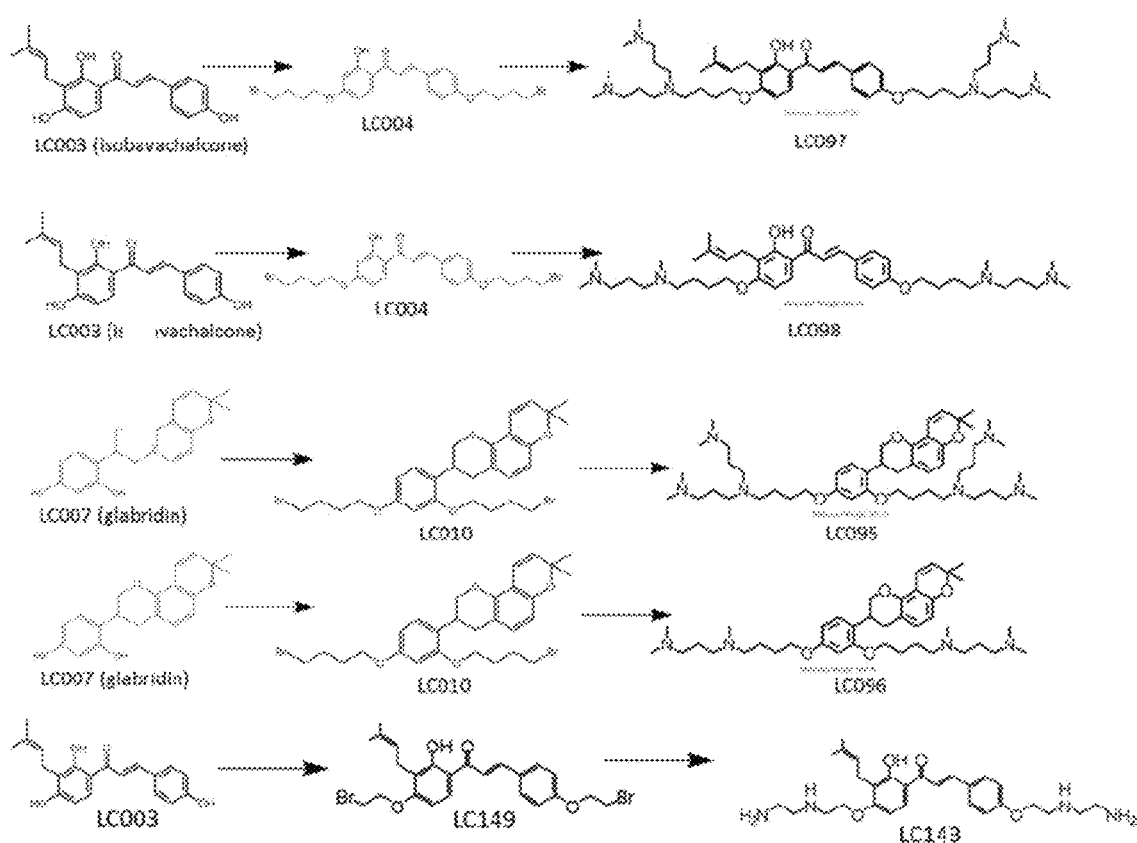
Figure 11:
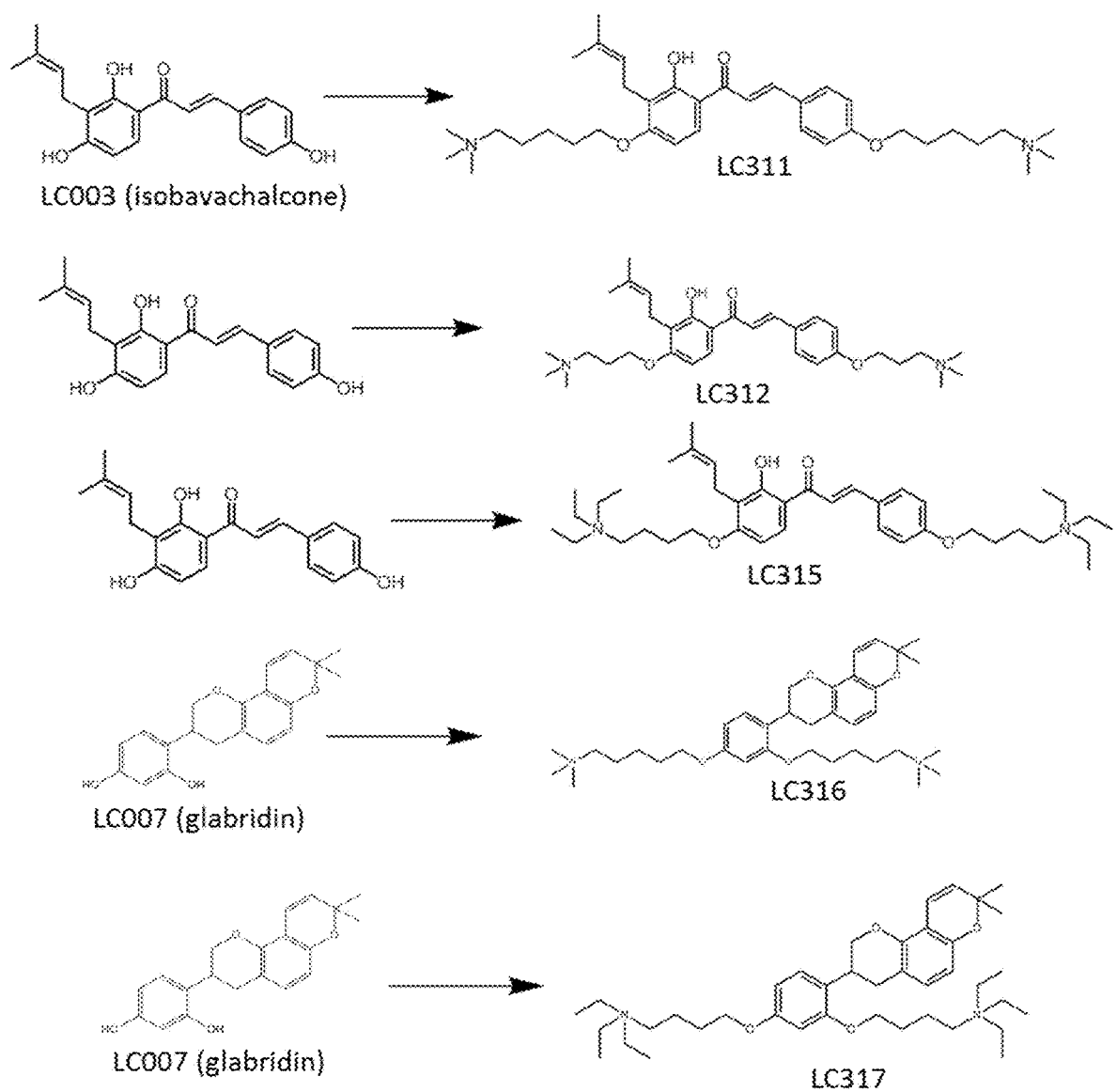
Figure 11:
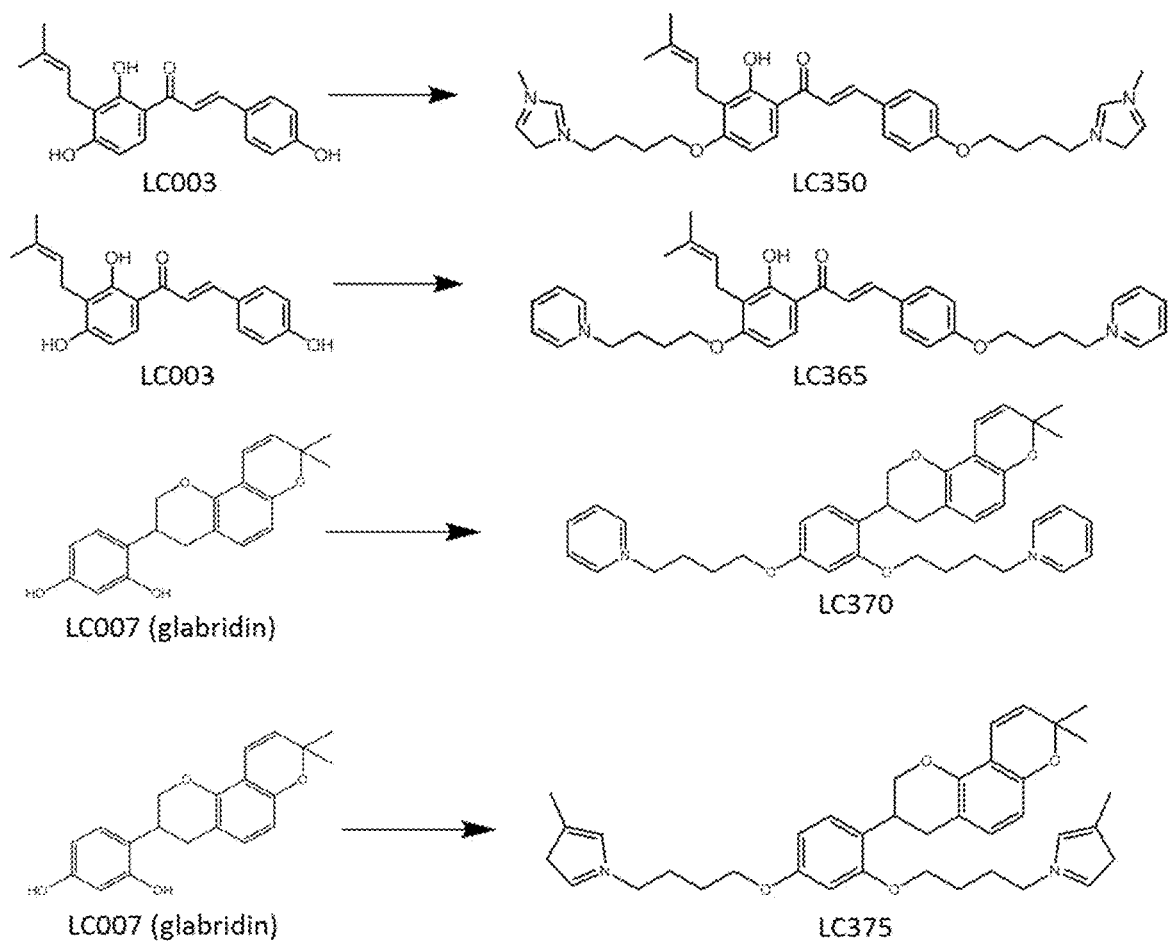
Figure 12:
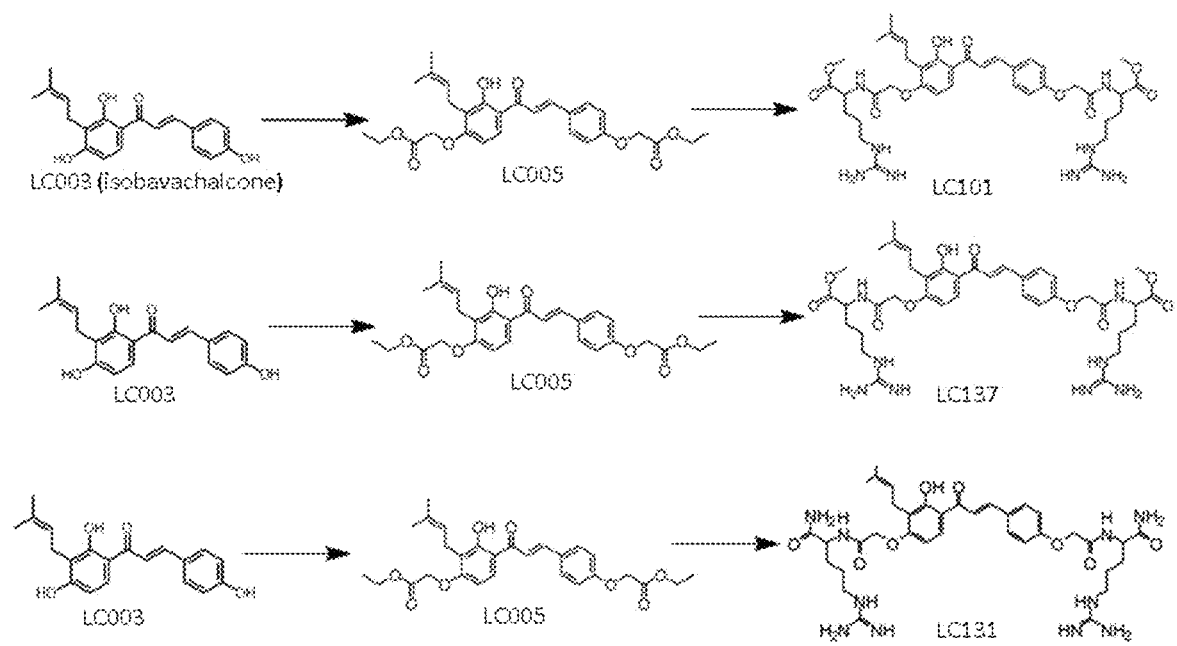
FIG. 12 refers to structures of the molecules synthesized in the guanidine series.
Figure 12:
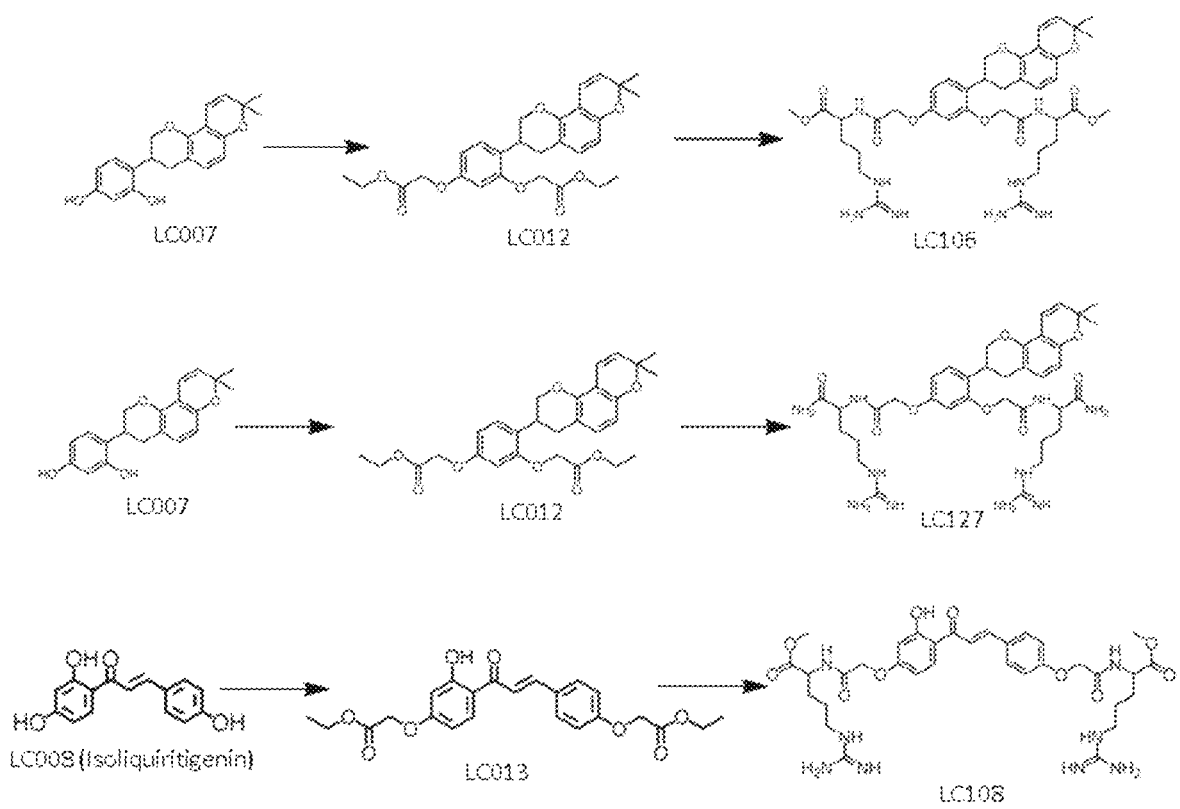

Selected synthetic schemes are shown in FIG. 10, FIG. 11 and FIG. 12.

Synthesis of LC004: 1,4-dibromobutane (313.8 µL, 2.65 mmol) and $K_2CO_3$ (111.7 mg, 0.808 mmol) are added to Isobavachalcone, LC003, (57.2 mg, 0.176 mmol) dissolved in 3 mL acetone. The reaction was kept under reflux conditions and stirred overnight. Acetone solvent was removed in vacuo. The crude product was diluted with ethyl acetate and extracted with saturated sodium chloride solution. Pure LC004 is obtained via silica gel column chromatography with elution gradient (Hexane:EtOAc (v/v), 26:1), 77.3 mg. Yield: 73.8%.

Synthesis of LC003-I: 1,4-diiodobutane (601 µL, 4.557 mmol) and $K_2CO_3$ (198 mg, 1.43 mmol) were added to LC003 (98.6 mg, 0.304 mmol) dissolved in acetone. The reaction was processed similar to the synthesis of LC004. Silica gel column chromatography of crude product using solvent ratio Hexane:EtOAc (v/v) 40:1 to obtain 113.5 mg LC003-1 as yellow powder. Yield: 54%.

Synthesis of LC003-DPA: LC003-1 (25.5 mg, 0.037 mmol) in 2.5 mL acetone was added $K_2CO_3$ (26.2 mg, 0.190 mmol) and dipicolylamine (99 µL, 0.550 mmol). The reaction mixture was stirred overnight at 55° C. Acetone was removed in vacuo. The crude product was diluted with EtOAc and extracted 3 times with saturated NaCl solution. Purification was achieved with preparative HPLC to obtain 17.8 mg of LC003-DPA as bright yellow gel. Yield: 58%.

Synthesis of LC003-DPA-Zn: 5.44 mg $ZnCl_2$ in 1 mL methanol was mixed with 8.3 mg LC003-DPA and stirred for 3 hours. The solvent was removed in vacuum to give LC003-DPA-Zn complex (LC003-DPA:Zn=1:4).

Synthesis of LC008-1: 1,4-diiodobutane (478 µL, 1.86 mmol) and $K_2CO_3$ (180 mg, 1.302 mmol) were added to LC008 (61.8 mg, 0.241 mmol) dissolved in acetone. The reaction was processed similar to the synthesis of LC004. Silica gel column chromatography of crude product using solvent ratio Hexane:EtOAc (v/v) 25:1 to obtain 49.6 mg LC008-1 as yellow powder. Yield: 33%.

Synthesis of LC008-DPA: LC008-1 (32.1 mg, 0.052 mmol) in 2 mL acetone was added $K_2CO_3$ (42.0 mg, 0.304 mmol) and dipicolylamine (140 µL, 0.778 mmol). The reaction mixture was stirred overnight at 55° C. Acetone was removed in vacuo. The crude product was diluted with EtOAc and extracted 3 times with saturated NaCl solution. Purification was achieved with preparative HPLC to obtain 16.7 mg of LC008-DPA as bright yellow gel. Yield: 42%.

Synthesis of LC008-DPA-Zn: 5.44 mg $ZnCl_2$ in 1 mL methanol was mixed with 7.62 mg LC003-DPA and stirred for 3 hours. The solvent is removed in vacuum to give LC008-DPA-Zn complex (LC008-DPA:Zn=1:4).

Synthesis of AM005: 1,4-dibromobutane (434 µL, 3.66 mmol) and $K_2CO_3$ (168 mg, 1.22 mmol) were added to AM000 (100 mg, 0.244 mmol) dissolved in 3 mL acetone. The reaction was processed similar to the synthesis of LC004. Silica gel column chromatography of crude product using solvent ratio Hexane:EtOAc (v/v) 20:1 to obtain 98 mg AM005 as yellow powder. Yield: 59%

Synthesis of AM000-DPA: AM005 (68 mg, 0.1 mmol) in 3 mL acetone was added $K_2CO_3$ (84.0 mg, 0.6 mmol) and dipicolylamine (269 µL, 1.5 mmol). The reaction mixture was stirred overnight at 55° C. Acetone is removed in vacuo. The crude product was diluted with EtOAc and extracted 3 times with saturated NaCl solution. Purification was achieved with preparative HPLC to obtain 38.4 mg of AM000-DPA as bright yellow gel. Yield: 47%.

Synthesis of LC104 (AM000-DPA-Zn): 5.44 mg $ZnCl_2$ in 1 mL methanol was mixed with 9.16 mg AM000-DPA and stirred for 3 hours. The solvent is removed in vacuo to give LC104 complex (AM000-DPA:Zn=1:4).

Synthesis of Orc-1: 1,4-diiodobutane (1 mL, 7.58 mmol) and $K_2CO_3$ (546 mg, 3.95 mmol) were added to Orcinol (62.9 mg, 0.506 mmol) dissolved in acetone. The reaction was processed similarly to the synthesis of LC004. Silica gel column chromatography of crude product using solvent ratio Hexane:EtOAc (v/v) 100:1 to obtain 164.7 mg LC008-1 as yellow powder. Yield: 67%.

Synthesis of Orc-DPA: Orc-I (66 mg, 2.83 mmol) in 2 mL acetone was added $K_2CO_3$ (122 mg, 0.883 mmol) and dipicolylamine (364 µL, 2.022 mmol). The reaction mixture was stirred overnight at 55° C. Acetone was removed in vacuo. The crude product was diluted with EtOAc and extracted 3 times with saturated NaCl solution. Purification was achieved with Preparative HPLC to obtain 66.4 mg of LC008-DPA as bright yellow gel. Yield: 85%.

Synthesis of Orc-DPA-Zn: 5.44 mg $ZnCl_2$ in 1 mL methanol was mixed with 6.3 mg Orc-DPA and stirred for 3 hours. The solvent is removed in vacuum to give Orc-DPA-Zn complex (Orc-DPA:Zn=1:4).

Synthesis of LC007-1: 1,4-diiodobutane (373 µL, 2.83 mmol) and $K_2CO_3$ (147.3 mg, 1.07 mmol) were added to glabridin (62.2 mg, 0.192 mmol) dissolved in acetone. The reaction was processed similarly to the synthesis of LC004.

Silica gel column chromatography of crude product using solvent ratio Hexane:EtOAc (v/v) 30:1 to obtain 66.6 mg LC007-1 as yellow powder. Yield: 50.0%

Synthesis of GLA-DPA: GLA-1 (31.5 mg, 0.0456 mmol) in 2 mL acetone was added $K_2CO_3$ (37.5 mg, 0.271 mmol) and dipicolylamine (123 μL, 0.683 mmol). The reaction mixture was stirred overnight at 55° C. Acetone was removed in vacuo. The crude product was diluted with EtOAc and extracted 3 times with saturated NaCl solution. Purification was achieved with preparative HPLC to obtain 24.4 mg of GLA-DPA as yellow gel. Yield: 65%.

Synthesis of GLA-DPA-Zn (LC007-DPA-Zn): 5.44 mg $ZnCl_2$ in 1 mL methanol was mixed with 8.3 mg GLA-DPA and stirred for 3 hours. The solvent was removed in vacuo to give GLA-DPA-Zn complex (GLA-DPA:Zn=1:4).

Synthesis of LC300: LC010 (34.85 mg, 0.05 mmol) in 3 mL DMF was added cyclen (68.8 mg, 0.4 mmol). The reaction mixture was stirred at room temperature for 4 hours. The crude product is dissolved in butanol and subsequently washed with aqueous $K_2CO_3$ and saturated NaCl solution 3 times and dried in vacuo. The crude was then re-dissolved in 1 mmol $ZnCl_2$/MeOH solution. Purification was achieved with preparative HPLC to obtain 20.2 mg of LC300 (GLA-cyclen-Zn) as yellow gel. Yield: 40.5%.

Synthesis of LC301: LC003-1 (34.85 mg, 0.05 mmol) in 3 mL DMF was added cyclen (68.8 mg, 0.4 mmol). The reaction mixture was stirred at room temperature for 4 hours. The crude product is dissolved in butanol and subsequently washed with aqueous $K_2CO_3$ and saturated NaCl solution 3 times and dried in vacuo. The crude product was then re-dissolved in 1 mmol $ZnCl_2$/MeOH solution. Purification was achieved with preparative HPLC to obtain 18.4 mg of LC301 (LC003-cyclen-Zn) as yellow gel. Yield: 37%.

Synthesis of LC302: AM005 (34.0 mg, 0.05 mmol) in 3 mL DMF was added cyclen (68.8 mg, 0.4 mmol). The reaction mixture was stirred at room temperature for 4 hours. The crude product was dissolved in butanol and subsequently washed with aqueous $K_2CO_3$ and saturated NaCl solution 3 times and dried in vacuo. The crude was then re-dissolved in 1 mmol $ZnCl_2$/MeOH solution. Purification was achieved with preparative HPLC to obtain 24.6 mg of LC302 (AM000-cyclen-Zn) as yellow gel. Yield: 45%.

Synthesis of LC304: LC008-1 (34.0 mg, 0.05 mmol) in 3 mL DMF was added cyclen (68.8 mg, 0.4 mmol). The reaction mixture was stirred at room temperature for 4 hours. The crude product was dissolved in butanol and subsequently washed with aqueous $K_2CO_3$ and saturated NaCl solution 3 times and dried in vacuo. The crude was re-dissolved in 1 mmol $ZnCl_2$/MeOH solution. Purification was achieved with preparative HPLC to obtain 25.3 mg of LC302 (LC008-cyclen-Zn) as yellow gel. Yield: 54%.

Synthesis of LC014: LC004 (62.1 mg, 0.104 mmol) and 1,8-dimethyl,1,4,8,11-tetracyclotetradecane (61.9 μL, 0.376 mmol) were dissolved in 4 mL of DMF and left under stirring conditions overnight room temperature. The crude product was diluted with butanol and extracted 3 times with saturated NaCl solution and dried in vacuo. The crude was then re-dissolved in 1 mmol $ZnCl_2$/MeOH solution. Purification was achieved with preparative HPLC to obtain 10.9 mg of LC014 as yellow gel. Yield: 12%.

Synthesis of LC100: LC004 (89 mg, 0.150 mmol) was added to mixture of 3 mL diethylamine and 3 mL DMSO, and stirred at room temperature for 3 hours. The crude product was washed with aqueous $K_2CO_3$ and saturated NaCl solution. Crude sample was purified with silica gel chromatography (EtOAc/MeOH/TEA (v/v/v), 150/1/1). 63.8 mg of product was obtained. Yield: 73.6%.

Synthesis of LC097: LC004 (59.4 mg, 0.10 mmol) was added to mixture of 1 mL 3,3'-Iminobis(N,N-dimethylpropylamine) and 3 mL DMSO, and stirred at room temperature for 4 hours. The crude product was washed with aqueous $K_2CO_3$ and saturated NaCl solution. Purification was achieved with preparative HPLC to obtain 41.8 mg product. Yield: 52%.

Synthesis of LC098: LC004 (59.4 mg, 0.10 mmol) was added to mixture of 1 mL N,N,N-trimethyl-1,3-propanediamine and 3 mL DMSO, and stirred at room temperature for 4 hours. The crude product was washed with aqueous $K_2CO_3$ and saturated NaCl solution. Purification was achieved with preparative HPLC to obtain 43.2 mg product. Yield: 65%.

Synthesis of LC095: LC010 (29.7 mg, 0.05 mmol) was added to mixture of 1 mL 3,3'-iminobis(N,N-dimethylpropylamine) and 3 mL DMSO, and stirred at room temperature for 4 hours. The crude product was washed with aqueous $K_2CO_3$ and saturated NaCl solution. Purification was achieved with preparative HPLC to obtain 36 mg product. Yield: 44.8%.

Synthesis of LC096: LC010 (29.7 mg, 0.05 mmol) was added to a mixture of 0.6 mL N,N,N-trimethyl-1,3-propanediamine and 3 mL DMSO, and stirred at room temperature for 4 hours.

The crude product was washed with aqueous $K_2CO_3$ and saturated NaCl solution. Purification was achieved with preparative HPLC to obtain 46.5 mg product. Yield: 70%.

Synthesis of LC149: 1,2-dibromoethane (259 μL, 3 mmol) and $K_2CO_3$ (138 mg, 0.1 mmol) were added to Isobavachalcone, LC003, (64.8 mg, 0.2 mmol) dissolved in 3 mL acetone. The reaction was kept under reflux conditions and stirred for two days. Acetone solvent was removed in vacuo. The crude product was diluted with ethyl acetate and extracted with saturated sodium chloride solution. Pure LC149 was obtained via silica gel column chromatography with elution gradient (Hexane:EtOAc (v/v), 15:1), 63.4 mg product. Yield: 59.1%.

Synthesis of LC143: LC149 (26.9 mg, 0.05 mmol) was added to a mixture of 1 mL ethylenediamine and 3 mL DMSO, and stirred at room temperature for 5 hours. The crude product was washed with aqueous $K_2CO_3$ and saturated NaCl solution. Purification was achieved with preparative HPLC to obtain 7.3 mg of LC143. Yield: 29.4%.

Synthesis of LC150: LC149 (53.8 mg, 0.1 mmol) was added to mixture of 2 mL diethylamine and 3 mL DMSO, and stirred at room temperature for 5 hours. The crude product was washed with aqueous $K_2CO_3$ and saturated NaCl solution. Purification was achieved with preparative HPLC to obtain 35.5 mg of LC150. Yield: 68%.

Synthesis of LC011: 1,4-dibromobutane (99.0 μL, 0.829 mmol) and $K_2CO_3$ (83.3 mg, 0.603 mmol) were added to isoliquiritigenin, LC008, (30.8 mg, 0.120 mmol) dissolved in 4 mL acetone. The reaction was heated at 62° C. and stirred overnight. Acetone solvent was removed in vacuo. The crude product was diluted with ethyl acetate and extracted with saturated sodium chloride solution. Pure LC011 was obtained via silica gel column chromatography with elution gradient (PE:EtOAc (v/v), 50:1), 37.7 mg. Yield: 45.1%.

Synthesis of LC107: LC011 (23.1 mg, 0.044 mmol) was added to mixture of 2 mL diethylamine and 3 mL DMSO, and stirred at room temperature for 3 hours. The crude product was washed with saturated NaCl solution. Crude sample was purified with silica gel chromatography (EtOAc/MeOH/TEA (v/v/v), 100/1/1). 20.3 mg of LC107 was obtained. Yield: 90.6%.

Synthesis of LC010: 1,4-dibromobutane (548.5 µL, 4.62 mmol) and $K_2CO_3$ (213 mg, 1.54 mmol) are added to Glabridin, LC007, (101.6 mg, 0.313 mmol) dissolved in 4 mL acetone.

The reaction was heated at 60° C. and stirred overnight. Acetone solvent was removed in vacuo. The crude product was diluted with ethyl acetate and extracted with saturated sodium chloride solution. Pure LC010 was obtained via silica gel column chromatography with elution gradient (PE:EtOAc (v/v), 30:1), 145 mg. Yield: 79.5%.

Synthesis of LC105: LC010 (69.2 mg, 0.116 mmol) was added to a mixture of 2 mL diethylamine and 3 mL DMSO, and stirred at room temperature for 3 hours. The crude product was washed with saturated NaCl solution. Crude sample was purified with silica gel chromatography (EtOAc/MeOH/TEA (v/v/v), 200/1/1). 35.5 mg of LC105 was obtained. Yield: 52.7%.

Synthesis of LC310: Orcinol (62 mg, 0.5 mmol), 5-bromopentyl trimethylammonium bromide (418 mg, 2 mmol) and $K_2CO_3$ (272 mg, 2 mmol) were dissolved in 3.5 mL DMF. The mixture was stirred at 80° C. for 24 hours. After the reaction, the mixture was dissolved in butanol and washed with saturated NaCl solution 3 times. Butanol was removed in vacuo. Purification was achieved with preparative HPLC to obtain 32 mg of LC310. Yield: 16.8%.

Synthesis of LC311: LC003 (97 mg, 0.3 mmol), 5-bromopentyl trimethylammonium bromide (289 mg, 1 mmol) and $K_2CO_3$ (272 mg, 2 mmol) were dissolved in 4 mL DMF. The mixture was stirred at 60° C. for 6 hours. After the reaction, the mixture was dissolved in butanol and washed with saturated NaCl solution 3 times. Butanol was removed in vacuo. Purification was achieved with preparative HPLC to obtain 44.2 mg of LC311. Yield: 28%.

Synthesis of LC312: LC003 (97 mg, 0.3 mmol), 3-bromopropyl trimethylammonium bromide (265 mg, 1 mmol) and $K_2CO_3$ (272 mg, 2 mmol) was dissolved in 4 mL DMF. The mixture was stirred at 60° C. for 6 hours. After the reaction, the mixture was dissolved in butanol and washed with saturated NaCl solution 3 times. Butanol was removed in vacuo. Purification was achieved with preparative HPLC to obtain 48.5 mg of LC312. Yield: 31%.

Synthesis of LC315: L0003 (97 mg, 0.3 mmol), 4-bromobutyl triethylammonium bromide (317 mg, 1 mmol) and $K_2CO_3$ (272 mg, 2 mmol) were dissolved in 4 mL DMF. The mixture was stirred at 60° C. for 6 hours. After the reaction, diethyl ether was added and the precipitate was dissolved in methanol and purified with preparative HPLC to obtain 59.1 mg of LC315. Yield: 31%.

Synthesis of LC316: L0007 (97 mg, 0.3 mmol), 5-bromopentyl trimethylammonium bromide (289 mg, 1 mmol) and $K_2CO_3$ (272 mg, 2 mmol) was dissolved in 4 mL DMF. The mixture was stirred at 60° C. for 6 hours. After the reaction, the mixture was dissolved in butanol and washed with saturated NaCl solution 3 times. Butanol was removed in vacuo. Purification was achieved with preparative HPLC to obtain 55.7 mg of LC316. Yield: 35%.

Synthesis of LC317: L0007 (97 mg, 0.3 mmol), 4-bromobutyl triethylammonium bromide (317 mg, 1 mmol) and $K_2CO_3$ (272 mg, 2 mmol) was dissolved in 4 mL DMF. The mixture was stirred at 60° C. for 6 hours. After the reaction, diethyl ether was added and the precipitate was dissolved in methanol and purified with preparative HPLC to obtain 63 mg of LC317. Yield: 33%.

Synthesis of LC350: L0003 (97 mg, 0.3 mmol), 3-(4-Bromobutyl)-1-methylimidazole bromide (298 mg, 1 mmol) and $K_2CO_3$ (272 mg, 2 mmol) were dissolved in 4 mL DMF. The mixture was stirred at 50° C. for 5 hours. After the reaction, diethyl ether was added and the precipitate was dissolved in methanol and purified with preparative HPLC to obtain 46.5 mg of LC350. Yield: 25%.

Synthesis of LC365: LC003 (97 mg, 0.3 mmol), 1-(4-Bromobutyl)pyridine bromide (295 mg, 1 mmol) and $K_2CO_3$ (272 mg, 2 mmol) were dissolved in 4 mL DMF. The mixture was stirred at 50° C. for 5 hours. After the reaction, diethyl ether was added and the precipitate was dissolved in methanol and purified with preparative HPLC to obtain 49.7 mg of LC365. Yield: 28%.

Synthesis of LC370: L0003 (97 mg, 0.3 mmol), 3-(4-Bromobutyl)-1-methylimidazole bromide (298 mg, 1 mmol) and $K_2CO_3$ (272 mg, 2 mmol) were dissolved in 4 mL DMF. The mixture was stirred at 50° C. for 5 hours. After the reaction, diethyl ether was added and the precipitate was dissolved in methanol and purified with preparative HPLC to obtain 56.1 mg of LC370. Yield: 30%.

Synthesis of LC375: L0003 (97 mg, 0.3 mmol), 1-(4-Bromobutyl)pyridine bromide (295 mg, 1 mmol) and $K_2CO_3$ (272 mg, 2 mmol) was dissolved in 4 mL DMF. The mixture was stirred at 50° C. for 5 hours. After the reaction, diethyl ether was added and the precipitate was dissolved in methanol and purified with preparative HPLC to obtain 65.1 mg of LC375. Yield: 37%.

Synthesis of L0005: Ethyl iodoacetate (25.3 µL, 0.213 mmol) and $K_2CO_3$ (82.9 mg, 0.60 mmol) are added to L0003 (31.6 mg, 0.097 mmol) in 3 mL of acetone. The reaction was processed similar to the synthesis of L0004. Pure acetate analog was obtained via silica gel chromatography with elution gradient (Hexane:EtOAc (v/v), 12.5:1), 42.8 mg. Yield: 88.5%.

Synthesis of LC101: L0005 (69.1 mg, 0.139 mmol) in 2 mL THF was added to LiOH (31.6 mg, 1.32 mmol) dissolved in 1 mL water. The solution was stirred for 2 hours at room temperature and left to cool down to room temperature. Acetic acid was added to the mixture and stirred for 5 minutes. After dilution with butanol, the solution was washed with saturated NaCl solution and dried over $Na_2SO_4$ overnight. Solvent was removed in vacuo and the product was used for subsequent reaction without further purification. HOBt (55.0 mg, 0.360 mmol) and ArgOMe (94.4 mg, 0.361 mmol) were introduced to the prior dried product dissolved in DMF. DIC (106 µL, 0.696 mmol) was subsequently added. The mixture was mixed at room temperature overnight. Pre-injection sample preparation was performed using diethyl ether precipitation. Purification was achieved with preparative HPLC to obtain 18.3 mg of LC101. Yield: 16.8%.

Synthesis of LC127: LC012 (24.8 mg, 0.05 mmol) in 2 mL THF was added to LIOH (31.6 mg, 1.32 mmol) dissolved in 1 mL water. The solution was stirred for 2 hours at room temperature and left to cool down to room temperature. Solvent was removed in vacuo and product was used for subsequent reaction without further purification. HOBt (35.0 mg, 0.23 mmol) and argininamide dihydrochloride (61.5 mg, 0.25 mmol) were introduced to the prior dried product dissolved in DMF. DIC (130 µL, 0.85 mmol) and N,N-diisopropylethylamine (71.8 µL, 0.51 mmol) was subsequently added. The mixture was mixed at room temperature overnight. Pre-injection sample preparation was performed using diethyl ether precipitation. Purification was achieved with preparative HPLC to obtain 17.4 mg of LC127. Yield: 42%.

Synthesis of LC131: LC005 (24.8 mg, 0.05 mmol) in 2 mL THF was added to LIOH (31.6 mg, 1.32 mmol) dissolved in 1 mL water. The solution was stirred for 2 hours at room temperature and left to cool down to room temperature. Solvent was removed in vacuo and product was used for subsequent reaction without further purification. HOBt (35.0 mg, 0.23 mmol) and argininamide dihydrochloride (61.5 mg, 0.25 mmol) were introduced to the prior dried product dissolved in DMF. DIC (130 µL, 0.85 mmol) and N,N-diisopropylethylamine (71.8 µL, 0.51 mmol) was subsequently added. The mixture was mixed at room temperature overnight. Pre-injection sample preparation was performed using diethyl ether precipitation. Purification was achieved with Preparative HPLC to obtain 13.3 mg of LC131. Yield: 32%.

Synthesis of LC137: LC005 (42.6 mg, 0.086 mmol) in 2 mL THF was added to LiOH (31.6 mg, 1.32 mmol) dissolved in 1 mL water. The solution was stirred for 2 hours at room temperature and left to cool down to room temperature. Solvent was removed in vacuo and product was used for subsequent reaction without further purification. HOBt (63.0 mg, 0.410 mmol) and ArgOEt(118 mg, 0.43 mmol) were introduced to the prior dried product dissolved in DMF. DIC (130 µL, 0.85 mmol) and N,N-diisopropylethylamine (156.8 µL, 0.9 mmol) was subsequently added. The mixture was mixed at room temperature overnight. Pre-injection sample preparation was performed using diethyl ether precipitation. Purification was achieved with preparative HPLC to obtain 46.3 mg of LC137. Yield: 60.8%.

Synthesis of LC106: LC012 (107.7 mg, 0.217 mmol) in 2 ml THF is added to LiOH (43.6 mg, 1.820 mmol) dissolved in 1 mL water. The solution was stirred for 2 hours at room temperature and left to cool down to room temperature. Acetic acid was added to mixture and stirred for 5 minutes. After dilution with butanol, the solution was washed with saturated NaCl solution and dried over $Na_2SO_4$ overnight. Solvent was removed in vacuo and product was used for subsequent reaction without further purification.

HOBt (85.4 mg, 0.558 mmol) and ArgOMe (153.8 mg, 0.589 mmol) were introduced to the prior dried product dissolved in DMF. DIC (164 µL, 1.089 mmol) was subsequently added. The mixture was mixed at room temperature overnight. Pre-injection sample preparation was performed using diethyl ether precipitation. Purification was achieved with preparative HPLC to obtain 34.9 mg of LC106. Yield: 20.6%.

Synthesis of LC012: Ethyl iodoacetate (175 µL, 1.48 mmol) and $K_2CO_3$ (208.9 mg, 1.51 mmol) were added to LC007 (95.8 mg, 0.295 mmol) in 4 mL of acetone. The reaction was processed similarly to the synthesis of LC010. Pure acetate analog, LC012, is obtained via silica gel chromatography with elution gradient (Hexane:EtOAc (v/v), 20:1), 107.7 mg. Yield: 73.5%.

Synthesis of LC140: LC149 (53.8 mg, 0.1 mmol) was added to mixture of 2 mL N,N,N-trimethyl-1,3-propanediamine and 3 mL DMSO, and stirred at room temperature for 3 hours. The crude product was washed with aqueous $K_2CO_3$ and saturated NaCl solution. Purification was achieved with preparative HPLC to obtain 22.5 mg of LC140. Yield: 37%.

Synthesis of LC148: 1,3-dibromopropane (305 µL, 3 mmol) and $K_2CO_3$ (138 mg, 0.1 mmol) were added to Isobavachalcone, LC003, (64.8 mg, 0.2 mmol) dissolved in 3 mL acetone. The reaction was kept under reflux conditions and stirred for two days. Acetone solvent was removed in vacuo. The crude product was diluted with ethyl acetate and extracted with saturated sodium chloride solution. Pure LC148 was obtained via silica gel column chromatography with elution gradient (Hexane:EtOAc (v/v), 20:1), 58.1 mg product. Yield: 52%.

Synthesis of LC204: LC148 (56.6 mg, 0.1 mmol) was added to a mixture of 2 mL diethylamine and 3 mL DMSO, and stirred at room temperature for 5 hours. The crude product was washed with aqueous $K_2CO_3$ and saturated NaCl solution. Purification was achieved with preparative HPLC to obtain 34.6 mg of LC204. Yield: 63.1%.

Synthesis of LC206: LC148 (56.6 mg, 0.1 mmol) in 3 mL DMF was added cyclen (86 mg, 0.5 mmol). The reaction mixture was stirred at room temperature for 5 hours. The crude product was dissolved in butanol and subsequently washed with aqueous $K_2CO_3$ and saturated NaCl solution 3 times and dried in vacuo. Purification was achieved with preparative HPLC to obtain 26.2 mg of LC206 as a yellow gel. Yield: 35%.

Synthesis of LC013: Ethyl iodoacetate (341.4 µL, 2.88 mmol) and $K_2CO_3$ (252.3 mg, 1.83 mmol) were added to LC008 (92.4 mg, 0.361 mmol) in 4 ml of acetone. The reaction was processed similarly to the synthesis of LC011. A pure acetate analog, LC013, was obtained via silica gel chromatography with elution gradient (Hex:EtOAc (v/v), 10:1), 112.7 mg. Yield: 73.1%.

Synthesis of LC108: LC013(27 mg, 0.063 mmol) in 2 mL THF was added to LiOH (14.5 mg, 0.605 mmol) dissolved in 1 mL water. The solution was stirred for 2 hours at room temperature and left to cool down to room temperature. Acetic acid was added to the mixture and stirred for 5 minutes. After dilution with butanol, the solution was washed with saturated NaCl solution and dried over $Na_2SO_4$ overnight. Solvent was removed in vacuo and the product was used for subsequent reaction without further purification. HOBt (24.2 mg, 0.158 mmol) and ArgOMe (42.7 mg, 0.164 mmol) were introduced to the prior dried product dissolved in DMF. DIC (48 µL, 0.315 mmol) was subsequently added. The mixture was mixed at room temperature overnight. Pre-injection sample preparation was performed using diethyl ether precipitation. Purification was achieved with preparative HPLC to obtain 8.4 mg of LC108. Yield: 18.7%.

Example 8: Biological Results

In Vitro

Figure 4:
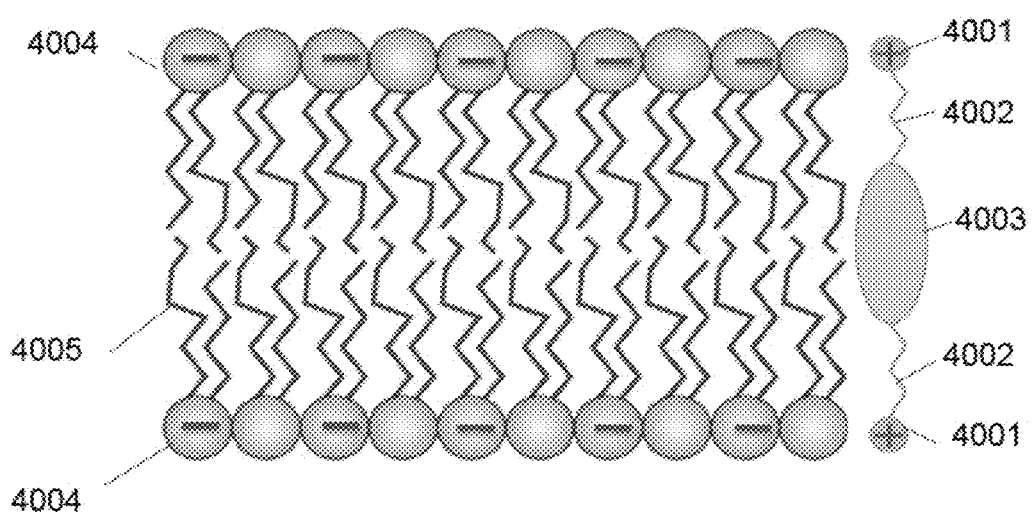
FIG. 4 refers to a schematic diagram showing how the components of the inventive antibiotic would interact with the lipid bilayer of the bacteria membrane. The N-containing group (4001) is linked to the hydrophobic scaffold (4003) via a linker (4002). The N-containing group (4001) interacts with the head groups (4004) of the lipid, while the hydrophobic scaffold (4003) interacts with the lipid tails (4005).
Figure 5:
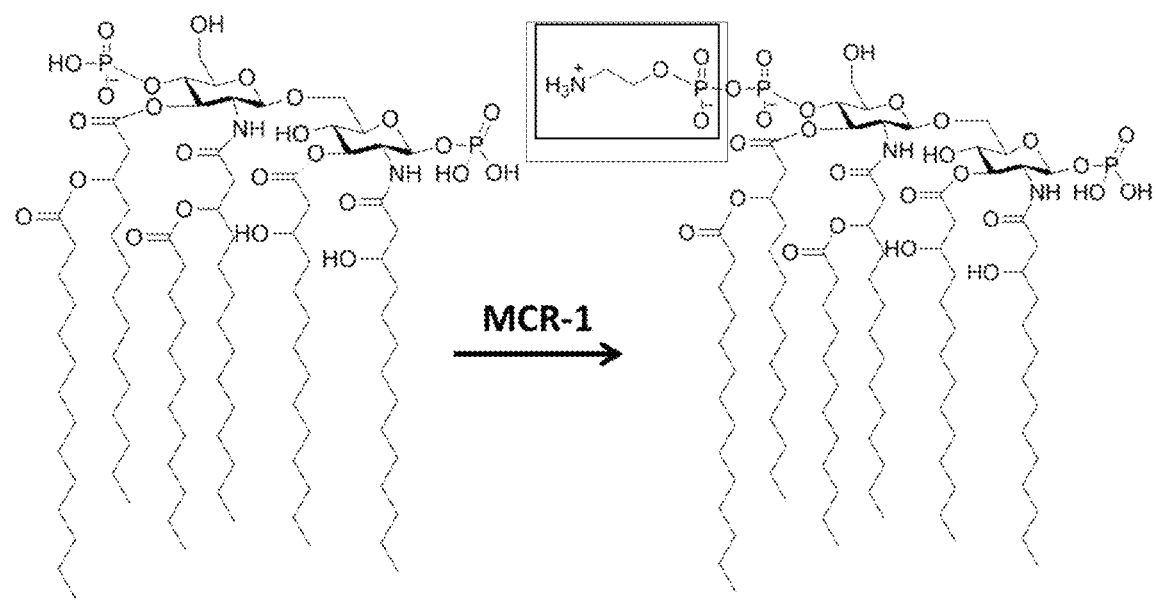
FIG. 5 refers to a schematic diagram showing the chemical modification of the lipid A in MCR strains. Lipid A is modified by MCR-1 through the transfer of a phosphoethanolamine (PPEA) group, resulting in the formation of hydrogen bonds between neighboring segments of Lipid A, and leading to the formation of PPEA-4'-Lipid A or PPEA-1'-Lipid A.
Figure 6:
FIG. 6 is an image showing the structure of the MCR-1 protein constructed from homology modelling. The structures of the extra-cellular domains are highly conserved and contains a zinc atom in the active site.
Figure 8:
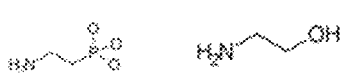
FIG. 8 refers to representative structures of fragments of type 1-16.
Figure 8:
Figure 8:
Figure 8:
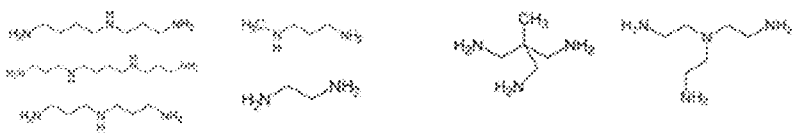
Figure 8:
Figure 9:
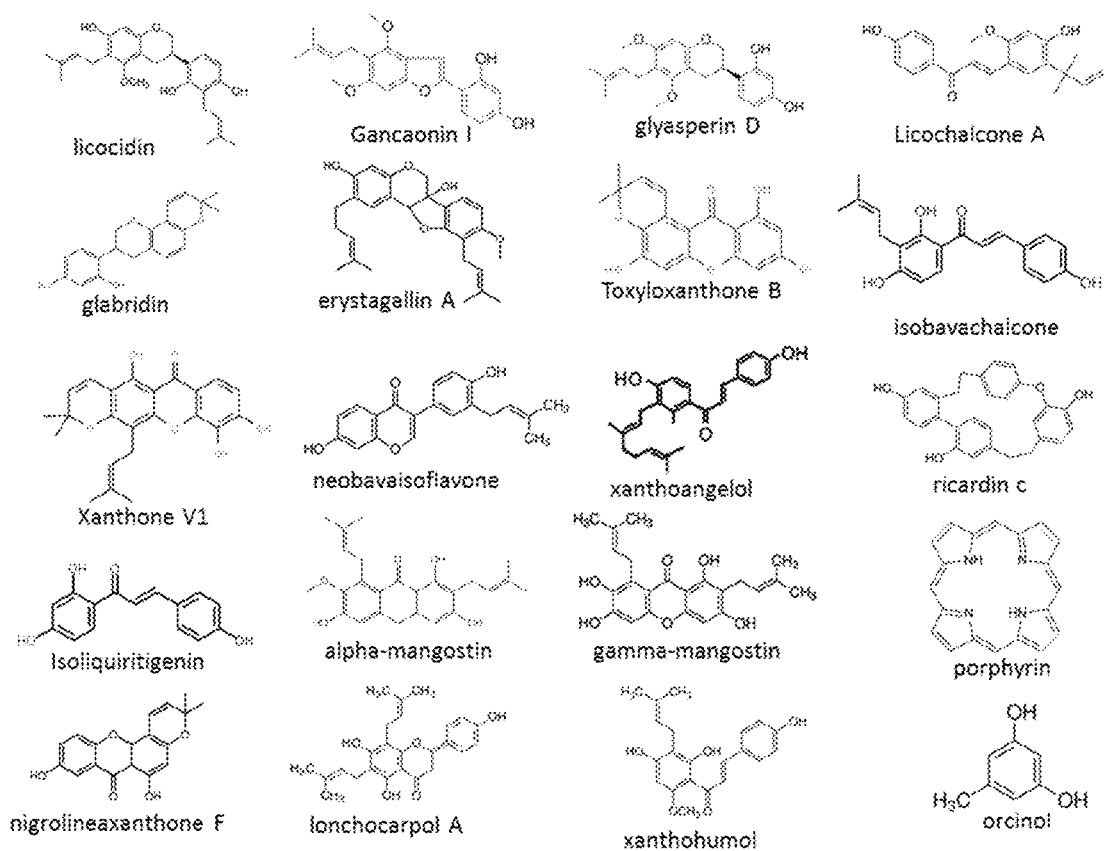
FIG. 9 refers to structure of hydrophobic scaffolds.

In Gram negative bacteria, both the outer and inner membranes are lipid bilayers. Each bilayer consists of one hydrophobic region of lipid tails and two head group regions facing the aqueous solution, forming a sandwich structure. To perturb the bacterial outer membrane and the inner membranes, a number of bola-amphiphilic compounds were synthesized consisting of two cationic terminal groups and one hydrophobic scaffold, which can interact with the two anionic head group regions and the lipid tail region, respectively (FIG. 4). The hydrophobic scaffolds were chosen from a series of natural products (FIG. 9). A number of cationic groups such as DPA-Zn, polyamine, tertiary amines, quaternary amines, guanidine and basic amine acids was chosen (FIG. 8). As a result, a library of compounds were synthesized by assembling the hydrophobic cores and the cationic groups.

The antimicrobial activity and the synergistic effect of a number of compounds were tested against a panel of colistin resistant strains, including 7 mcr-1 (+) and 4 mcr-1 (−) strains. Tables 1a-1e shows the Minimum Inhibitory Concentration (MIC) of the synthesized compounds. Colistin displays a MIC or 6.25 µg/ml; however, the breakpoint for colistin is 2-4 µg/ml due to its toxicity which shows that the strains of E. coli carrying mcr-1 are resistant to colistin. It also shows that the strains of E. coli that are mcr-1 negative are also resistant.

TABLE 1a

MIC of DPA-Zn compounds (µg/ml) against a panel of colistin resistant strains.

| | Colistin | Orc DPA-Zn | LC008 DPA-Zn | LC003 DPA-Zn | GLA DPA-Zn | LC104 | EDTA |
|---|---|---|---|---|---|---|---|
| MCR (+) | | | | | | | |
| 6083655967* | 6.25 | 50 | >50 | >50 | 12.5 | 50 | >250 |
| 7023444207* | 6.25 | 50 | 50 | >50 | 12.5 | 50 | >250 |
| 6123520276* | 6.25 | 50 | 50 | >50 | 12.5 | 50 | >250 |
| 6075066346* | 6.25 | 50 | 50 | >50 | 12.5 | 50 | >250 |
| 6103645107* | 6.25 | >50 | >50 | >50 | 12.5 | 50 | >250 |
| 7023436560* | 6.25 | 50 | 50 | >50 | 12.5 | 50 | >250 |
| 7013177695* | 6.25 | 50 | >50 | >50 | 12.5 | 50 | >250 |
| MCR (−) | | | | | | | |
| 7023446108* | 6.25 | 50 | 50 | >50 | 12.5 | 50 | >250 |
| 7033607097* | 6.25 | 50 | 50 | >50 | 12.5 | 50 | >250 |
| 6083672926* | 12.5 | 50 | 50 | >50 | 25 | 50 | >250 |
| 7023456439** | 100 | >50 | >50 | >50 | 50 | 50 | >250 |

*E. Coli*
**E. Cloacae*

TABLE 1b

MIC (µg/ml) of amine compounds against a panel of colistin resistant strains.

| | LC100 | LC107 | LC105 | LC014 | LC300 | LC301 | LC302 | LC304 | LC311 | LC310 |
|---|---|---|---|---|---|---|---|---|---|---|
| MCR (+) | | | | | | | | | | |
| 6083655967* | 100 | >100 | 25 | 6.25 | 50 | 6.25 | 12.5 | >50 | 3.125 | >50 |
| 7028444207* | 100 | >100 | 25 | 6.25 | 50 | 6.25 | 12.5 | >50 | 3.125 | >50 |
| 6123520276* | 100 | >100 | 25 | 6.25 | 50 | 6.25 | 25 | >50 | 6.25 | >50 |
| 6075066346* | 100 | >100 | 25 | 6.25 | 50 | 6.25 | 12.5 | >50 | 3.125 | >50 |
| 6103645107* | 100 | >100 | 25 | 6.25 | >50 | 12.5 | 25 | >50 | 3.125 | >50 |
| 7023436560* | 100 | >100 | 25 | 6.25 | >50 | 6.25 | 12.5 | >50 | 3.125 | >50 |
| 7013177695* | 100 | >100 | 25 | 6.25 | >50 | 6.25 | 12.5 | >50 | 6.25 | >50 |
| MCR (−) | | | | | | | | | | |
| 7023446108* | — | — | — | 12.5 | 50 | 12.5 | 25 | >50 | 3.125 | >50 |
| 7033607097* | — | — | — | 12.5 | 50 | 12.5 | 25 | >50 | 6.25 | >50 |
| 6083672926* | — | — | — | 12.5 | >50 | 12.5 | 25 | >50 | 3.125 | >50 |
| 7023456439** | — | — | — | >50 | >50 | >50 | >50 | >50 | 6.25 | >50 |

*E. Coli*
**E. Cloacae*

TABLE 1c

MIC (µg/ml) of amine compounds against a panel of colistin resistant strains.

| | LC095 | LC096 | LC097 | LC098 | LC312 | LC315 | LC316 | LC317 |
|---|---|---|---|---|---|---|---|---|
| MCR (+) | | | | | | | | |
| 6083655967* | 50 | 25 | 25 | 6.25 | 12.5 | 6.25 | 50 | 50 |
| 7023444207* | 25 | 25 | 25 | 6.25 | 12.5 | 12.5 | 50 | 50 |
| 6123520276* | 50 | 25 | 25 | 6.25 | 12.5 | 12.5 | 50 | >50 |
| 6075066346* | 50 | 25 | 25 | 6.25 | 12.5 | 6.25 | 50 | 50 |
| 6103645107* | 25 | 12.5 | 12.5 | 6.25 | 12.5 | 6.25 | 50 | 50 |
| 7023436560* | 25 | 25 | 12.5 | 6.25 | 6.25 | 6.25 | 50 | 50 |
| 7013177695* | 25 | 25 | 12.5 | 6.25 | 12.5 | 12.5 | 50 | 50 |
| MCR (−) | | | | | | | | |
| 7023446108* | 25 | 25 | 12.5 | 6.25 | 6.25 | 12.5 | 50 | 50 |
| 7033607097* | 25 | 12.5 | 12.5 | 6.25 | 12.5 | 12.5 | >50 | >50 |
| 6083672926* | 25 | 12.5 | 25 | 12.5 | 12.5 | 25 | >50 | >50 |
| 7023456439** | >50 | >25 | >25 | >25 | >50 | >50 | >50 | >50 |

*E. Coli*
**E. Cloacae*

TABLE 1d

MIC (µg/ml) of amine compounds against a panel of colistin resistant strains.

|  | LC350 | LC365 | LC370 | LC375 | LC101 | LC106 | LC127 | LC131 |
|---|---|---|---|---|---|---|---|---|
| MCR (+) | | | | | | | | |
| 6083655967* | 3.125 | 3.125 | 50 | 25 | 25 | >25 | >50 | >50 |
| 7023444207* | 3.125 | 3.125 | 50 | 25 | 25 | >25 | >50 | >50 |
| 6123520276* | 3.125 | 3.125 | 50 | 25 | 50 | >25 | >50 | >50 |
| 6075066346* | 3.125 | 3.125 | 50 | 25 | 25 | >25 | >50 | >50 |
| 6103645107* | 3.125 | 3.125 | 50 | 25 | 25 | >25 | >50 | >50 |
| 7023436560* | 3.125 | 3.125 | 50 | 25 | 25 | >25 | >50 | >50 |
| 7013177695* | 3.125 | 3.125 | 50 | 25 | 25 | >25 | >50 | >50 |
| MCR (−) | | | | | | | | |
| 7023446108* | 3.125 | 3.125 | 25 | 25 | 25 | >25 | >50 | >50 |
| 7033607097* | 3.125 | 3.125 | 25 | 25 | 50 | >25 | >50 | >50 |
| 6083672926* | 3.125 | 3.125 | 25 | 25 | 25 | >25 | >50 | >50 |
| 7023456439** | >50 | >50 | >50 | >50 | >50 | >25 | >50 | >50 |

*E. Coli
**E. Cloacae

TABLE 1e

MIC (µg/ml) of LC137, LC140, LC143, LC150, LC204 and LC206 against a panel of colistin resistant strains.

|  | LC 137 | LC140 | LC143 | LC150 | LC204 | LC206 |
|---|---|---|---|---|---|---|
| MCR (+) | | | | | | |
| 6083655967 | 12.5 | 12.5 | 6.25 | >50 | >50 | >50 |
| 6075066346 | 12.5 | 12.5 | 6.25 | >50 | >50 | >50 |
| 7103531927 | 12.5 | 25 | 12.5 | >50 | >50 | >50 |
| MCR (−) | | | | | | |
| 7023446108 | 12.5 | 12.5 | 6.25 | 50 | >50 | >50 |
| 7033607097 | 12.5 | 6.25 | 6.25 | 50 | >50 | >50 |
| 6083672926 | 12.5 | 12.5 | 12.5 | 50 | >50 | >50 |

Additionally, the other strains of *E. coli* are also resistant to colistin but without mcr-1 mutation, known as mcr-1(−), due to some other mechanisms that are susceptible to the combination of colistin. Most of the inventive compounds either showed antimicrobial activity against these mcr(−) resistant strains or worked synergistically in combination with colistin (Table 2a-2e). This indicates similar working mechanism of the inventive combination against both mcr-1(−) and mcr-1(+) bacteria.

TABLE 2a

Colistin MIC (µg/ml) in the presence of DPA-Zn compounds against a panel of colistin resistant strains.

| | Colistin MIC in the presence of DPA-Zn compounds | | | | | | |
|---|---|---|---|---|---|---|---|
| | Orc-DPA-Zn (50 ug/ml) | LC008 DPA-Zn (50 ug/ml) | LC003 DPA-Zn (50 ug/ml) | GLA DPA-Zn (5 ug/ml) | GLA-DPA-Zn (10 ug/ml) | LC104 (10 ug/ml) | EDTA (250 ug/ml) |
| MCR(+) | | | | | | | |
| 6083655967* | <0.195 | 6.25 | 1.56 | 1.56 | <0.39 | 1.56 | 0.78 |
| 7023444207* | <0.195 | 6.25 | 1.56 | 0.78 | <0.39 | 1.56 | 0.195 |
| 6123520276* | <0.195 | 6.25 | 3.125 | 1.56 | <0.39 | 3.125 | 0.78 |
| 6075066346* | <0.195 | 6.25 | 1.56 | 1.56 | <0.39 | 1.56 | 0.195 |
| 6103645107* | <0.195 | 6.25 | 1.56 | 1.56 | <0.39 | 1.56 | 0.39 |
| 7023436560* | <0.195 | 6.25 | 3.125 | 1.56 | <0.39 | 3.125 | 0.39 |
| 7013177695* | <0.195 | 6.25 | 1.56 | 1.56 | <0.39 | 3.125 | 0.78 |
| MCR (−) | | | | | | | |
| 7023446108* | <0.195 | 6.25 | 3.125 | 6.25 | <0.39 | 3.125 | 0.39 |
| 7033607097* | <0.195 | 6.25 | 3.125 | 3.125 | <0.39 | 3.125 | 0.195 |
| 6083672926* | <0.195 | 6.25 | 12.5 | 12.5 | <0.39 | 12.5 | 0.78 |
| 7023456439** | <0.195 | 6.25 | 3.125 | 12.5 | <0.39 | 3.125 | 3.125 |

*E. Coli
**E. Cloacae

TABLE 2b

Colistin MIC (μg/ml) in the presence of amine analogues against a panel of colistin resistant strains.

| | Colistin MIC (ug/ml) in the presence of amine analogues | | | | | | | | | | | | |
|---|---|---|---|---|---|---|---|---|---|---|---|---|---|
| | LC100 | LC107 | LC105 | LC014 | LC310 | LC311 | LC300 | LC301 | | LC302 | | LC304 | |
| | 10 μg | 10 μg | 12.5 μg | 3.125 μg | 10 μg | 2 μg | 10 ug | 3.125 μg | 6.25 μg | 3.125 μg | 6.25 μg | 5 μg | 10 μg |
| MCR(+) strains | | | | | | | | | | | | | |
| 6083655967* | <0.098 | 3.125 | 0.78 | 0.39 | 6.25 | 0.39 | 3.125 | 3.125 | 1.56 | 3.125 | 3.125 | 3.125 | 1.56 |
| 7023444207* | <0.098 | 6.25 | 0.78 | 0.195 | 6.25 | 0.39 | 3.125 | 3.125 | 1.56 | 3.125 | 1.56 | 3.125 | 1.56 |
| 6123520276* | <0.098 | 3.125 | 1.56 | 0.78 | 6.25 | 0.39 | 3.125 | 3.125 | 1.56 | 3.125 | 3.125 | 3.125 | 3.125 |
| 6075066346* | <0.098 | 3.125 | 1.56 | 0.195 | 6.25 | 0.78 | 3.125 | 3.125 | 1.56 | 3.125 | 1.56 | 3.125 | 3.125 |
| 6103645107* | <0.098 | 3.125 | 1.56 | 0.195 | 6.25 | 0.39 | 3.125 | 3.125 | 1.56 | 3.125 | 1.56 | 3.125 | 3.125 |
| 7023436560* | <0.098 | 6.25 | 1.56 | 0.195 | 6.25 | 0.39 | 3.125 | 3.125 | 1.56 | 3.125 | 3.125 | 3.125 | 3.125 |
| 7013177695* | <0.098 | 3.125 | 0.78 | 0.39 | 6.25 | 0.78 | 3.125 | 3.125 | 1.56 | 3.125 | 1.56 | 3.125 | 3.125 |
| MCR(−) strains | | | | | | | | | | | | | |
| 7023446108* | <0.098 | — | — | 0.39 | 6.25 | 0.78 | 3.125 | 3.125 | 3.125 | 3.125 | 3.125 | 3.125 | 3.125 |
| 7033607097* | <0.098 | — | — | 0.195 | 6.25 | 0.195 | 3.125 | 3.125 | 3.125 | 3.125 | 1.56 | 3.125 | 3.125 |
| 6083672926* | <0.098 | — | — | 0.195 | 6.25 | 0.39 | >12.5 | 12.5 | 6.25 | 12.5 | 12.5 | 12.5 | 12.5 |
| 7023456439** | <0.098 | — | — | >12.5 | 6.25 | >12.5 | >12.5 | >12.5 | >12.5 | >12.5 | >12.5 | >12.5 | >12.5 |

*E. Coli
**E. Cloacae

TABLE 2c

Colistin MIC (μg/ml) in the presence of amine analogues against a panel of colistin resistant strains.

| | Colistin MIC (ug/ml) in the presence of amine analogues | | | | | | | |
|---|---|---|---|---|---|---|---|---|
| | LC095 | LC096 | LC097 | LC098 | LC312 | LC315 | LC316 | LC317 |
| | 10 μg | 5 μg | 5 μg | 5 μg | 10 ug | 5ug | 5 ug | 10 ug |
| MCR(+) strains | | | | | | | | |
| 6083655967* | 3.125 | <0.195 | 0.195 | 0.195 | <0.0975 | <0.0975 | 1.56 | 1.56 |
| 7023444207* | 1.56 | <0.195 | 0.195 | 0.195 | <0.0975 | <0.0975 | 1.56 | 1.56 |
| 6123520276* | 1.56 | <0.195 | 0.195 | 0.195 | <0.0975 | <0.0975 | 1.56 | 1.56 |
| 6075066346* | 3.125 | <0.195 | 0.195 | 0.195 | <0.0975 | <0.0975 | 1.55 | 1.56 |
| 6103645107* | 3.125 | <0.195 | 0.195 | 0.195 | <0.0975 | <0.0975 | 1.56 | 1.56 |
| 7023436560* | 3.125 | <0.195 | 0.195 | 0.195 | <0.0975 | <0.0975 | 1.56 | 1.56 |
| 7013177695* | 3.125 | <0.195 | 0.195 | 0.195 | <0.0975 | <0.0975 | 1.56 | 1.56 |
| MCR(−) strains | | | | | | | | |
| 7023446108* | 3.125 | <0.195 | 0.195 | 0.195 | <0.0975 | <0.0975 | 1.56 | 1.56 |
| 7033607097* | 3.125 | <0.195 | 0.195 | 0.195 | <0.0975 | <0.0975 | 1.56 | 1.56 |
| 6083672926* | 12.5 | <0.195 | 0.195 | 0.195 | <0.0975 | <0.0975 | 6.25 | 1.56 |
| 7023456439** | >12.5 | >25 | >12.5 | 25 | >12.5 | >12.5 | >12.5 | >12.5 |

*E. Coli
**E. Cloacae

TABLE 2d

Colistin MIC (μg/ml) in the presence of amine analogues against a panel of colistin resistant strains.

| | Colistin MIC (ug/ml) in the presence of amine analogues | | | | | | | |
|---|---|---|---|---|---|---|---|---|
| | LC350 | LC365 | LC370 | LC375 | LC101 | LC106 | LC127 | LC131 |
| | 2 μg | 2 μg | 10 μg | 5 μg | 10 ug | 10 ug | 10 ug | 10 ug |
| MCR(+) strains | | | | | | | | |
| 6083655967* | 0.195 | 0.39 | 0.39 | 0.78 | <0.195 | 6.25 | 6.25 | 6.25 |
| 7023444207* | 0.195 | 0.39 | 0.195 | 0.78 | <0.195 | 6.25 | 6.25 | 6.25 |
| 6123520276* | 0.195 | 0.39 | 0.195 | 0.78 | <0.195 | 6.25 | 6.25 | 6.25 |
| 6075066346* | 0.195 | 0.195 | 0.195 | 0.78 | <0.195 | 6.25 | 6.25 | 6.25 |
| 6103645107* | 0.195 | 0.39 | 0.195 | 0.78 | <0.195 | 6.25 | 6.25 | 6.25 |

TABLE 2d-continued

Colistin MIC (µg/ml) in the presence of amine analogues against a panel of colistin resistant strains.

| | Colistin MIC (ug/ml) in the presence of amine analogues | | | | | | | |
|---|---|---|---|---|---|---|---|---|
| | LC350 2 µg | LC365 2 µg | LC370 10 µg | LC375 5 µg | LC101 10 ug | LC106 10 ug | LC127 10 ug | LC131 10 ug |
| 7023436560* | 0.195 | 0.195 | 0.195 | 0.78 | <0.195 | 6.25 | 6.25 | 6.25 |
| 7013177695* | 0.195 | 0.195 | 0.195 | 0.78 | <0.195 | 6.25 | 6.25 | 6.25 |
| MCR(−) strains | | | | | | | | |
| 7023446108* | 0.195 | 0.195 | 0.195 | 0.78 | <0.195 | 6.25 | 6.25 | 6.25 |
| 7033607097* | 0.195 | 0.195 | 0.195 | 0.78 | <0.195 | 6.25 | 6.25 | 6.25 |
| 6083672926* | 0.195 | 0.195 | >12.5 | 0.78 | <0.195 | 12.5 | 12.5 | 12.5 |
| 7023456439** | >12.5 | >12.5 | >12.5 | >12.5 | >12.5 | >25 | >12.5 | >12.5 |

*E. Coli
**E. Cloacae

TABLE 2e

Colistin MIC (µg/ml) in the presence of LC137, LC140, LC143, LC150, LC204, LC206 against a panel of colistin resistant strains.

| | Colistin MIC (ug/ml) in the presence of amine analogues | | | | | | |
|---|---|---|---|---|---|---|---|
| | LC137 3 µg | LC137 4 µg | LC140 5 µg | LC143 2 µg | LC143 5 µg | LC150 5 µg | LC 204 5 µg | LC206 5 µg |
| MCR(+) strains | | | | | | | | |
| 6083655967 | 0.78 | <0.0975 | ≤0.0975 | 1.56 | ≤0.0975 | 0.195 | 0.39 | 0.39 |
| 6075066346 | 0.195 | <0.0975 | ≤0.0975 | 1.56 | ≤0.0975 | 0.39 | 0.39 | 0.39 |
| 7103531927 | 0.39 | <0.0975 | ≤0.0975 | 1.56 | ≤0.0975 | 0.39 | 0.39 | 0.39 |
| MCR(−) strains | | | | | | | | |
| 7023446108 | 0.39 | <0.0975 | ≤0.0975 | 1.56 | ≤0.0975 | 0.39 | 0.39 | 0.39 |
| 7033607097 | 0.195 | <0.0975 | ≤0.0975 | 1.56 | ≤0.0975 | 0.195 | 0.39 | 0.39 |
| 6083672926 | 6.25 | 0.195 | ≤0.0975 | 1.56 | ≤0.0975 | 0.195 | 0.39 | 0.39 |

Four classes of compounds were developed. The first class of compounds are DPA derivatives, in which two DPA-Zn moieties were connected to the selected hydrophobic scaffold via two linker groups. The MIC and synergy activity are shown in Table 1a and Table 2a. The first proof-of-concept compound is Orc-DPA, which at 50 µg/ml, shows synergy with colistin against mcr-1 bacteria. In contrast, the EDTA only works at a concentration higher than 250 µg/ml. The hydrophobic scaffold was then optimized and a number of DPA derivatives were synthesized. One compound GLA-DPA synergized with colistin at 5 µg/ml.

The second class of compounds are amine and polyamine derivatives. Using different amine or polyamine groups, a series analogues, such as LC100, LC098, LC097, LC096, LC095, LC300, LC301, LC302, LC304, LC140, LC204, LC206, LC100, LC107, LC143, LC014, LC105 were developed. Most of these compounds showed synergy with colistin against mcr-1 bacteria, and the results are summarized in Tables, 1b-1e and 2b-2e. One of the compounds, LC100 displayed no activity when used alone, but showed excellent synergy with colistin at 2 µg/ml. LC100 has been chosen as a lead compound in the in vivo and biophysical studies discussed in further detail below.

The third class of compounds are quaternary amine analogues, which include LC311, LC312, LC315, LC316, LC317, LC350, LC365, LC370 and LC375. The corresponding MIC and synergy data are shown in Tables 1b-1d and Tables 2b-2d. Compared to the amine and polyamine analogues, quaternary amine analogues not only synergize with colistin, but they also display antimicrobial activity when used alone.

The fourth class of compounds are guanidine analogues, including LC101, LC137, LC131, LC106, LC127, LC108. Two compounds LC101, LC137 which were developed using iso bavachalcone (LC003) as the hydrophobic core displayed excellent synergy with colistin. Moreover, LC101 and LC137 also show intermediate antimicrobial activity when used alone (MIC ranges from 12.5-25 ug/ml).

Example 9: LC100

To further test the antimicrobial activity and synergistic activity of the inventive compounds with colistin, LC100 was chosen as the model compound for further testing the antimicrobial spectrum as well as for understanding the mechanism of action, since LC100 has no activity alone, but displays excellent synergistic activity with colistin. The synergy was first tested using different concentrations of L100. Table 3 shows that as the concentration of LC100 increases, the synergy effect becomes stronger. LC100 greater than 5 µg/ml can bring colistin MIC down to as low as 0.0975 µg/ml, and at this concentration, colistin is much less toxic. Next, whether LC100 synergizes with polymyxin B (PMB), a peptide that functions in a similar manner to colistin but has one residue difference to colistin, was examined. The data in Table 4 shows that the combination works equally well for polymyxin B. Table 5 extends the action of this combination to three multi-drug resistant forms of Gram negative bacteria: *Acinetobacter baumannii* (ACBA), *Klebsiella pneumonia* (KLPN) and *E. clocacae*. It should be noted that the strain of KLPN is a carbapenem-resistant Enterobacteriaceae (CRE) by genetic analysis. The results show the combination is effective against these carbapenem-resistant and multi-drug resistant strains.

It should also be noted that the combination is effective at killing a large number of bacteria without having to change the drug concentration depending on the bacteria species. The only other way this may be achieved is by using a disinfectant such as an alcohol, but disinfectants are known to be toxic.

TABLE 3

Colistin MIC (µg/ml) in the presence of different concentrations of LC100 against a panel of colistin resistant strains

| | Colistin MIC (ug/ml) in the presence LC100 | | | |
|---|---|---|---|---|
| | LC 100 2 µg | 3 µg | LC 100 5 µg | LC 100 10 µg |
| MCR(+) strains | | | | |
| 6083655967* | 1.56 | 0.39 | 0.195 | <0.0975 |
| 7023444207* | 1.56 | 0.39 | 0.195 | <0.0975 |
| 6123520276* | 1.56 | 0.78 | 0.195 | <0.0975 |
| 6075066346* | 1.56 | 0.78 | 0.195 | <0.0975 |
| 6103645107* | 1.56 | 0.78 | 0.195 | <0.0975 |
| 7023436560* | 1.56 | 0.39 | 0.195 | <0.0975 |
| 7013177695* | 1.56 | 0.39 | 0.195 | <0.0975 |
| MCR(−) strains | | | | |
| 7023446108* | <0.0975 | — | 0.195 | <0.0975 |
| 7033607097* | <0.0975 | — | 0.195 | <0.0975 |
| 6083672926* | <0.0975 | — | 0.195 | <0.0975 |
| 7023456439** | <0.0975 | — | 0.195 | <0.0975 |

*E. Coli
**E. Cloacae

TABLE 4

Synergy of LC100 and colistin against colistin sensitive strains.

| CRE strains | Polymyxin B | Polymyxin B + LC 100 (3 µg) | Colistin | Colistin + LC 100 (3 µg) |
|---|---|---|---|---|
| PAE 4877 | 1.56 | 0.39 | 1.56 | 0.39 |
| PAE 5790 | 1.56 | 0.39 | 1.56 | 0.39 |
| PAE 14476 | 1.56 | 0.39 | 1.56 | 0.39 |
| EC 19963 | 1.56 | <0.195 | 1.56 | <0.195 |
| EC 17232 | 0.195 | <0.195 | 0.195 | <0.195 |
| EC 17528 | 0.78 | <0.195 | 0.78 | <0.195 |

TABLE 5

Synergy of LC100 with colistin against multi-drug resistant strains.

| | MIC (ug/ml) | | | | Colistin MIC in the presence of LC100 | |
|---|---|---|---|---|---|---|
| | Imipenem | Amikacin | Colistin | LC 100 | LC 100 2 µg | LC 100 5 µg |
| KLPN 8852 | >50 | 12.5 | >50 | >50 | >25 | 25 |
| KLPN 15588 | >50 | >50 | 1.56 | >50 | 0.39 | <0.0975 |
| KLPN 27025 | >50 | 3.125 | 1.56 | >50 | 0.195 | <0.0975 |
| KLPN 24076 | >50 | 3.125 | 1.56 | >50 | 0.39 | <0.0975 |
| ACBA 43357 | >50 | 50 | 3.125 | 50 | 0.39 | <0.0975 |
| ACBA 1010 | 12.5 | 1.56 | 0.78 | 25 | <0.0975 | <0.0975 |
| ACBA 1012 | >50 | >50 | 0.78 | 50 | 0.39 | <0.0975 |
| ACBA ATCC 19606 | 25 | 12.5 | 1.56 | >50 | 0.195 | <0.0975 |
| ENT CLOACAE 44095 | >50 | 25 | >50 | >50 | >25 | >25 |
| ENT CLOACAE 21489 | >50 | 0.78 | 0.78 | >50 | 0.195 | <0.0975 |
| ENT CLOACAE 30063 | >50 | 25 | >50 | >50 | 25 | 6.25 |
| ENT CLOACAE 6780 | >50 | >50 | 1.56 | >50 | 0.39 | <0.0975 |

It was found that the combination of LC100 and colistin was able to kill bacteria such as E. coli with mcr-1 which is resistant to colistin and other antibiotics, E. coli without mcr-1 which is resistant to colistin and other antibiotics, resistant P. aeruginosa which is resistant to carbapenems, aminoglycosides and other antibiotics, resistant A. baumanii which is resistant to carbapenems, colistin and other antibiotics and resistant K. pneumonia which is resistant to carbapenems, colistin and other antibiotics. Table 3 shows that at different concentrations of LC100, the amount of colistin that is needed to kill the bacteria changes, confirming that LC100 does in fact as an adjuvant. This was also found to be true in E. coli without mcr-1 and other bacteria such as E. cloacae, supporting that this phenomenon is true across a wide range of bacteria.

Figure 13:
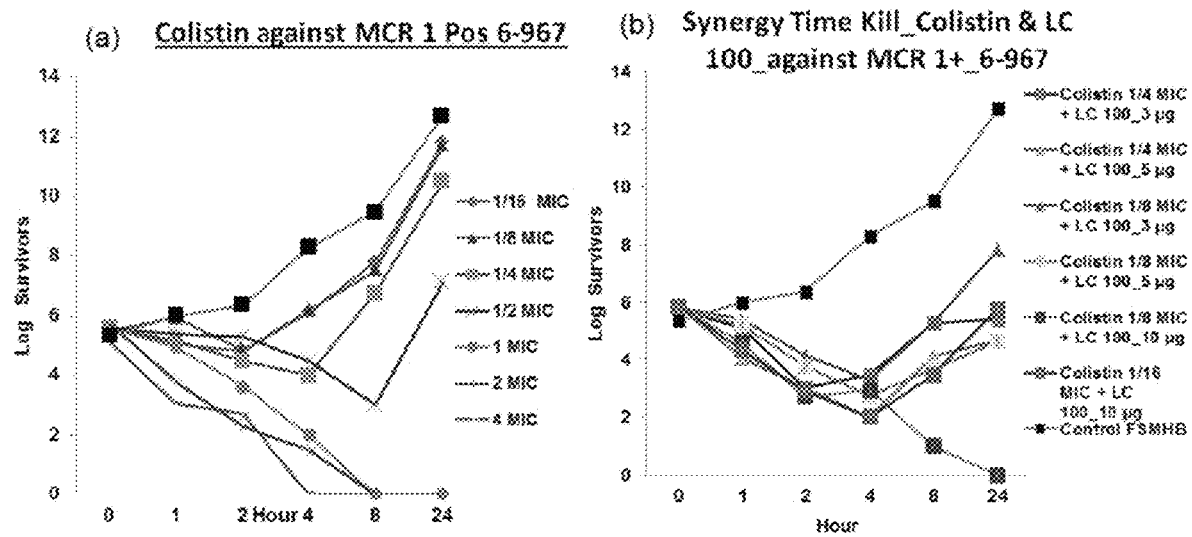
FIG. 13 refers to graphs showing the time kill study of (a) colistin and (b) LC100 in combination with colistin, for colistin resistant mcr-1 (+) strain 6083655967.
Figure 14:
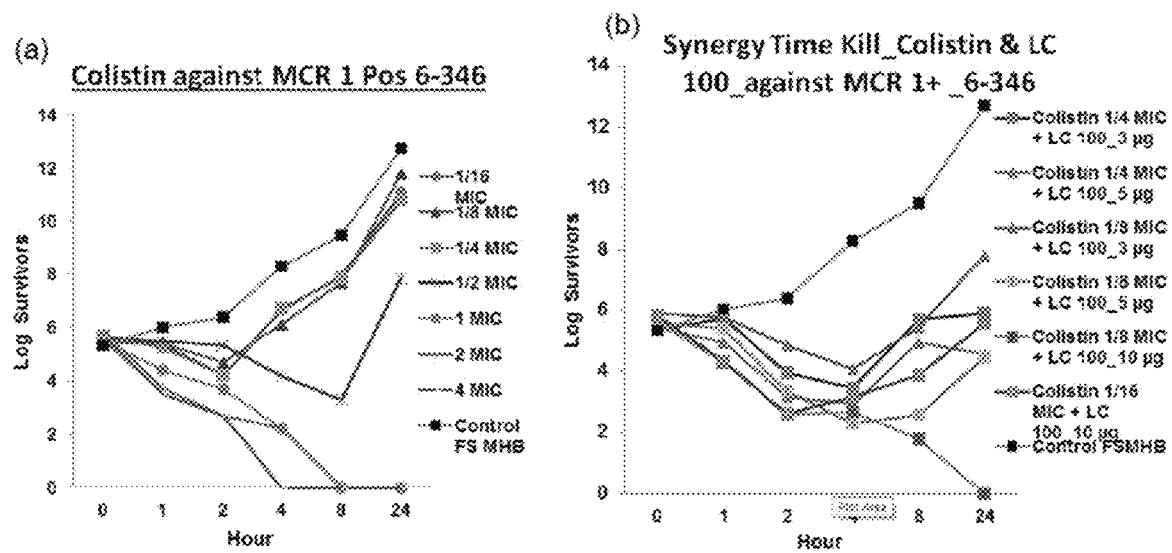
FIG. 14 refers to graphs showing the time kill study of (a) colistin and (b) LC100 in combination with colistin for colistin resistant mcr-1 (+) strain 6075066346.
Figure 15:
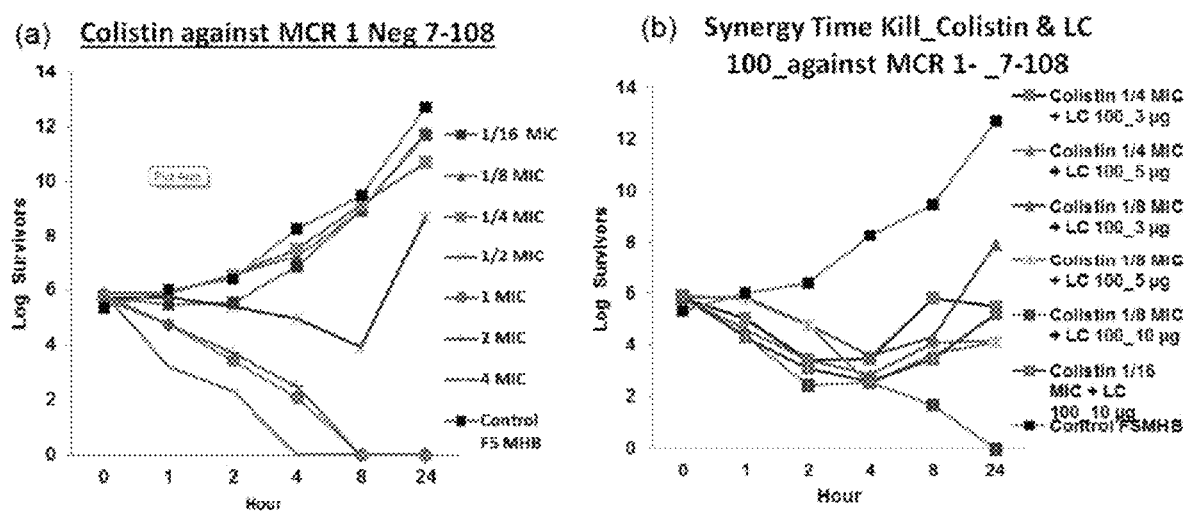
FIG. 15 refers to graphs showing the time kill study of (a) colistin and (b) LC100 in combination with colistin against colistin resistant mcr-1 (−) strain 7023446108.

To understand the action of the combinations of LC100 with colistin, time kill experiments using the inventive combination in three colistin resistant strains, including two mcr-1(+) and one mcr-1(−) strains, were carried out. FIG. 13, FIG. 14 and FIG. 15 show that colistin at concentrations equal or above the MIC results in 3 log reduction in 2 hours. While the same killing effect (in terms of 3 log reduction) was achieved in 2 hours by ⅛ MIC of colistin in the presence of 10 µg/ml of LC100. The rapid killing kinetics suggest the combination of LC100 and colistin acts on the bacterial membrane.

Figure 16:
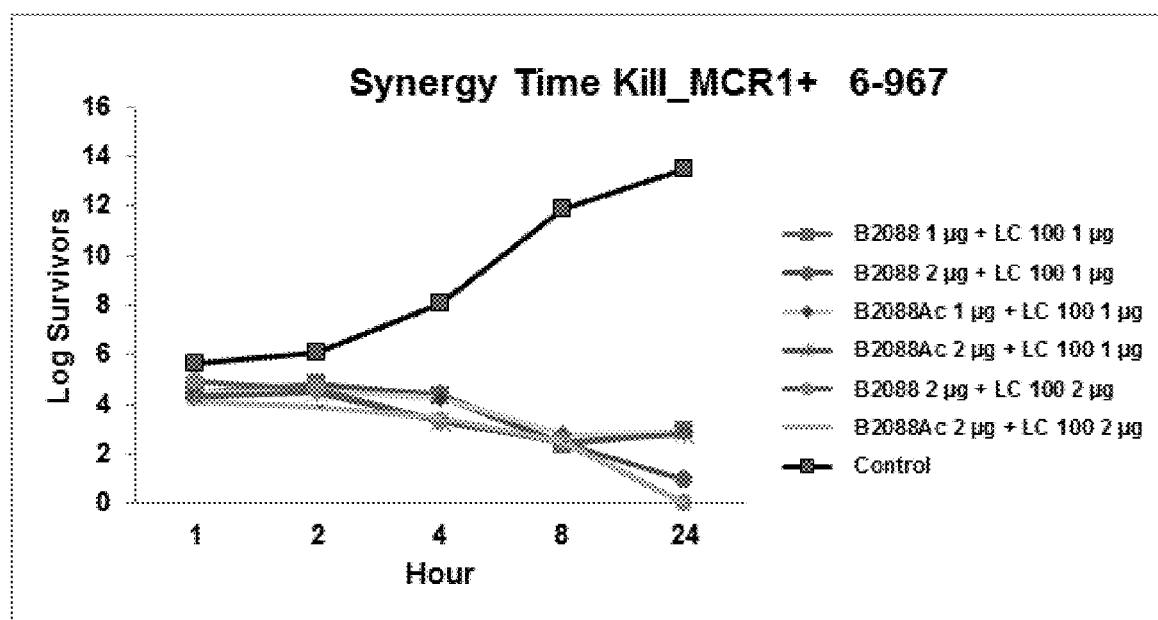
FIG. 16 refers to a graph showing the time kill action for the combination of B2088 and LC100.

LC100 and LC101 synergize not only colistin or polymyxin B, but also with other cationic peptides. This was tested by replacing colistin with another compound, B2088, which is of a completely different chemical nature, a peptide having positive charge, that also has a physical-chemical interaction with the outer membrane. In a synergy study, it was found that LC100 or LC101 had a synergistic effect with B2088 in killing E. coli with the mcr-1 mutation at a level of 1 µg/ml, increasing the activity by more than 10 times, as shown in FIG. 16 and Table 6. Using the combination of LC100 and colistin, the activity of a broad range of strains was further tested (Table 7). Table 7 covers a wide range of bacteria, many that are very resistant to antibiotics. It appears that a combination of 1 µg/ml of colistin and 5 µg/ml of LC100, works on all pathogens except for Klebsiella pneumonia (KLPN). This combination also appears to be safe to use.

The antimicrobial activity of the inventive combination was also tested against Gram positive bacteria, including the multi-drug resistant strains, such as MRSA. Table 8 shows that LC100 or LC101 alone display good activity against Gram positive strains, suggesting LC100 or LC101 alone has strong action on the bacterial inner membrane, as there is no outer membrane in Gram positive bacteria. This means the combination of LC100/LC101 with colistin has broad antimicrobial spectrum, being active against both Gram positive and Gram negative bacteria.

TABLE 6

Results of the synergistic study between LC100 or LC101 with B2088

| Strain | Drug/Peptide | | Combination MIC (μg/mL) |
|---|---|---|---|
| 6083655967 [MCR 1+; E.Coli] | B2088 + LC 100 | B2088 LC 100 | 1 |
| | B2088 + | B2088 | 1 |

TABLE 6-continued

Results of the synergistic study between LC100 or LC101 with B2088

| Strain | Drug/Peptide | | Combination MIC (μg/mL) |
|---|---|---|---|
| | LC 101 | LC 101 | 2 |
| | B2088 (Ac) + | B2088 (Ac) | 0.5 |
| | LC 100 | LC 100 | 2 |
| | B2088 (Ac) + | B2088 (Ac) | 1 |
| | LC 101 | LC 101 | 2 |

TABLE 7

Pathogen sensitivities of the inventive compounds as adjuvants to colistin in various pathogens

| | MIC [μg/mL] | | | | | | Colistin 0.5 μg+ | | |
|---|---|---|---|---|---|---|---|---|---|
| Bacterial strains | Colistin | Gatifloxacin | Doripenem | Imipenem | Meropenem | Ertapenem | LC100 1 μg | LC100 2 μg | LC100 5 μg |
| PAE DM 23376 | 1.56 | 1.56 | 0.78 | 1.56 | 0.39 | >25 | ✓ | ✓ | x |
| PAE DR 4877 | 1.56 | 25 | 0.78 | 1.56 | 1.56 | >25 | x | x | x |
| PAE DM 23257 | 1.56 | 0.78 | 0.78 | 0.78 | 0.78 | >25 | ✓ | ✓ | ✓ |
| PAE DU 14476 | 1.56 | 25 | >25 | >25 | >25 | >25 | ✓ | ✓ | ✓ |
| PAE DM 23155 | 1.56 | 1.56 | 0.195 | 0.78 | 0.195 | 12.5 | ✓ | ✓ | x |
| PAE DR 5790 | 0.78 | 25 | 12.5 (¼ MHB) | 6.25 | 6.25 | >25 | ✓ | x | x |
| PAE DM 4150 | 3.125 | | 6.25 | 3.125 | 1.56 | >25 | ✓ | ✓ | ✓ |
| PAE ATCC 9027 | 1.56 | 0.78 | | | | | x | x | x |
| PAE ATCC 27853 | 0.78 | 1.56 | | | | | x | x | x |
| PAE ATCC 15442 | 1.56 | | | | | | ✓ | ✓ | x |
| PAE ATCC 9721 | 1.56 | | | | | | x | x | x |
| PAE ATCC BAA-1744 | 1.56 | | | | | | ✓ | ✓ | x |
| KLPN ATCC 10031 | 1.56 | <0.049 | | | | | ✓ | x | x |
| KLPN ATCC 27736 | 0.78 | <0.049 | | | | | x | x | x |
| KLPN ATCC 35657 | 1.56 | | | | | | x | x | x |
| KLPN ATCC 700603 | 1.56 | | | | | | x | x | x |
| KLPN ATCC 4352 | 0.78 | <0.049 | | | | | x | x | x |
| KLPN CRE 55301 | 0.78 | 25 | 1.56 | | 0.39 | >25 | x | x | x |
| KLPN CRE 16260 | >50 | 3.125 | >50 | | >50 | >50 | ✓ | ✓ | ✓ |
| KLPN CRE 7955 | 1.56 | 100 | >25 | | >25 | >25 | x | x | x |
| KLPN CRE 27025 | 0.78 | 3.125 | 25 | >50 | >50 | | x | x | x |
| KLPN CRE 15588 | 0.78 | 25 | | >50 | | | ✓ | x | x |
| E. Coli ATCC 10536 | 0.78 | 0.012 | | | | | x | x | x |
| E. Coli ATCC 25922 | 0.78 | 0.012 | | | | | x | x | x |
| E. Coli ATCC 35218 | 0.78 | | | | | | x | x | x |
| E. Coli ATCC 8739 | 0.78 | 0.024 | | | | | x | x | x |
| E. Coli CRE 17528 | 0.78 | 25 | 1.56 | | 1.56 | >25 | x | x | x |
| E. Coli CRE 17232 | 0.78 | 12.5 | | | <0.195 (⅙ MHB) | 1.56 | x | x | x |
| E. Coli CRE 19211 | 1.56 | 25 | | | | | x | x | x |
| E. Coli CRE 34685 | 0.78 | 0.195 | | | | | x | x | x |
| E. Coli CRE 11804 | 0.78 | <0.015 | >25 | | >25 | 25 | x | x | x |
| E. Coli DB 16027R | 0.78 | | | | | | x | x | x |
| ACBA DR 43357 | 1.56 | | | >50 | | | x | x | x |
| ACBA ATCC 19606 | 0.78 | | | 25 | | | x | x | x |
| ACBA 1003 (CI) | 1.56 | 12.5 | | | | | x | x | x |
| ACBA 1004 (CI) | 1.56 | 12.5 | | | | | x | x | x |
| ACBA 1005 (CI) | 1.56 | 6.25 | | | | | x | x | x |
| ACBA 1006 (CI) | 1.56 | 6.25 | | | | | x | x | x |
| ACBA 1010 (CI) | 0.39 | <0.098 | | 25 | 1.56 | | x | x | x |
| 6083655967 [MCR 1+; E. Coli] | 6.25 | 12.5 | <0.0975 | 0.0975 | <0.0975 | | ✓ | ✓ | x |

TABLE 7-continued

Pathogen sensitivities of the inventive compounds as adjuvants to colistin in various pathogens

| | | | | | | | | | |
|---|---|---|---|---|---|---|---|---|---|
| 7023444207 [MCR 1+; *E. Coli*] | 6.25 | | <0.0975 | 0.0975 | <0.0975 | | ✓ | ✓ | x |
| 6123520276 [MCR 1+; *E. Coli*] | 6.25 | | <0.0975 | <0.0975 | <0.0975 | | ✓ | ✓ | x |
| 7023436560 [MCR 1+; *E. Coli*] | 6.25 | | <0.0975 | <0.0975 | <0.0975 | | ✓ | ✓ | x |
| 7103531927 [MCR 1+; *E. Coli*; KPC+] | 6.25 | <0.0975 | 1.56 | 6.25 | 25 | 12.5 | ✓ | ✓ | x |
| 7113636863 [MCR 1+; *E. Coli*; NDM-1] | 6.25 | 50 | 25 | 12.5 | 50 | >50 | ✓ | ✓ | x |
| 6093560257 [MCR 1+; *E. Coli*; NDM-1] | 6.25 | 0.78 | 50 | 12.5 | >50 | 25 | ✓ | ✓ | x |
| 7023446108 [MCR 1−; *E. Coli*] | 6.25 | 3.125 | 0.0975 | 0.0975 | <0.0975 | | ✓ | ✓ | x |
| 7033607097 [MCR 1−; *E. Coli*] | 6.25 | | <0.0975 | 0.195 | <0.0975 | | ✓ | ✓ | x |

| | Colistin 1 µg+ | | | FOLD CHANGES [Absorbance (abs; OD 600 nm)] | | |
|---|---|---|---|---|---|---|
| Bacterial strains | LC100 1 µg | LC100 2 µg | LC100 5 µg | No Treatment [Bacteria alone]: Absolute abs [Broth alone] | No Treatment [Bacteria alone]: MIC Colistin | No Treatment [Bacteria alone]: Colistin 0.5 µg |
| PAE DM 23376 | x | x | x | 12.23 | 8.00 | 0.93 |
| PAE DR 4877 | x | x | x | 17.90 | 12.00 | 1.30 |
| PAE DM 23257 | ✓ | x | x | 12.11 | 7.71 | 1.02 |
| PAE DU 14476 | ✓ | x | x | 11.53 | 7.21 | 0.90 |
| PAE DM 23155 | ✓ | ✓ | x | 14.33 | 7.00 | 1.30 |
| PAE DR 5790 | x | x | x | 13.82 | 10.25 | 1.06 |
| PAE DM 4150 | x | x | x | 13.34 | 10.34 | 1.02 |
| PAE ATCC 9027 | x | x | x | 11.51 | 8.80 | 0.98 |
| PAE ATCC 27853 | x | x | x | 10.20 | 8.35 | 0.96 |
| PAE ATCC 15442 | ✓ | x | x | 15.10 | 14.00 | 1.03 |
| PAE ATCC 9721 | x | x | x | 9.00 | 5.80 | 1.01 |
| PAE ATCC BAA-1744 | x | x | x | 14.70 | 6.81 | 1.11 |
| KLPN ATCC 10031 | x | x | x | 10.70 | 10.11 | 1.25 |
| KLPN ATCC 27736 | x | x | x | 9.58 | 9.67 | 1.21 |
| KLPN ATCC 35657 | x | x | x | 13.95 | 13.49 | 1.57 |
| KLPN ATCC 700603 | x | x | x | 10.17 | 9.64 | 1.11 |
| KLPN ATCC 4352 | x | x | x | 3.60 | 3.54 | 1.81 |
| KLPN CRE 55301 | x | x | x | 9.59 | 9.00 | 1.09 |
| KLPN CRE 16260 | ✓ | ✓ | ✓ | 13.90 | No MIC | 1.06 |
| KLPN CRE 7955 | x | x | x | 10.31 | 10.28 | 1.64 |
| KLPN CRE 27025 | x | x | x | 12.15 | 11.84 | 5.24 |
| KLPN CRE 15588 | ✓ | x | x | 10.19 | 7.39 | 2.50 |
| *E. Coli* ATCC 10536 | x | x | x | 18.91 | 18.42 | 1.11 |
| *E. Coli* ATCC 25922 | x | x | x | 18.41 | 18.24 | 1.23 |
| *E. Coli* ATCC 35218 | x | x | x | 25.11 | 24.46 | 1.31 |
| *E. Coli* ATCC 8739 | x | x | x | 20.71 | 20.68 | 1.85 |
| *E. Coli* CRE 17528 | x | x | x | 20.51 | 20.21 | 1.45 |
| *E. Coli* CRE 17232 | x | x | x | 16.40 | 16.09 | 1.31 |
| *E. Coli* CRE 19211 | x | x | x | 20.87 | 20.56 | 1.17 |
| *E. Coli* CRE 34685 | x | x | x | 22.94 | 22.63 | 1.49 |
| *E. Coli* CRE 11804 | x | x | x | 17.31 | 17.29 | 1.19 |
| *E. Coli* DB 16027R | x | x | x | 21.63 | 14.89 | 1.23 |
| ACBA DR 43357 | x | x | x | 25.77 | 25.47 | 1.06 |
| ACBA ATCC 19606 | x | x | x | 16.32 | 16.14 | 2.04 |
| ACBA 1003 (CI) | x | x | x | 12.56 | 12.60 | 1.26 |
| ACBA 1004 (CI) | x | x | x | 24.13 | 23.71 | 1.09 |
| ACBA 1005 (CI) | x | x | x | 22.55 | 22.34 | 1.02 |
| ACBA 1006 (CI) | x | x | x | 24.14 | 23.81 | 1.12 |
| ACBA 1010 (CI) | x | x | x | 20.41 | 21.43 | 1.13 |
| 6083655967 [MCR 1+; *E. Coli*] | ✓ | ✓ | x | 19.39 | 19.59 | 1.10 |
| 7023444207 [MCR 1+; *E. Coli*] | ✓ | ✓ | x | 17.87 | 17.44 | 1.10 |
| 6123520276 [MCR 1+; *E. Coli*] | ✓ | ✓ | x | 20.54 | 20.10 | 1.04 |

TABLE 7-continued

Pathogen sensitivities of the inventive compounds as adjuvants to colistin in various pathogens

| | | | | | | |
|---|---|---|---|---|---|---|
| 7023436560 [MCR 1+; E. Coli] | ✓ | ✓ | x | 19.33 | 18.70 | 1.14 |
| 7103531927 [MCR 1+; E. Coli; KPC+] | ✓ | ✓ | x | 17.17 | 17.67 | 1.06 |
| 7113636863 [MCR 1+; E. Coli; NDM-1] | ✓ | ✓ | x | 17.32 | 16.97 | 1.06 |
| 6093560257 [MCR 1+; E. Coli; NDM-1] | ✓ | ✓ | x | 21.64 | 21.59 | 1.14 |
| 7023446108 [MCR 1-; E. Coli] | ✓ | ✓ | x | 18.79 | 18.04 | 1.15 |
| 7033607097 [MCR 1-; E. Coli] | ✓ | ✓ | x | 15.42 | 15.21 | 1.35 |

TABLE 8

The antimicrobial effect of LC100 and LC101 on Gram positive bacteria.

| MCR 1 Strains | LC 100 | LC 101 |
|---|---|---|
| SA ATCC 29213 | 3.125 | 3.125 |
| SA ATCC 6538 | 3.125 | 3.125 |
| SA DM 4400R | 3.125 | 3.125 |
| MRSA ATCC 43300 | 3.125 | 6.25 |
| MRSA ATCC 700699 | 3.125 | 6.25 |
| MRSA DM 21455 | 3.125 | 3.125 |

Example 10: Mechanism of Action of LC100 and LC101 (with Mcr-1)

The inventive compounds were considered to be adjuvant compounds facilitating the action of colistin on Gram negative bacteria and especially E. coli with the mcr-1 mutation, as these compounds work in a synergistic manner to lower the effective dose of colistin by 10 times or more. When used in conjunction with LC100 or LC101, colistin goes from having a MIC of more than 6 µg/ml to less than 0.5 µg/ml. At 6 µg/ml, colistin is considered unsafe to use due to side effects which are concentration dependent. The synergistic effect with these two compounds were also observed on other forms of resistant Gram negative bacteria such as E. coli, A. baumannii and K. pneumoniae.

Although mcr-1 bacteria are resistant to colistin, it has been reported that colistin can still perturb the outer membrane of mcr-1 bacteria. It is noted that disrupting only the outer membrane does not directly cause cell death, and the inner membrane must be affected so that the transmembrane potential is lost and water enters into the bacteria. Therefore it was hypothesized that in the case of LC100 in combination with colistin, colistin and LC100 work together to perturb the outer membrane, allowing LC100 to reach the inner membrane. As LC100 has a strong action on inner membrane, the bacteria cell dies as a result of disruption of the inner membrane.

Figure 17:
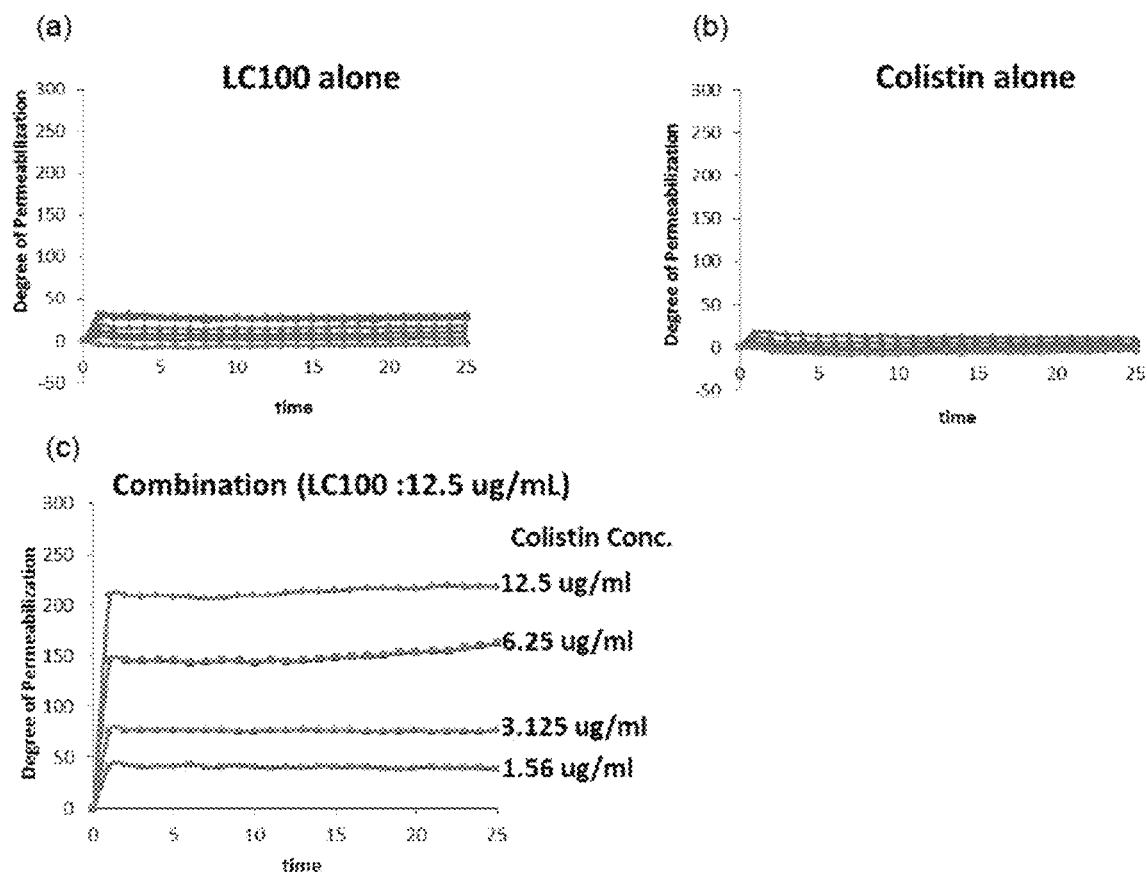
FIG. 17 refers to graphs showing the action of (a) LC100, (b) colistin and (c) LC100 in combination with colistin with mcr-1 bacterial membrane using a fluorescent probe ethydium bromide.
Figure 18:
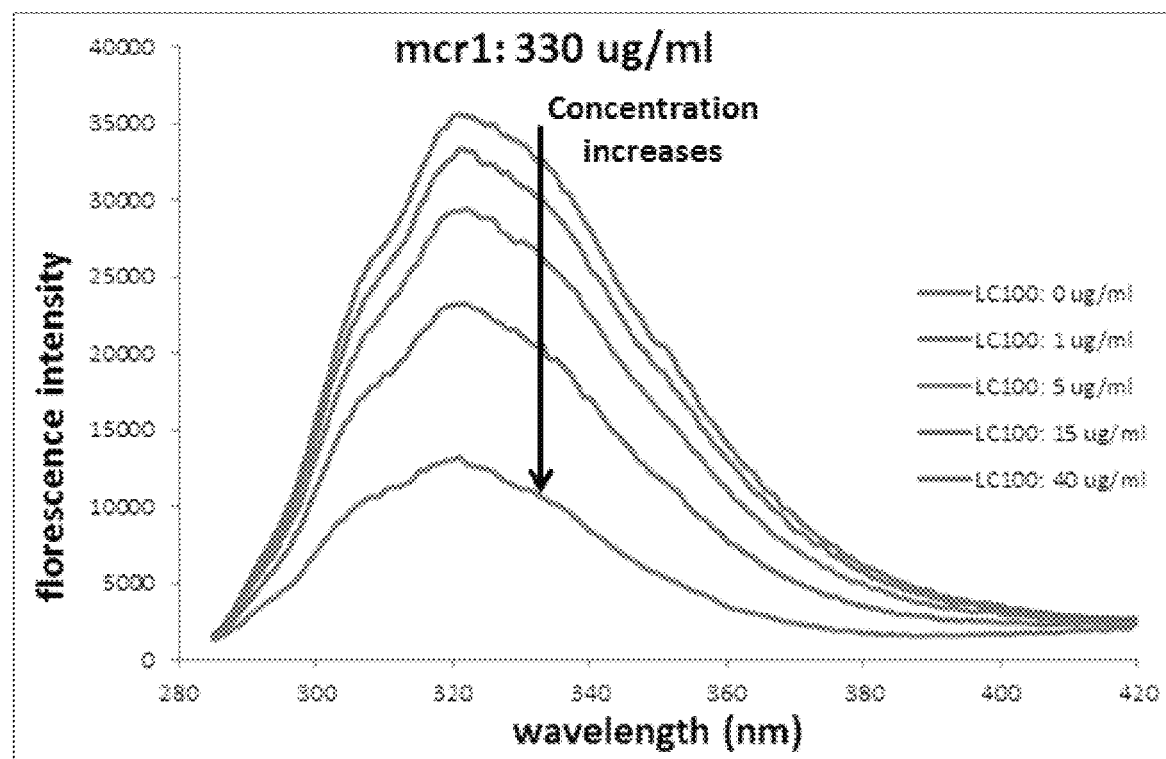
FIG. 18 is a graph showing the interaction of LC100 with MCR1 protein using fluorescence quenching.

To test the hypothesis, fluorescence experiments were performed using a dye molecule EtBr, which emits strong fluorescence when it binds to DNA. However, EtBr is membrane impermeable, which means that it can only enter the bacterial cell and bind to DNA and emit fluorescence only when both the bacterial outer and inner membranes are perturbed. FIG. 17 shows that when used alone, LC100 and colistin induce only slight fluorescence, suggesting neither of the compounds can break the bacterial outer membrane. However, in the presence of the combination of LC100 and colistin, there is strong fluorescence, indicating that both the outer and inner membranes of mcr-1 bacteria are disrupted, confirming the hypothesis that the combination of LC100 and colistin act on bacterial membranes. It is also possible that LC100 may have other targets. One possible target is the MCR-1 protein. To understand the interaction of LC100 and the MCR-1 protein, the fluorescence of MCR-1 protein in the presence of different concentration of LC100 was measured. MCR-1 protein contains several tryptophan residues, and autofluoresces at 323 nm. FIG. 18 shows that as the LC100 concentration increases, the fluorescence decreases. The fluorescence quenching effect suggests there is strong interaction between MCR-1 protein and LC100.

Figure 19:
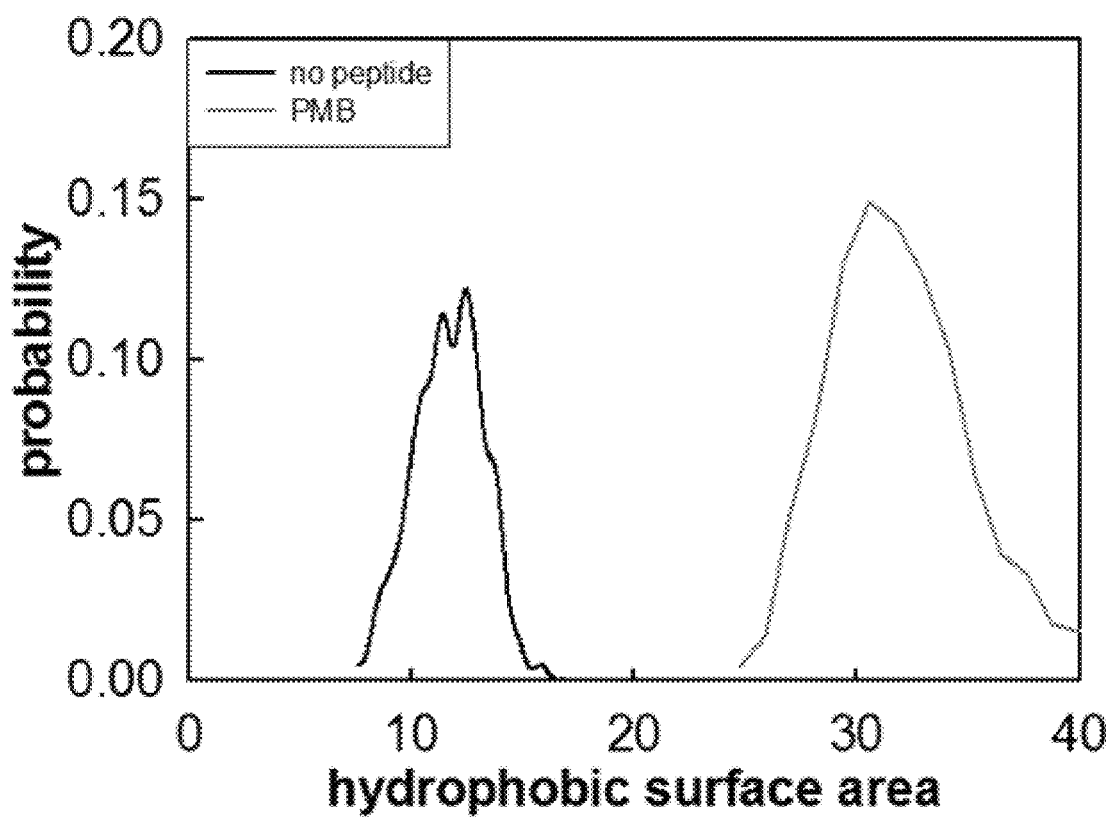
FIG. 19 refers to a graph showing the hydrophobic surface area in the bacterial membrane in the presence and absence of polymyxin B.

Colistin and polymyxin B can interact with the phosphate groups and perturb the head groups, which creates cavities exposing the lipid tails of the membrane to the aqueous phase. For example, in the presence of cationic polymyxin B, which is an analogue of colistin, the hydrophobic surface area of the bacterial membrane increases (FIG. 19), allowing for the hydrophobic association between the lipid tails of polymyxin B and the lipid tails of the bacterial outer membrane, resulting in the resistance to colistin.

Figure 20:
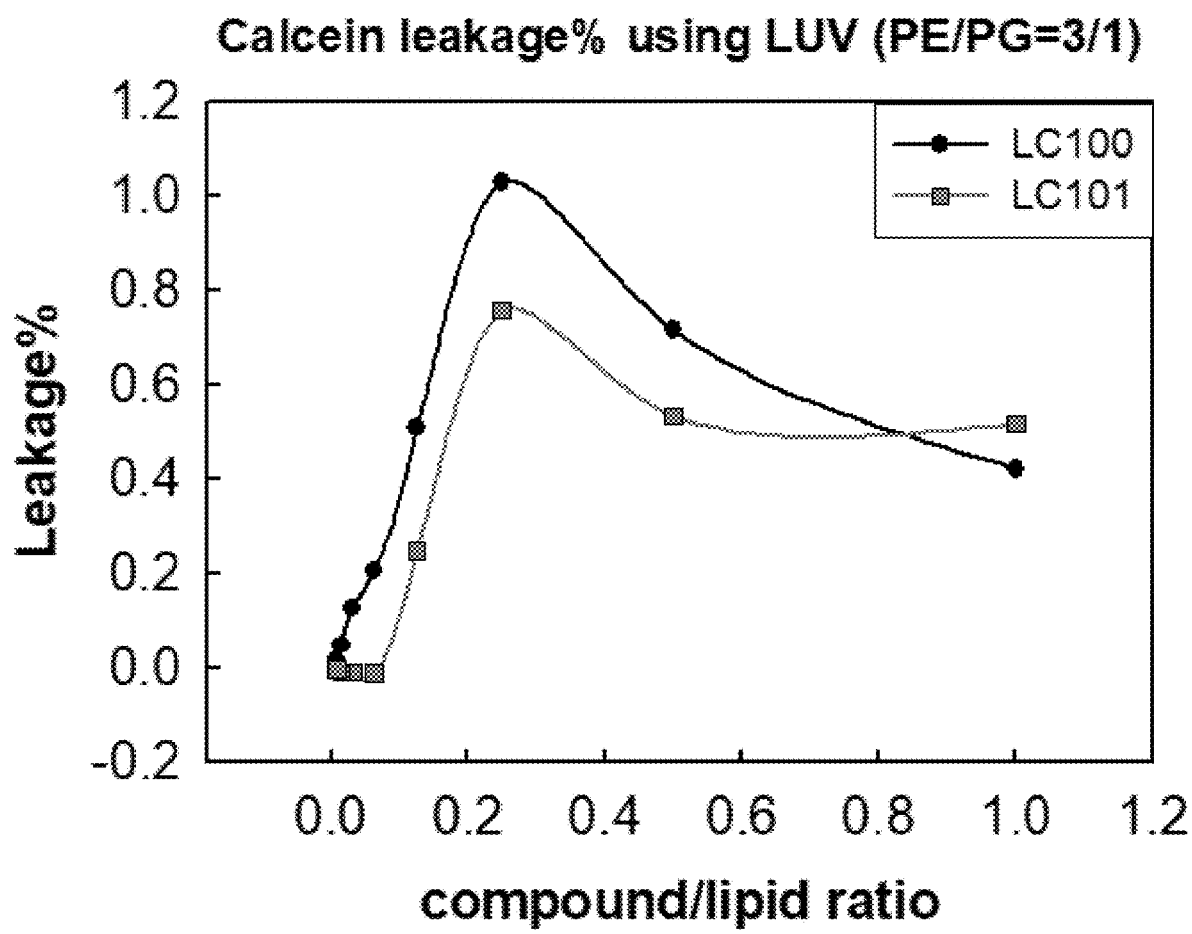
FIG. 20 refers to a graph showing calcein leakage of LC100 and LC101 using large unilamellar vesicles of 100 nm. The lipid composition of the vesicle is DOPE/DOPG=3/1, mimicking the bacterial inner membrane. As the concentration of LC100 or LC101 increases, significant florescence was detected, suggesting the vesicles are disrupted and dye molecules are released. Further increase of LC100 or LC101 leads to decrease in the florescence because of a fluorescence quenching effect.

It is hypothesized that the efficacy of LC100 in combination with colistin results from the ability of the cationic groups of colistin to transiently perturb the intra-membrane hydrogen bond network, thereby exposing the hydrophobic lipid groups in the bacterial membrane. This transient exposure appears to be sufficient for the LC100 molecule to "burrow" into and pass through the outer membrane, reach the inner membrane and kill the bacteria. Microbiological data has revealed that the concentration of colistin required for this synergy could be lowered by a factor of 4 to 100 compared to the amounts needed for colistin to act by itself. This hypothesis is strengthened by the observation that LC100 disrupts liposomes which simulate the inner membrane (FIG. 20). An alternate mode of action that is speculated is whereby molecules of colistin form channel like oligomers on the membrane which may form cavities that would facilitate the diffusion of LC100 into the inner membrane.

Example 11: Mechanism of Action of LC100 and LC101 (without Mcr-1)

E. coli is a favorite host of mcr-1, and is also frequently resistant to colistin without the mcr-1 mutation. It has been suggested that this may be due to the presence of arabinose sugars. The sugar molecules have several hydroxyl groups which could also engage in the hydrogen bonding network to stabilize the bacterial membrane, resulting in resistance to Colistin. As outlined above, when the effects of the combination of LC100 with colistin on several such resistant bacteria without mcr-1 were tested, it was found that in the presence of LC100, *E. coli* became very sensitive to low concentrations of colistin, to levels <0.5 µg/ml. The mechanism of action may be similar to the one proposed above for bacteria with mcr-1, whereby cationic colistin may transiently perturb the intra-membrane hydrogen bond network, enabling the transient appearance of hydrophobic cavities in the membrane that in turn would facilitate LC100, which has a strong hydrophobic core, to move into the fatty acid layer of Lipid A and then downward to disrupt the inner membrane of the bacteria.

Carbapenem resistant bacteria were also found to be susceptible to the combination of LC100 and colistin. Carbapenem resistance is caused by the biosynthetic enzymes of the bacteria cytoplasm due to mutations in these proteins. These bacteria have variable sensitivity to colistin. It is likely that in the presence of a combination of LC100 and colistin, the interactions of colistin with the outer membrane facilitate the entry of LC100 into the inner membrane, thereby causing the LC100 to enable killing of the bacteria.

Example 12: In Vivo Studies of LC100

Figure 21:
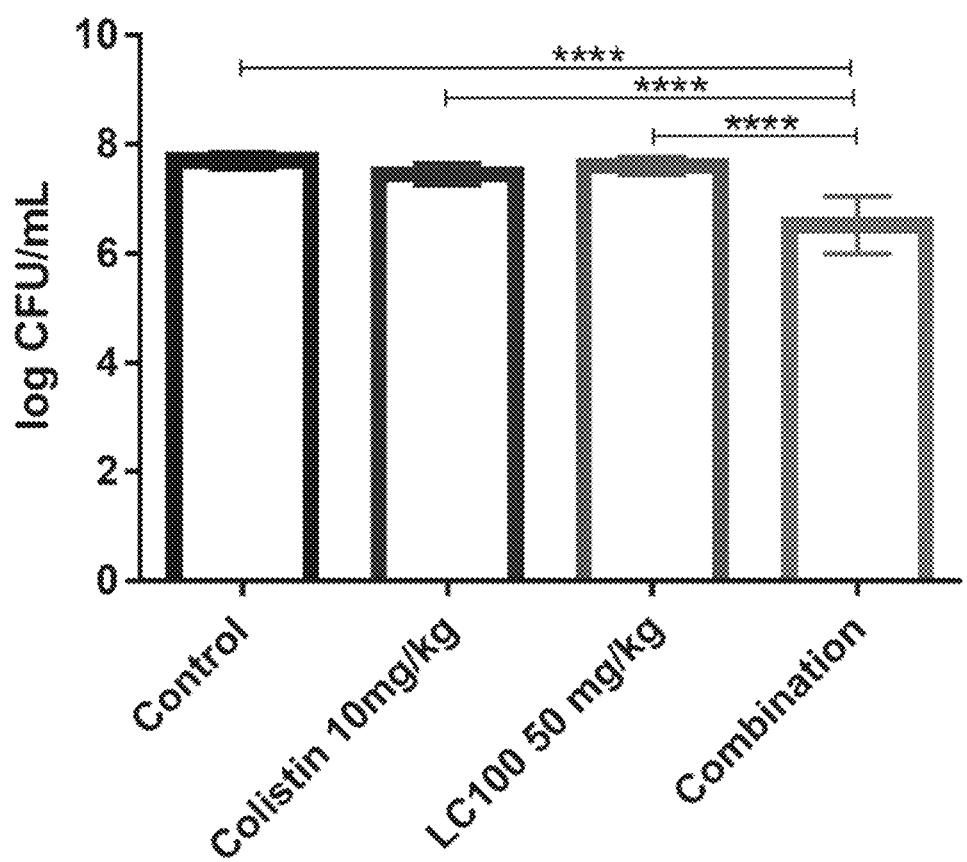
FIG. 21 refers to graphs showing the efficacy testing of combination of LC100 and Colistin in neutropenic mouse thigh infection model infected with MCR positive *E. coli* Clinical isolate 6083655967. Starting inoculum was $1.87 \times 10^6$, N=3. "Combination" refers to Colistin 10 mg/kg+ LC100 50 mg/kg. Each treatment was done intraperitoneally 1 hour after infection. 6 hours after treatment, mouse thigh tissues were homogenized for viable CFU. Abdominal distension was found in mice from the LC100 and combination groups. The mice from the combination group seemed to be weaker having cold bodies, and not moving around much than the LC100 group before being sacrificed.

To evaluate the in vivo efficacy of the combination of LC100 and colistin, a neutropenic mouse thigh infection model was used. 30 mice were classed into 5 groups: control, colistin at 10 mg/kg, LC100 at 50 mg/kg, meropenem at 100 mg/kg and combination of 50 mg/kg of LC100 and 10 mg/kg of colistin. Each treatment was administered intraperitoneally 1 hour after infection. The starting inoculum was 1.87×10$^6$, and 6 hours after treatment, mouse thigh tissues were homogenized for viable CFU. FIG. 21 shows that LC100 or colistin alone cannot reduce the bacterial burden, while the combination results in 1.2 log reduction in 6 hours. As neutropenic mice were used in the study, the 1.2 log reduction in bacterial burden is due to the combination of LC100 and colistin rather than the immune system of the mouse. As a control, meropenem displayed even more significant activity (2 log reduction) because of the high concentration and the bacterial strains are penem sensitive.

INDUSTRIAL APPLICABILITY

The disclosed compound may be useful for interacting with and disrupting the bacterial membrane. The disclosed compound may be effective in killing Gram positive bacteria alone or when co-administered with colistin. The disclosed compound may be effective in killing Gram negative bacteria that are mcr positive, alone or when co-administered with colistin. The disclosed compound may also be effective in killing Gram negative bacteria that are MCR negative yet still resistant to colistin, when co-administered with colistin. In addition, the disclosed compound may be effective in killing a wide range of Gram negative bacteria, including bacteria that are resistant to carbapenems, when co-administered with colistin.

The disclosed compound may be useful as an antibiotic, to kill or inhibit the growth of a microorganism, in therapy, and/or for treating a bacterial infection.

The disclosed compound may be used to kill or inhibit the growth of a microorganism on surfaces, including but not limited to topical applications, in plasters, eye drops, nose spray, mouth wash and hand sanitizers. The disclosed compound may also be used in food preservatives, disinfectants, surface cleaners or medical devices.

The disclosed process for preparing the disclosed compound may be facile, using mild reaction conditions, facilitating low cost and large scale synthesis of the compounds.

It will be apparent that various other modifications and adaptations of the invention will be apparent to the person skilled in the art after reading the foregoing disclosure without departing from the spirit and scope of the invention and it is intended that all such modifications and adaptations come within the scope of the appended claims.

The invention claimed is:

1. A compound having the following formula (I):

$$Z^1\text{-}L^1\text{-}A\text{-}L^2\text{-}Z^2 \qquad \text{formula (I)}$$

wherein A is selected from the group consisting of

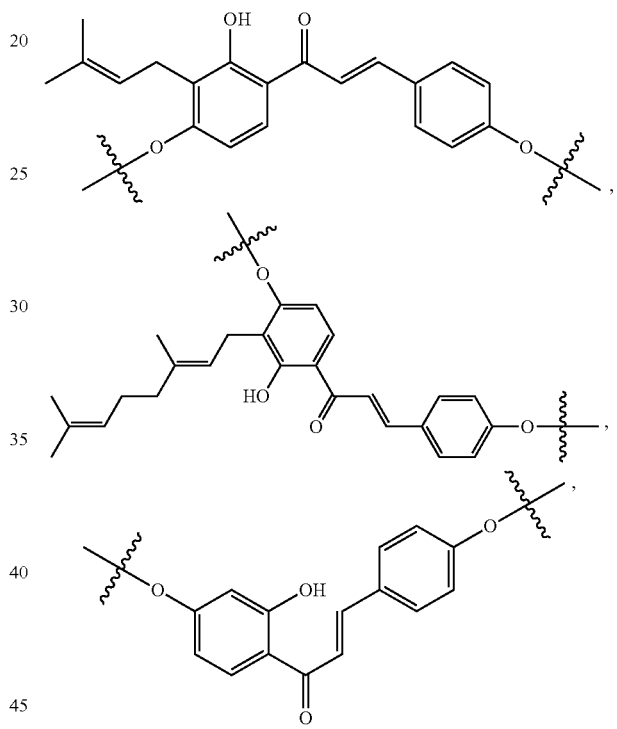

and any mixture thereof;

L$^1$ and L$^2$ are independently a substituted or unsubstituted alkyl, substituted or unsubstituted alkenyl, substituted or unsubstituted alkynyl, alkoxycarbonyl, alkanoyloxy, carboxamido, ether, —(O—CH$_2$—CH$_2$—O)$_n$—, L$^3$, or any combination thereof, wherein L$^3$ has the following structure:

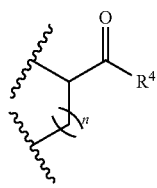

wherein n is an integer from 1 to 10 and R$^4$ is an amino; and $Z^1$ and $Z^2$ independently have the following structure:

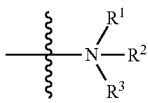

$R^1$ and $R^2$ are independently hydrogen, substituted or unsubstituted alkyl, substituted or unsubstituted alkenyl, substituted or unsubstituted alkynyl, substituted or unsubstituted aminoalkyl, guanidine, substituted or unsubstituted guanidylalkyl, substituted or unsubstituted aryl, substituted or unsubstituted heteroaryl, substituted or unsubstituted heteroarylalkyl, amino acid or peptide, or $R^1$ and $R^2$ are taken together to form a saturated or unsaturated, substituted or unsubstituted heterocyclic ring; and $R^3$ is absent or hydrogen, or substituted or unsubstituted alkyl, substituted or unsubstituted alkenyl, substituted or unsubstituted alkynyl, substituted or unsubstituted aminoalkyl, guanidine, substituted or unsubstituted guanidylalkyl, substituted or unsubstituted aryl, substituted or unsubstituted heteroaryl, substituted or unsubstituted heteroarylalkyl, amino acid or peptide, wherein when $R^3$ is present, the nitrogen atom is a cationic quaternary nitrogen, wherein the broken bond represents where the structure attaches to the remainder of formula (I);

wherein each substituted alkyl, substituted alkenyl, substituted alkynyl, substituted aminoalkyl, substituted guanidylalkyl, substituted aryl, substituted heteroaryl, substituted heteroarylalkyl, substituted heterocyclic ring is substituted with one or more groups independently selected from alkyl, alkenyl, alkynyl, cycloalkyl, cycloalkylalkyl, cycloalkenyl, cycloalkylalkenyl, heterocycloalkyl, cycloalkylheteroalkyl, cycloalkyloxy, cycloalkenyloxy, cycloamino, halo, carboxyl, haloalkyl, haloalkenyl, haloalkynyl, alkynyloxy, heteroalkyloxy, hydroxyl, hydroxyalkyl, alkoxy, alkenyloxy, nitro, amino, alkylamino, dialkylamino, alkenylamine, aminoalkyl, alkynylamino, acyl, alkyloxy, alkyloxyalkyl, alkyloxyaryl, alkyloxycarbonyl, alkyloxycycloalkyl, alkyloxyheteroaryl, alkyloxyheterocycloalkyl, acylamino, alkylsulfonyloxy, heterocyclic, heterocycloalkenyl, heterocycloalkyl, heterocycloalkylalkyl, heterocycloalkylalkenyl, heterocycloalkylheteroalkyl, heterocycloalkyloxy, heterocycloalkenyloxy, heterocycloamino, haloheterocycloalkyl, alkylsulfinyl, alkylsulfonyl, aminosulfonyl, sulfinyl, sulfinylamino, sulfonyl, sulfonylamino, aryl, heteroaryl, heteroarylalkyl, heteroarylalkenyl, heteroarylheteroalkyl, heteroarylamino, heteroaryloxy, arylalkenyl, arylalkyl, aryloxy, arylsulfonyl, cyano, cyanate, isocyanate, —C(O)NH(alkyl), and —C(O)N(alkyl)$_2$.

2. The compound according to claim 1, wherein $R^1$, $R^2$ and $R^3$ independently comprise a functional group selected from the group consisting of amine, guanidine, pyrrolidine, pyrrole, imidazolidine, pyrazolidine, imidazole, pyrazole, triazole, piperidine, pyridine, piperazine, diazine, hydroxamic acid, hydrazine, N-hydroxyurea, squaric acid, carbamolyphosphonate, oxazoline, pyrimidinetrione, 1-hydroxy-2(1H)-pyridinone (1,2-HOPO) and any combination thereof.

3. The compound according to claim 1, wherein $L^1$ and $L^2$ are independently selected from the group consisting of —(CH$_2$)$_4$—, amide,

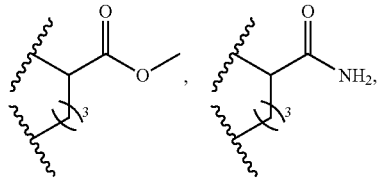

and any combination thereof.

4. The compound according to claim 1, wherein the compound of formula (I) has the following structure:

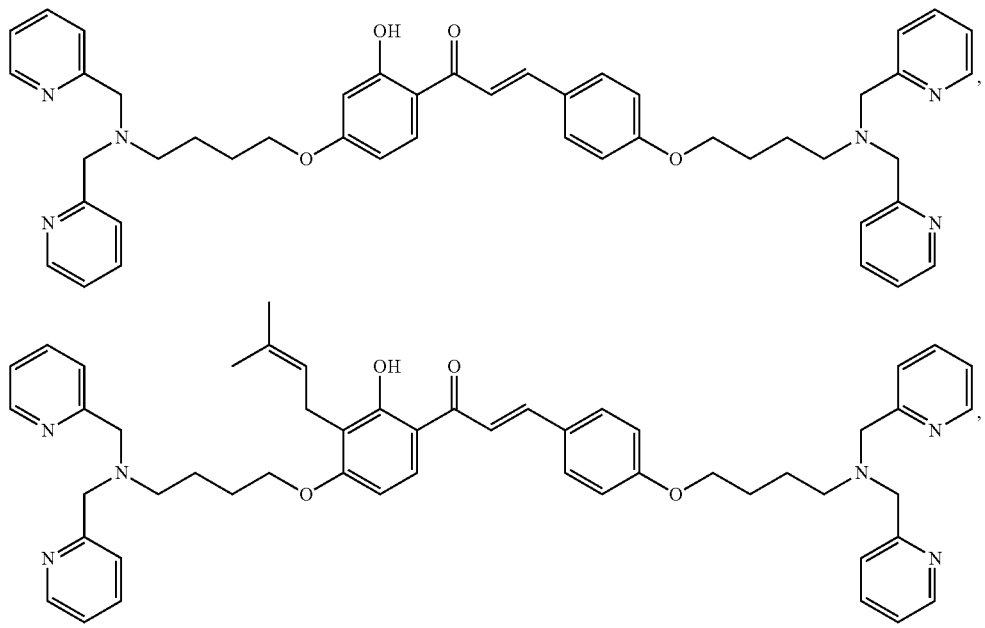

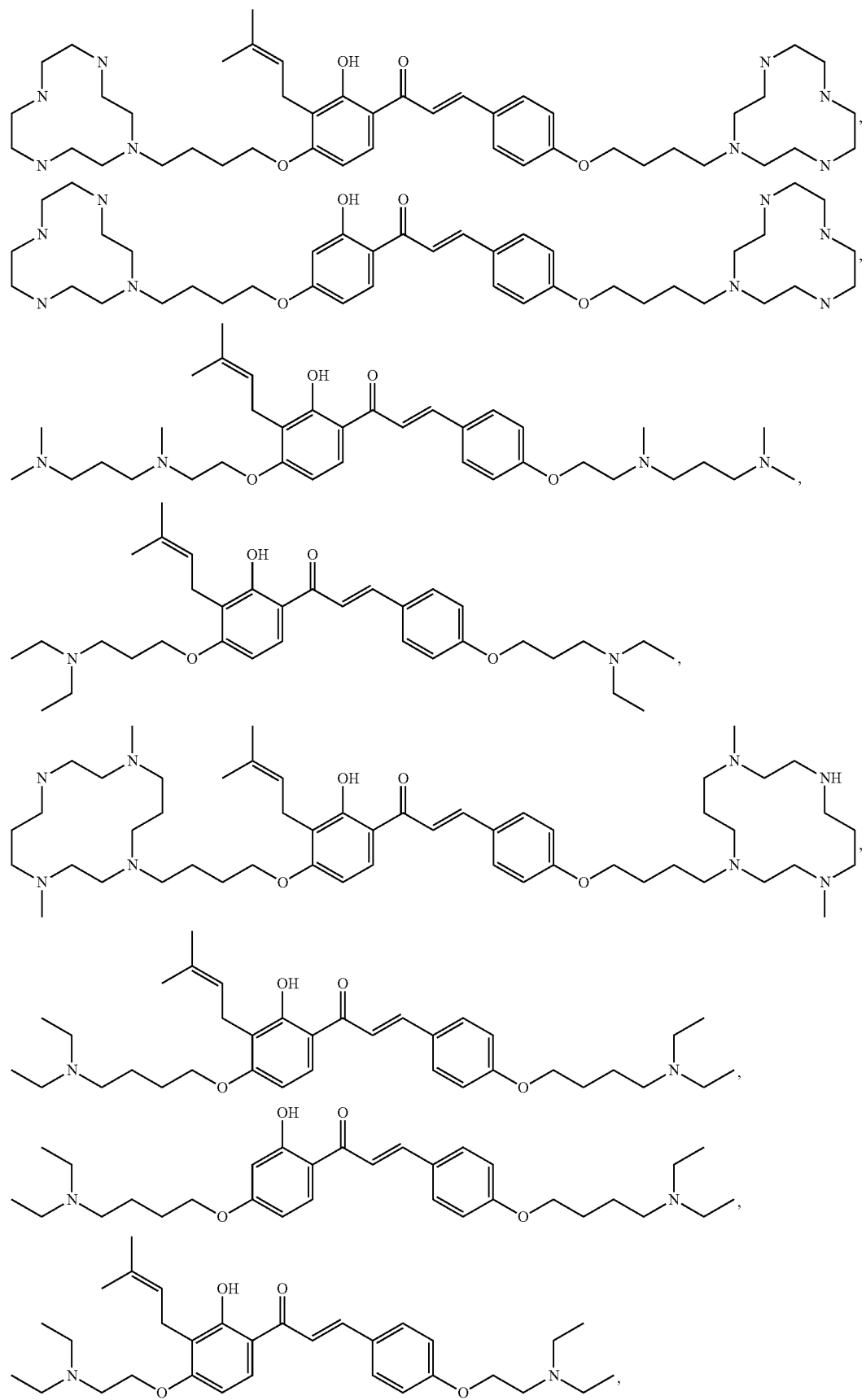

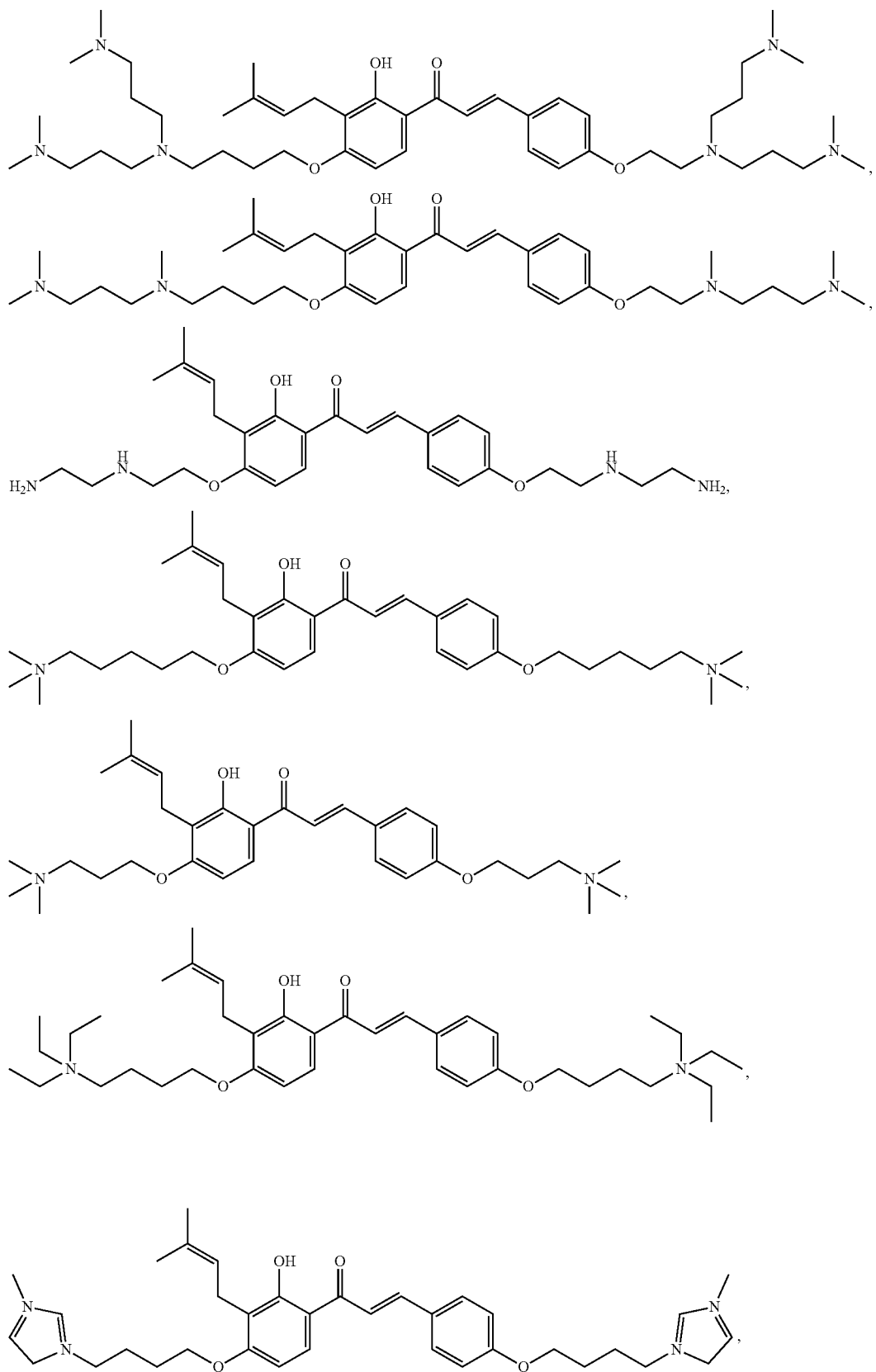

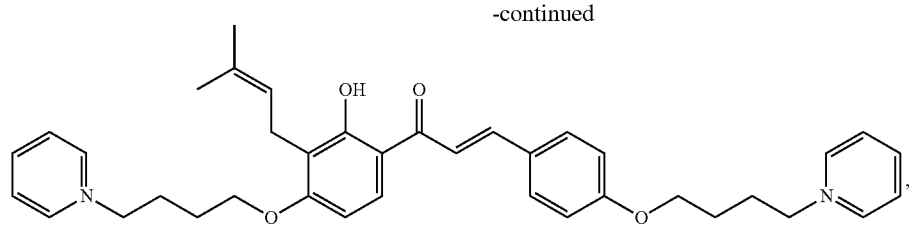
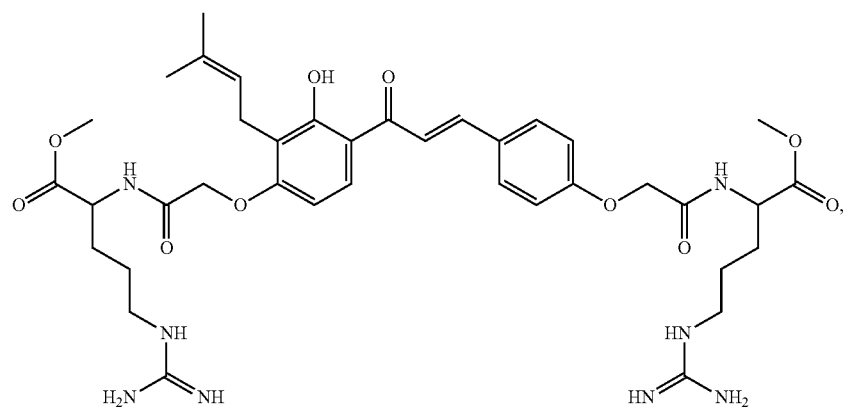
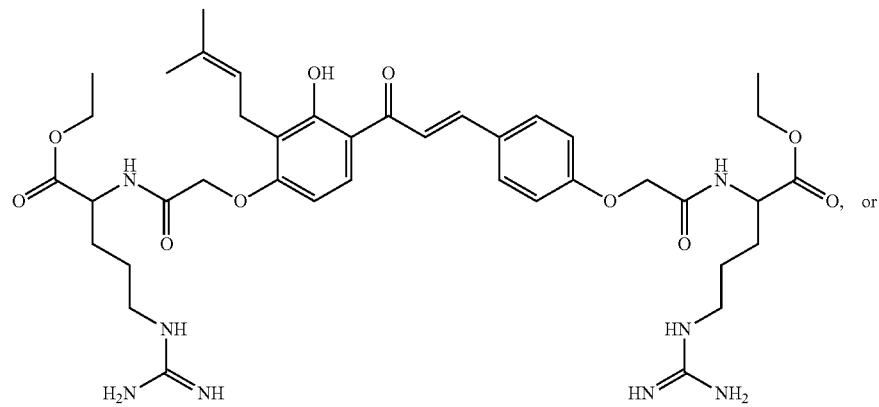
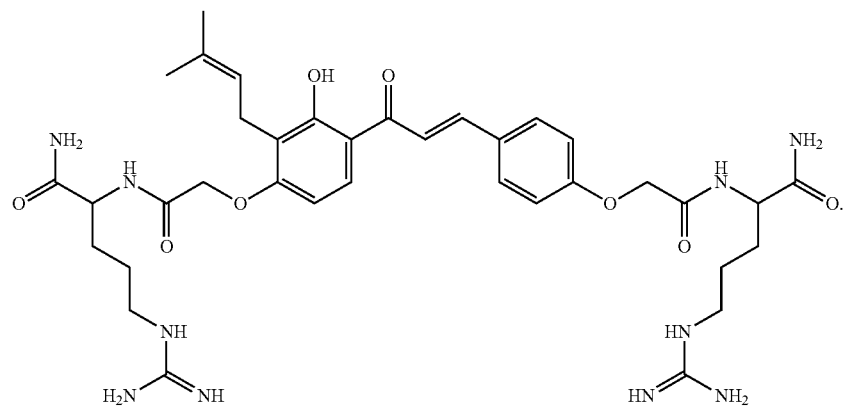

5. The compound according to claim 1, wherein each N-containing moiety is independently chelated to zinc.

6. A pharmaceutical composition comprising a compound according to claim 1, or a pharmaceutically acceptable salt or hydrate thereof, in association with a pharmaceutically acceptable carrier.

7. A process for preparing a compound according to claim 1, comprising the steps of:
 1) Contacting a hydrophobic moiety selected from the group consisting of:

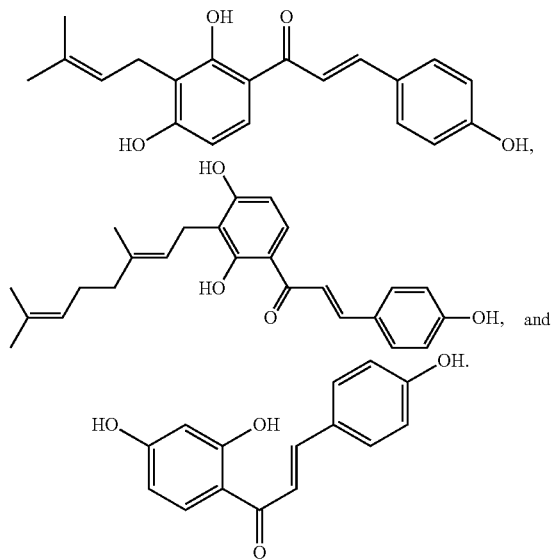

with a linker selected from the group consisting of 1,4-dibromobutane, 1,3-diiodobutane, ethyl iodoacetate, hydroxybenzotriazole, 1,2-dibromoethane, 1,3-dibromopropane, methyl iodoacetate, methyl bromoacetate, 1,4-diiodobutane and any combination thereof, under reaction conditions; and
 2) contacting the linker with an N-containing moiety selected from the group consisting of dipicolylamine, cyclen, 1,8-dimethyl,1,4,8,11-tetracyclotetradecane, diethylamine, —NH[(CH$_2$)$_3$N(CH$_3$)]$_2$, —NH$_2$(CH$_2$)$_3$N(CH$_3$)$_2$, 5-bromopentyltrimethylammonium bromide, 3-bromopentyl trimethylammonium bromide, 4-bromobutyl triethylammonium bromide, 3-(4-Bromobutyl)-1-methylimidazole bromide, 1-(4-Bromobutyl)pyridine bromide, 1-(4-Bromobutyl)pyridine bromide and any combination thereof, under reaction conditions.

8. The process according to claim 7, wherein a covalent bond is formed between the hydrophobic moiety and the N-containing moiety or the hydrophobic moiety and the linker or the linker and the N-containing moiety.

9. The process according to claim 7, comprising the step of adding zinc after the N-containing moiety is covalently bonded to the linker or hydrophobic moiety.

10. The process according to claim 7, wherein the contacting is done in a solvent selected from the group consisting of acetone, methanol, ethanol, propanol, butanol, N,N-dimethylformamide, dimethylsulfoxide, tetrahydrofuran, dichloromethane, pyridine, water and any mixture thereof; or wherein the contacting step is performed at a temperature in the range of about 21° C. to about 160° C.; or wherein the contacting step is performed for a duration in the range of about 2 hours to about 36 hours.

11. A method for killing or inhibiting the growth of a microorganism in vitro, comprising the step of contacting the microorganism with the compound according to claim 1.

12. A method for treating a bacterial infection, the method comprising the step of administering to a patient in need thereof a therapeutically effective amount of a compound of claim 1, or wherein the method further comprises the step of administering a therapeutic amount of colistin in conjunction with the compound of claim 1.

13. The method according to claim 12, wherein said compound is present at an amount in the range of about 2 µg/mL to about 75 µg/mL, or wherein said compound and colistin are present at an equal amount by weight, or said compound is present in excess of about 1.5 to about 6 times of colistin by weight, or wherein colistin is present at a range of about 1 mg/kg to about 10 mg/kg and said compound is present at a range of 10 mg/kg to about 50 mg/kg.

14. The method according to claim 12, wherein said compound is administered intramuscularly, intraperitoneally, topically, subcutaneously or intravenously.

15. The compound according to claim 1, wherein R$^1$, R$^2$ and R$^3$ are independently selected from the group consisting of methyl, ethyl, propyl, butyl, —(CH$_2$)$_x$NR'R'', —(CH$_2$)$_x$OH, —(CH$_2$)$_x$PO$_3$, —(CH$_2$)$_x$CR'R''R''', —(C(NH$_2$)NHC(NH$_2$))x-NH$_2$, guanidine, 2-methylpyridine, 1-methylimidazole, pyridine, bipyridine, terpyridine, phenanthroline, 3-methylpyrrole, cyclen (1,4,7,10-tetraazacyclododecane), cyclam (1,4,8,11-tetraazacyclotetradecane), 1,8-dimethyl-1,4,8,11-tetraazacyclotetradecane, 1,4,7-triazacyclononane, arginine, polyarginine, lysine, polylysine, poly-epsilon lysine and any mixture thereof, wherein x is any integer from 1 to 10, and R', R'' and R''' are independently hydrogen or substituted or unsubstituted alkyl.

16. The compound according to claim 1, wherein Z$^1$ and Z$^2$ are independently selected from the group consisting of:

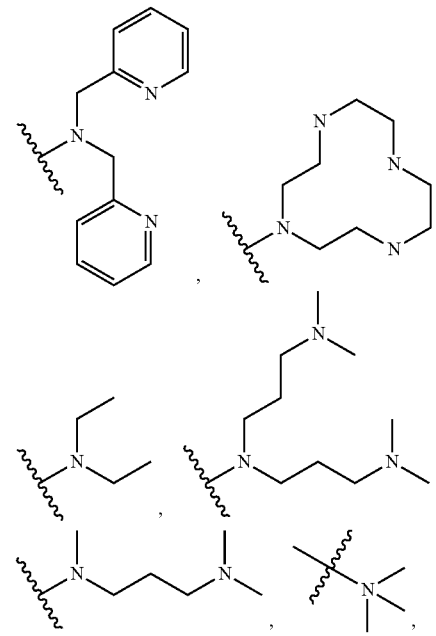

-continued
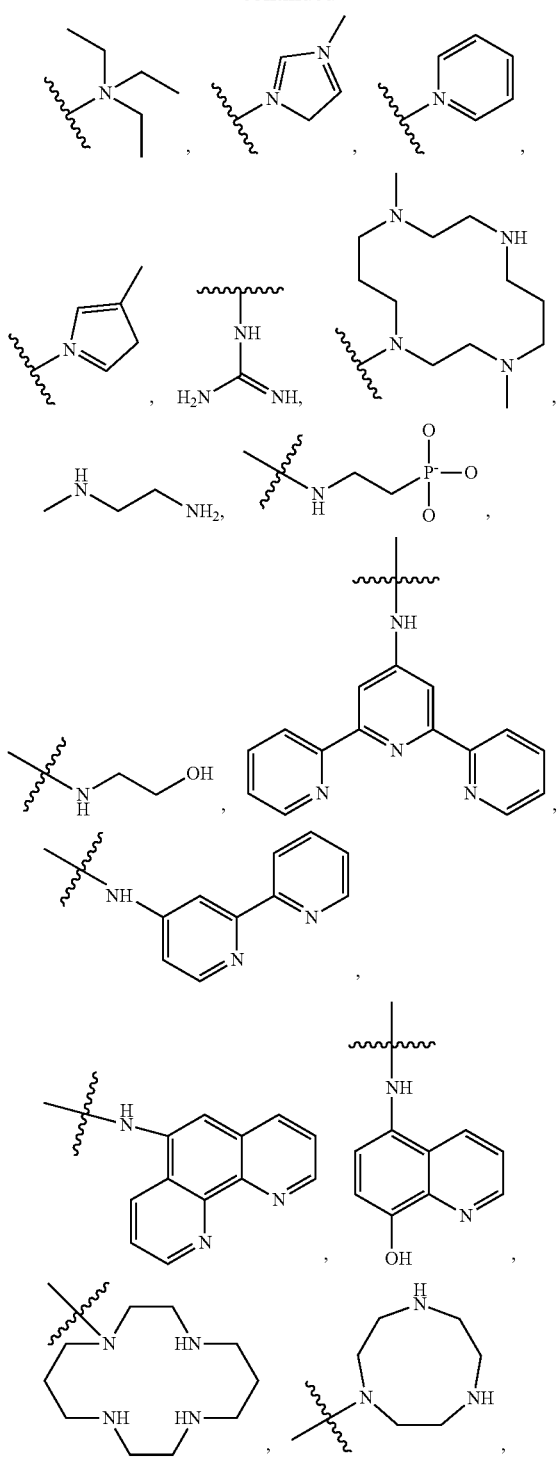
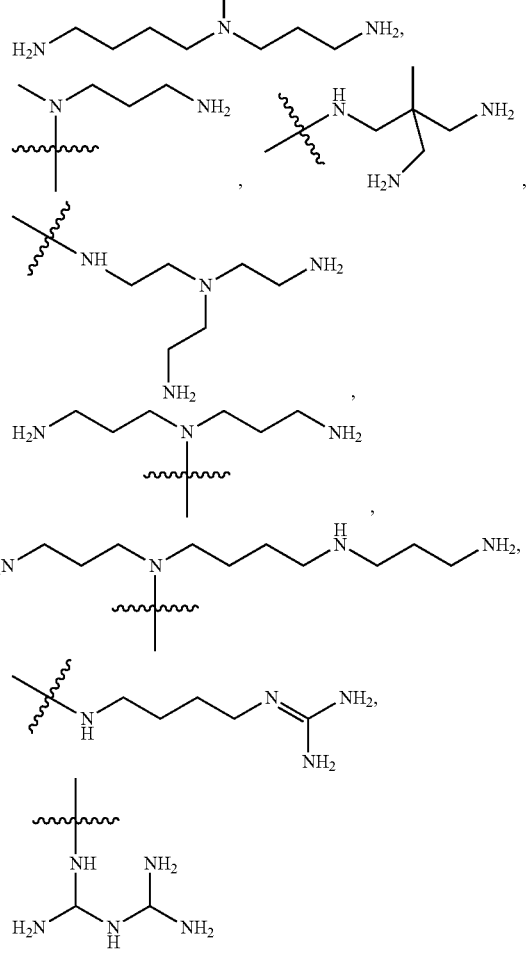
and any combination thereof.
17. The compound according to claim 1, wherein $L^1$ and $L^2$ are independently
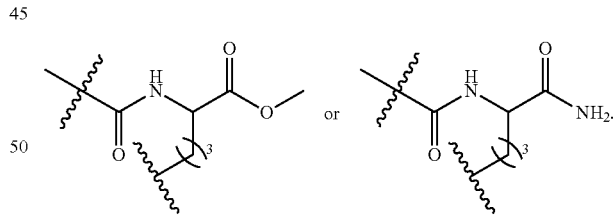
18. The compound according to claim 1, wherein each N-containing moiety independently has a positive charge.
* * * * *